(12) United States Patent
Jiang et al.

(10) Patent No.: US 8,780,620 B2
(45) Date of Patent: Jul. 15, 2014

(54) INFORMATION REPRESENTATION AND CODING FOR NONVOLATILE MEMORIES

(75) Inventors: Anxiao Jiang, College Station, TX (US);
Bruck Jehoshua, La Canada, CA (US);
Zhiying Wang, Pasadena, CA (US);
HongChao Zhou, Pasadena, CA (US)

(73) Assignees: The Texas A&M University, College Station, TX (US); California Institute of Technology, Pasadena, CA (US)

( * ) Notice: Subject to any disclaimer, the term of this patent is extended or adjusted under 35 U.S.C. 154(b) by 479 days.

(21) Appl. No.: 13/237,897

(22) Filed: Sep. 20, 2011

(65) Prior Publication Data
US 2012/0096234 A1  Apr. 19, 2012

Related U.S. Application Data

(60) Provisional application No. 61/384,646, filed on Sep. 20, 2010.

(51) Int. Cl.
*G11C 13/04* (2006.01)
(52) U.S. Cl.
USPC .............. 365/163; 365/230.03; 365/189.04; 365/191; 365/148; 365/46
(58) Field of Classification Search
USPC ........... 365/230.03, 189.04, 46, 94, 148, 100, 365/113, 129, 191, 185.03, 185.28, 185.19, 365/185.18, 185.17, 163
See application file for complete search history.

(56) References Cited

U.S. PATENT DOCUMENTS

| 7,173,859 | B2 * | 2/2007 | Hemink ................. 365/185.28 |
| 8,238,147 | B2 * | 8/2012 | Bae et al. ..................... 365/163 |
| 2010/0214831 | A1 * | 8/2010 | Kim et al. ..................... 365/163 |

OTHER PUBLICATIONS

Berger, J.M., "A Note on Error Detection Code for Asymmetric Channels," *Information and Control*, 4:68-73 (1961).
Burr et al., "Phase change memory technology," *Journal of Vacuum Science and Technology*, 28(2):223-262 (2010).
Cover, T.M., "Enumerative Source Coding," *IEEE Transactions on Information Theory*, IT-19(1):73-77 (1973).
Franceschini et al., "Information theory based design of phase-change memories", *Proc. Information Theory Workshop*, UCSD, 2010, 7 pages.

(Continued)

*Primary Examiner* — Richard Elms
*Assistant Examiner* — Mohammed Bashar
(74) *Attorney, Agent, or Firm* — Kilpatrick Townsend & Stockton LLP

(57) ABSTRACT

A memory device having a plurality of cells, each of which stores a value, where the values of the cells are mapped to discrete levels and the discrete levels represent data, is programmed by determining a maximum number of cell levels in the memory device, and determining the set of values that are associated with each of the cell levels. The maximum number of cell levels for the memory device is determined by an adaptive programming system connected to the memory device, based on a plurality of cell values attained by at least one cell of the memory device, in response to voltage applied by the adaptive programming system to the cells of the memory device. The adaptive programming system associates, for each of the cell levels, a different set of cell values of the plurality of cell values attained by the cells to which voltage is applied. This technique increases the number of cell levels that can be configured in a memory device as compared with conventional techniques, and increases the number of data values that can be programmed into the cells of a memory device.

60 Claims, 26 Drawing Sheets

(56) References Cited

OTHER PUBLICATIONS

Franceschini et al., "A Communication—Theoretic Approach to Phase Change Storage", *IEEE ICC 2010 Proceedings*, Cape Town, South Africa, 6 pages.

Fu and Han Vinck, "On the Capacity of Generalized Write-Once Memory with State Transitions Described by an Arbitrary Directed Acyclic Graph," *IEEE Transactions on Information Theory*, 45(1):308-313 (1999).

Jiang et al., "Rewriting Codes for Joint Information Storage in Flash Memories", *IEEE Transactions on Information Theory*, 56(10):5300-5313 (2010).

Jiang et al., "Constrained Codes for Phase-change Memories", *Proc. IEEE Information Theory Workshop* (ITW) (2010) Dublin, 5 pages.

Jiang et al., "Floating Codes for Joint Information Storage in Write Asymmetric Memories," *Proc. IEEE International Symposium on Information Theory (ISIT)*, Nice, France, pp. 1166-1170 (Jun. 2007).

Jiang et al., "Data Movement and Aggregation in Flash Memories", *Proc. IEEE International Symposium on Information Theory (ISIT)*, pp. 1918-1922, Austin, TX (Jun. 2010).

Jiang et al., "Data Movement in Flash Memories", Proc. $47^{th}$ *Annual Allerton Conference on Communication, Control and Computing (Allerton)*, pp. 1031-1038, Monticello, IL (Sep.-Oct. 2009).

Jiang et al., "Universal Rewriting in Constrained Memories", Proc. *IEEE International Symposium on Information Theory (ISIT)*, pp. 1219-1223, Seoul, Korea, (Jun.-Jul. 2009).

Lammers, D., "Resistive RAM Gains Ground," in *IEEE Spectrum*, p. 14 (Sep. 2010).

Lastras-Montano et al., "On the lifetime of multilevel memories," Proc. *IEEE International Symposium on Information Theory (ISIT)*, Seoul, Korea, pp. 1224-1228 (Jun.-Jul. 2009).

Lue et al., "Study of incremental step pulse programming (ISPP) and STI edge effect of BE-SONOS NAND flash," Proc. *IEEE Int. Symp. on Reliability Physics*, 30(11): 693-694 (May 2008).

Pirovano et al., "Reliability Study of Phase-Change Nonvolatile Memories", *IEEE Trans. Device and Materials Reliability*, 4(3): 422-427 (Sep. 2004).

Richter et al., "Recording on Bit-Patterned Media at Densities of 1 $Tb/in^2$ and Beyond", IEEE Transactions on Magnetics 42(10): 2255-2260 (Oct. 2006).

Rivest and Shamir, "How to Reuse 'Write—Once' Memory", *Information and Control*, 55:1-19 (1982).

Sharov and Roth, "Two-Dimensional Constrained Coding Based on Tiling", *IEEE Transactions on Information Theory*, 56(4):1800-1807 (Apr. 2010).

Tal and Roth, "Bounds on the Rate of 2-D Bit-Stuffing Encoders", *IEEE Trans, on Information Theory*, 56(6):2561-2567 (Jun. 2010).

Tal and Roth, "Convex Programming Upper Bounds on the Capacity of 2-D Constraints", *IEEE Transactions on Information Theory*, 57(1):381-391 (Jan. 2011).

\* cited by examiner

INFORMATION REPRESENTATION AND CODING FOR NONVOLATILE MEMORIES

CROSS-REFERENCES TO RELATED APPLICATIONS

This application is a non-provisional patent application of U.S. Provisional Application Ser. No. 61/384,646 filed on Sep. 20, 2010, titled "Information Representation and Coding for Next-Generation Nonvolatile Memories based on Phase-Change and Flash Technologies," which is hereby expressly incorporated by reference in its entirety for all purposes.

STATEMENT AS TO RIGHTS TO INVENTIONS MADE UNDER FEDERALLY SPONSORED RESEARCH OR DEVELOPMENT

This invention was made with government support under Grant No. ECS0802107 and CCF0747415 awarded by the National Science Foundation. The government has certain rights in the invention.

BACKGROUND

Flash memories are currently by far the most widely used type of non-volatile memory (NVM), and phase-change memories (PCMs) are the most promising emerging NVM technology. For a general discussion of NVM, see materials by WEB-FEET RESEARCH, INC. (available at the Internet address of www.web-feetresearch.com). For a discussion of PCM technology, see G. W. BURR et al., *Journal of Vacuum Science and Technology*, vol. 28, no. 2, at pp. 223-262 (2010). Flash memories and PCM have many important common properties, including noisy cell programming, limited cell endurance, asymmetric cost in changing a cell state in different directions, the drifting of cell levels after programming, cell heterogeneities, and the like. See the Burr article referenced above. As representative NVMs, they have been, and likely will continue to be, widely used in mobile, embedded, and mass-storage systems. They are partially replacing hard drives and main memories, and are fundamentally changing some computer architectures.

Both PCMs and flash memories use multi-level cells (MLCs) to store data, and increasing their storage capacity is extremely important for their development and commercial application. Current NAND flash memories are typically constructed with 4-level cells in commercially available products, and can achieve 8-level to 16-level cell construction in prototype devices. For PCMs, 4-level cells have been sampled. Each level in an MLC represents a different number that can be stored in one or more iterations of data writing, which is referred to as programming. The pattern of 0's and 1's stored in each cell for a particular level corresponds to a binary representation of data. For flash memories, when the top-most cell level has been programmed for cells in the same block, then all the cells in the block must be erased and the data programming operation is started over for programming a new data value. For example, a 4-level flash memory cell can be programmed four times (meaning that four different data values can be stored, from Level 0 to Level 1, Level 2, and Level 3) before the cell must be erased for starting the programming over at Level 0.

The MLC technology for phase-change memories (PCM) and flash memories faces very serious challenges when more levels are added to cells. As noted, these additional cell levels are needed for higher storage capacity. The challenges to programming cell levels accurately with an increasing number of cell levels are mainly due to: (1) Programming noise. The process of programming cells to change their states is a noisy process (see, e.g., the Burr article referenced previously, and P. CAPPELLETTI, C. GOLLA, P. OLIVO AND E. ZANONI (Ed.), *Flash Memories*, Kluwer Academic Publishers, 1st Edition (1999)); (2) Cell heterogeneity. Cells display significant heterogeneous properties due to their heterogeneity in cell material and geometry, especially when the cell sizes scale down (see the Cappelletti article referenced previously, and see A. JAGMOHAN et al., *Proc. International Conference on Communications* (*ICC*), Cape Town, South Africa (2010)). Even if the same voltage is used to program cells, their cell levels may change differently. See, e.g., H. T. LUE et al., *Proc. IEEE Int. Symp. on Reliability Physics*, vol. 30, no. 11, pp. 693-694 (2008). This poses a significant challenge for parallel programming, because common voltages are used to program cells in parallel for high write speed; but the heterogeneity of cells make them programmed differently; (3) Necessity/preference to program cells without overshooting. For flash memories, removing charge from any cell will lead to block erasures, which can be very costly in terms of device resources; so when cells are programmed, a very conservative approach is typically used to gradually increase the cell levels without overshooting. See, e.g., the Cappelletti article referenced above. For PCMs, increasing a cell's resistance requires melting the cell to return it to the amorphous state; so to crystallize a cell for a higher level, it is strongly preferred to cautiously increase the level without overshooting. See, e.g., the Burr article referenced above. Since MLC uses fixed cell levels to represent data, the gaps between cell levels must be sufficiently large to tolerate the worst-case performance of programming. Similar difficulties are confronted by PCMs and flash memories in attempting to increase the levels available for programming.

New techniques for information storage in memory devices would be beneficial by increasing the number of data values that can be programmed for the cells in the memory device.

SUMMARY

A memory device having a plurality of cells, each of which stores a value, where the values of the cells are mapped to discrete levels and the discrete levels represent data, is programmed by determining a maximum number of cell levels in the memory device, and determining the set of values that are associated with each of the cell levels. The maximum number of cell levels for the memory device is determined by an adaptive programming system connected to the memory device, based on a plurality of cell values attained by at least one cell of the memory device, in response to voltage applied by the adaptive programming system to the cells of the memory device. The adaptive programming system associates, for each of the cell levels, a different set of cell values of the plurality of cell values attained by the cells to which voltage is applied. This technique increases the number of cell levels that can be configured in a memory device as compared with conventional techniques, and increases the number of data values that can be programmed into the cells of a memory device.

The techniques described herein can be applied to flash memory devices, or similar devices that are programmed with data according to cell voltage level, and also can be applied to phase-change memory (PCM) devices, memristor cells, or similar devices that are programmed with data according to cell resistance value. The techniques can also be applied to memory devices that are configured as patterned-cell devices, which are described further below.

Coding schemes for the techniques described herein can be developed in which the cell levels are mapped to codewords for encoding and decoding data in the memory device. The coding schemes can include constant-weight codes, non-constant-weight codes, and graph connectivity codes.

Other features and advantages of the present invention should be apparent from the following description of exemplary embodiments, which illustrate, by way of example, aspects of the invention.

BRIEF DESCRIPTION OF THE DRAWINGS

FIG. 1($b$) is an illustration of an MLC with 4 levels; FIG. 1($c$) shows a common PCM cell structure known as a "mushroom cell"; FIG. 1($d$) shows a state-transition diagram of a 4-level PCM cell.

FIG. 2($b$) shows a charge-level distribution of VLC.

FIG. 3($a$) shows a PCM cell with two bottom electrodes and two amorphous islands (note that an island is also called a "domain" for PCM); FIG. 3($b$) shows when one island is partially crystallized; FIG. 3($c$) is a bottom view of a cell with four islands; FIG. 3($d$) is a state-transition diagram of a cell with m=4 islands and k=2.

FIG. 4($a$) shows a PCM cell with two bottom electrodes and one crystalline island (note that an island is also called a "domain" for PCM); the two bottom electrodes are not connected (i.e., high resistance between them). FIG. 4($b$) shows the two bottom electrodes are connected by two overlapping crystalline islands. FIG. 4($c$) shows the bottom view of a cell with m=4 potential crystalline islands. FIG. 4($d$) shows the state-transition diagram of a cell with m=4 bottom electrodes.

FIG. 5($a$) shows a situation where n=6, q=4, and the target vector is T=(1, 0, 2, 1, 3, 3). FIG. 5($b$) shows the expansion tree when n=3 and q=3. FIG. 5($c$) shows the probability distribution of successful programming, where for i=1, 2, . . . , q−1, $P_i$ denotes the probability that level I will be successfully programmed.

FIG. 20($a$) is for a small tile of five vertices; FIG. 20($b$) is for packing the small tiles in FIG. 20($a$) to fill the two-dimensional space; FIG. 20($c$) separates large tiles using off vertices, where the black vertices form a large tile, and the white vertices are buffer vertices that are always off, and separate the large tiles in the two-dimensional space.

DETAILED DESCRIPTION

Figure 1A:
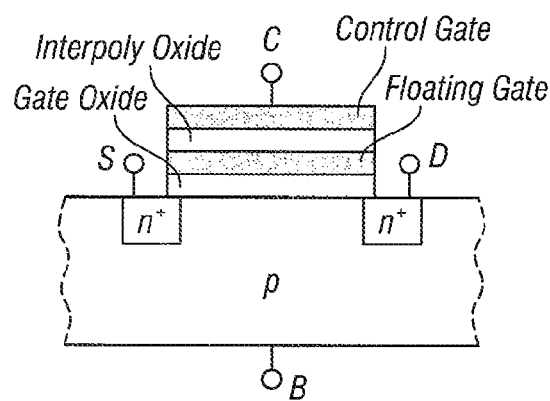
FIG. 1($a$) is a schematic cross section of a generic floating gate cell.
Figure 1B:
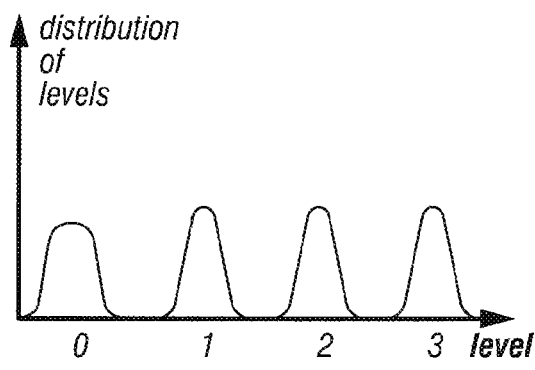
Figure 1C:
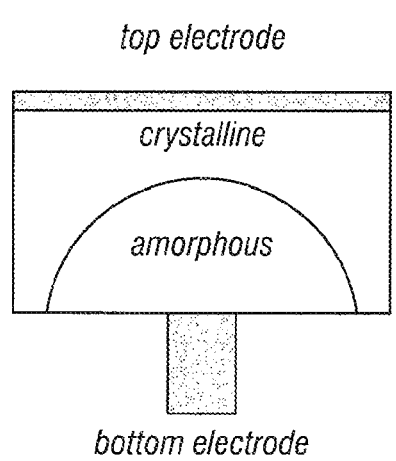
Figure 1D:
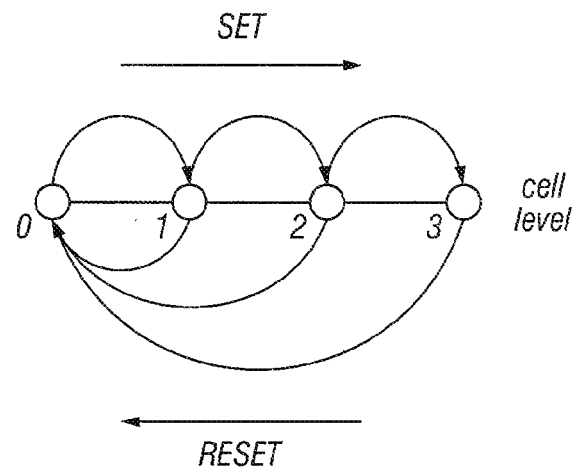

This Detailed Description is organized according to the following top-level listing of headings:
  A. ADAPTIVE CELL LEVEL PROGRAMMING
  B. CODING SCHEMES FOR ADAPTIVE PROGRAMMING CONFIGURATION
  C. INFORMATION REPRESENTATION AND CODING FOR NONVOLATILE MEMORIES
  D. VARIABLE LEVEL CELLS FOR NONVOLATILE MEMORIES
  E. PATTERNED CELLS FOR PHASE CHANGE MEMORIES
  F. SUPPLEMENTAL CONSIDERATIONS
  G. PHYSICAL IMPLEMENTATION In the paragraphs below, the text following the headings that are listed above may contain sub-headings, which are not shown above in this top-level listing for simplicity.

A. Adaptive Cell Level Programming

This section "A. ADAPTIVE CELL LEVEL PROGRAMMING" describes the technique for adaptively setting the number of levels and adaptively setting the set of cell values of each level in a memory device. Herein, a "memory device" refers to a group of cells in a memory chip that employs the adaptive cell-level programming scheme introduced here. For example, in a flash memory, a memory device can be a page of cells. The cells in a memory chip can be partition into multiple, such as millions of, such memory devices. That is, the number of levels and the set of cell values of cell level in a memory device are dependent on the physical properties of the particular memory device as produced by a memory production process, as well as dependent on the actual values that cells attain during programming; and the number of levels and the set of cell values of each level are not determined in advance. The response of the memory device to the cell level programming will determine the number of levels for storing data that are programmed into the memory device. Once the memory level programming is complete, the memory device stores data using the cell levels attained during this memory level programming process. The number of cell levels and the set of cell values that belong to a level may vary from memory device to memory device (that is, from one group of cells to another group of cells) in the same memory chip; and they may also vary from one programming process to another programming process for the same memory device.

To facilitate discussion, first define two terms for memory cells: "value" and "level". The "value" of a cell as used herein refers to the physical state of a cell. Specifically, for nonvolatile memories, cell value can have the following specific meaning:

1. For a flash memory cell, its "value" refers to its threshold voltage. In this document, the term "threshold voltage" is also called "voltage value". More generally, for a memory cell (which may be a flash memory cell or other memory cell) that has a programmable voltage value, its "value" refers to its voltage value.
2. For a resistance-based nonvolatile memory, such as phase-change memory (PCM) or memristor, the "value" of a cell refers to the electrical resistance of the cell. For PCM, the "value" of a cell can also refer to the logarithm of the electrical resistance of the cell. In this disclosure, for a PCM cell, to make all descriptions consistent, a minus sign will be added to the cell's value, so that an amorphous PCM cell, which has high resistance, will have a low cell value and a crystalline PCM cell, which has a low resistance, will have a high cell level. It is done this way because for a PCM cell, the amorphous state is usually used to denote a low cell level, while the crystalline state is usually used to denote a high cell level. More generally, for a memory cell (which may be a PCM cell, a memristor cell, or other memory cell with a programmable electrical resistance), its "value" refers to its electrical resistance or a monotonically function of its electrical resistance (such as the logarithm of its electrical resistance).
3. For the patterned-cell scheme invented in this patent, the "value" of a cell refers to the state of connectivity between the vertices in a graph realized in a cell, where every vertex has two possible states ON and OFF, and two vertices are called connected if there is a path in the graph with the two vertices as endpoints where all the vertices in the path are in the ON state. When the cell is a PCM cell, the vertices can be domains that have the crystalline state (which corresponds to the ON state) and the amorphous state (which corresponds to the OFF state).

The "level" of a cell as used herein refers to a set of "values". Specifically, the levels of cells in a memory device are denoted by Level 0, Level 1, Level 2, Level 3, and so on. Every "level" consists of a set of "values", and for two different levels—say level i and level j—their two corresponding sets of values do not overlap. Therefore, a value belongs to at most one level. Specifically, for nonvolatile memories, the term "level" with respect to a cell can have the following meaning:

1. For a memory cell with a programmable voltage value (such as a flash memory cell), a "level" refers to a range (i.e., a continuous set) of voltage values.
2. For a memory cell with a programmable electrical resistance (such as a phase-change memory (PCM) cell or a memristor cell), a "level" refers to a range (i.e., a continuous set) of resistance values.
3. For the patterned-cell scheme described in this document, a "level" of a cell can be a set of states of connectivity between the vertices in a graph that is realized in the cell. That is, the possible connectivity arrangements between vertices will define the range of connectivity states, so that the range of connectivity states in the patterned-cell scheme is analogous to the range of voltage values attained in the VLC configuration. For a patterned-cell having four electrodes, for example, the connectivity states may include all possible connections of two, three, and four electrodes.

Next, define the concept of "coding scheme". A coding scheme as used herein refers to a mapping from the levels of a group of cells to data. That is, we use the levels of a group of cells—which are called a codeword—are used to represent data. Note that the mapping is from cell levels to data, not from cell values to data. So if a cell is changed from one value to another value, as long as the two values correspond to the same level, the represented data remain the same.

I. System for Programming Levels in a Memory Device

Figure 6:
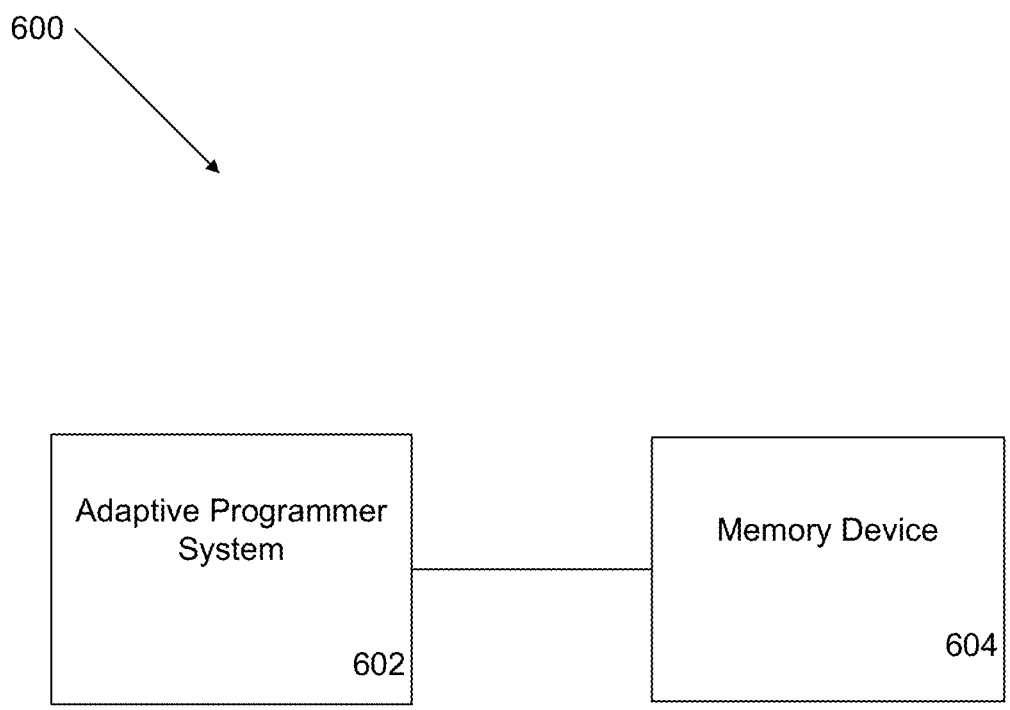
FIG. 6 shows a system 600 for determining and programming multiple levels in a memory device constructed in accordance with the discussion herein.

FIG. 6 shows a system 600 for determining and programming multiple levels in a memory device constructed in accordance with the discussion herein. An adaptive programmer system 602 is connected to a memory device 604. The adaptive programmer includes a memory that stores program instructions and a processor controller that executes the program instructions to provide the operation and features described herein. The adaptive programmer 602 may comprise a conventional computer with a central processor unit, or a microprocessor embedded in a memory chip, that executes instructions stored in program memory to perform the functions described herein. For example, the adaptive programmer system may be a conventional laptop, desktop, a microprocessor embedded in a memory chip, or similar computer with an application program that, when executed, can perform the functions described herein.

The memory device 604 may comprise what is referred to herein as a variable-level cell (VLC) construction, or may comprise a patterned cell construction. The cells of the VLC memory and the cells of the patterned cell memory may be constructed according to the technology for conventional nonvolatile memory, such as the flash memory single-level cell (SLC) and multi-level cell (MLC) technology, the phase-change memory (PCM) single-level cell and multi-level cell technology, the memristor single-level cell and multi-level cell technology, etc. Just as flash memories, PCM and memristors use SLC (where two levels are used) and MLC (where a fixed number—which is more than two—of levels are used, such as 4 levels) for storing data, so too may the VLC and patterned-cell constructions use multiple levels (or analogous concepts) for storing data. Those skilled in the art will understand that storing data into the cells of a nonvolatile memory device is referred to as programming the cells. As noted above, conventional practice dictates that the number of levels in a cell is predetermined and is the same for all cells in memories of a particular design. Conventional commercially available memory devices may have, for example, four levels per cell, or even eight levels per cell or sixteen levels per cell in advanced designs.

For the discussion herein, the general case of a memory device constructed in accordance with the invention will often be described with reference to a flash memory having cells that can be set (i.e., programmed) to multiple voltage levels. It should be understood that the techniques described herein can also be applied to other memory constructions, such as phase-change memory and memristor constructions. For example, in the case of the existing phase-change memory technology (which is different from the patterned-cell technology that is proposed and described further below) and in the case of the memristor technology (which at this time is an emerging technology), every memory cell is a piece of material whose electrical resistance can be changed. That is, the resistance of the cell can be programmed. The "resistance" of the cell is used to store data, in the same way that the threshold voltage (which is often referred to as "voltage" or "voltage value") of a flash memory cell is used to store a data value. That is, the flash memory cell voltage and phase-change memory or memristor cell resistance are analogous. And the cells in these constructions are programmed by applying voltage to the cells, which is the same technique as to the way in which flash memory cells are programmed. In view of these analogous concepts in the various constructions, the term "value" will be used herein to denote the physical state of a cell across all these constructions. For a flash memory, the "value" of a cell is its voltage value. For a phase-change memory and memristor, the "value" of a cell is its resistance. Thus, in the above cases, the term "value" (which refers to a real number that describes the physical state of a cell) will be used with reference to all different types of memories with these analogous concepts. For the patterned-cell scheme (which is a new scheme invented in this patent), the "value" of a cell is a discrete state of connectivity for the vertices in a graph that is implemented in a cell. For all memories, the term "level" refers to a set of cell values. For example, for a flash memory cell with a programmable voltage value, a level may be a range (that is, a continuous set of) voltage values, such as [0.8, 1.2], meaning all the voltage values between 0.8 volts and 1.2 volts; for a phase-change memory or memristor cell with a programmable resistance value, a level may be a range (that is, a continuous set of) electrical resistance; for a patterned-cell scheme, a level may be a set of cell values (that is, a level may be a set of discrete connectivity states).

As used herein, "memory device" shall refer to a group of cells that store data in response to applied charge or current. A memory device is typically packaged as a memory chip that includes associated circuitry for encoding and decoding data from the cells of the memory device. Depending on the context of discussion, "memory device" may refer to cells and their associated encoding and decoding circuitry. That is, the phrase "memory device" may refer to all the cells of the memory chip, or may be used to refer to a subgroup comprising less than all the cells in the memory chip, depending on the context.

In accordance with the techniques described herein, the memory device 604 is connected to the adaptive programmer system 602, which iteratively applies voltages or electrical currents to the memory device and determines the resulting cell values (such as cell voltage values or cell resistance values). After a resulting cell value is determined for each cell in a current cell level that is being programmed, a minimum or floor for the cell value for the next cell level is established, and programming continues. After one of the cell values is within a predetermined maximum value for the memory device, the maximum number of levels has been reached. Compared to the conventional nonvolatile memory technology (such as the SLC and MLC technology), the adaptive programming technology disclosed here has the unique properties that the number of attained levels and the set of values for each level may vary from one memory device (that is, a group of cells) to another memory device (that is, another group of cells) in a memory chip; and even for the same memory device, the number of attained levels and the set of values for each level may vary from one programming process to another programming process (that is, from one writing operation to another writing operation). The number of levels for a memory device and the set of cell values for each level may be recorded either approximately or exactly in the memory chip in several efficient ways, including the following three ways, so that the memory can later read the cells and determine the level that each cell is in: (1) In the first method, if the value of a cell is a real number (such as a voltage value or a resistance value), the cells can be programmed such that for two adjacent levels—say, level x and level x+1, where the values of the cells in level x are smaller than the values of the cells in level x+1—the gap between the maximum cell value for level x and the minimum cell value for level x+1 is greater than or equal to a predetermined parameter DELTA; at the same time, for cells of the same level—say level x—the cells are programmed such that if their values are sorted from small to large, the gap between any two adjacent values in the sorted list is less than a predetermined parameter EPSILON, where EPSILON<DELTA; the predetermined parameters EPSILON and DELTA are recorded in memory cells or the microcontroller in the memory chip; then when the memory reads the cells' values, it can determine which cells belong to the same level and which cells belong to different levels based on the parameters EPSILON and DELTA, and also determine which level each cell belongs to; (2) In the second method, if the value of a cell is a real number (such as a voltage value or a resistance value), for every two adjacent levels,—say level x and level x+1,—an additional cell called Reference Cell is programmed such that its value is greater than the maximum cell value for level x and is smaller than the minimum cell value for level x+1; then when the memory reads a cell's value, it can determine which level the cell belongs to by comparing the cell's value to the values of reference cells; (3) In the third method, if a cell is a patterned cell (where a cell value is a discrete graph-connectivity state), the memory can record the number of levels and the set of values for each level as configuration data in additional memory cells; then when the memory reads a cell's value, it can determine which level the cell belongs to based on the configuration data. For all types of memories, the memory may also record coding schemes in a microcontroller or memory cells, where a coding scheme uses the levels of the cells in a memory device (i.e., a group of cells)—which is called a codeword—for encoding and decoding data in the memory. The coding schemes can include constant-weight codes, non-constant-weight codes, and graph connectivity codes, which are described further below. When the memory chip is in used to write data, the microcontroller of the memory chip programs the cells of a memory device (i.e., a group of cells) in accordance with the data to write, the coding scheme, and the adaptive programming method. Details of these operations are described in greater detail below.

II. Operations for Programming Levels

Figure 7:
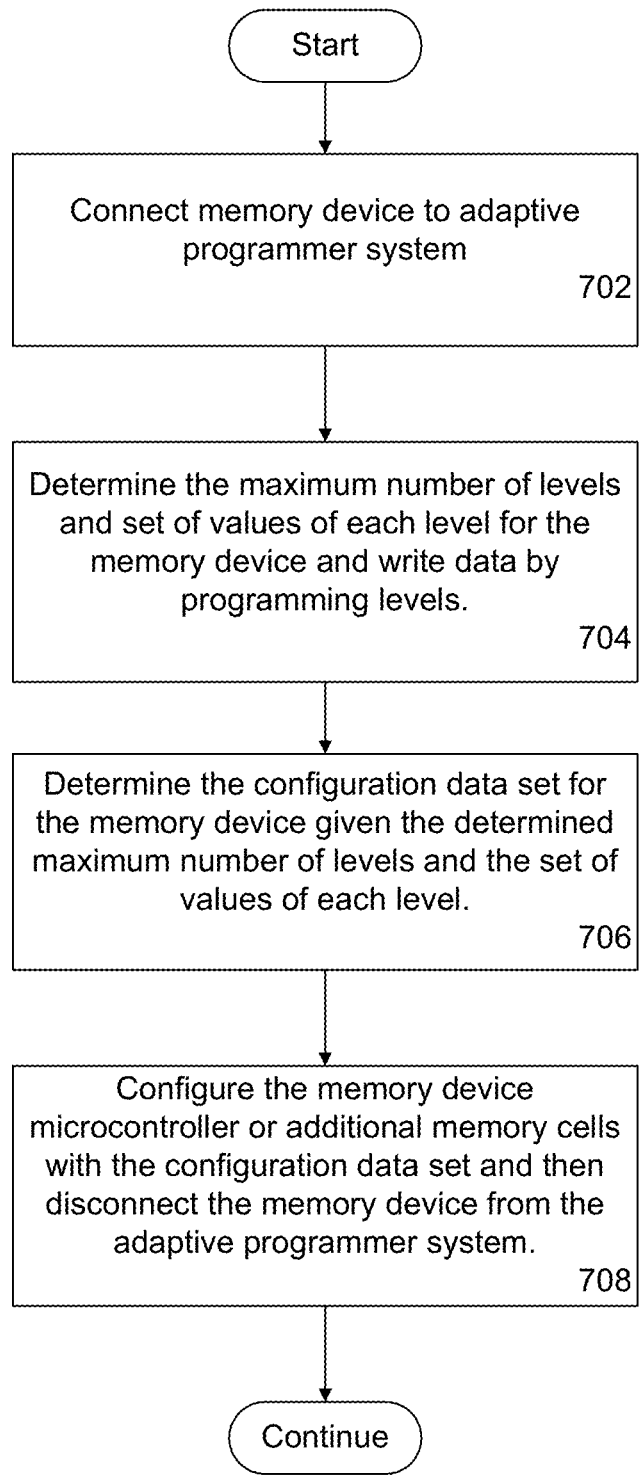
FIG. 7 is a flow diagram that illustrates the operations performed in programming the memory device in FIG. 6.

FIG. 7 is a flow diagram that illustrates the operations performed in programming the cell levels of the memory device 604 shown in FIG. 6. The initial operation performed in the programming process, indicated by the flowchart box numbered 702, is to connect the memory device to the adaptive programmer system. Next, at the box numbered 704, the adaptive programmer system programs levels in the cells for storing data, and determines the maximum number of levels and the set of cell values of each level for the memory device. Additional details of setting the maximum number of levels and setting the set of cell values for each level are described below. In this operation 704, the cells are subjected to voltage or electrical current increments, and then the resulting voltage or electrical current effect for each increment is determined, and the cell level is set.

After the maximum number of levels and corresponding settings are determined for the memory device, the next operation is carried out at box 706, where the adaptive programmer system determines the configuration data set that record the number of levels and the set of cell values of each level. Examples of the configuration data or the analogous configurations are described as the three methods in paragraph [0063] above. In the next operation, indicated at box 708, the adaptive programmer system configures the memory device microcontroller or additional memory cells with the configuration data set. That completes a write of data. The microcontroller can perform decoding of stored data in accordance with the number of cell levels, the cell values for each level and corresponding configuration. Those skilled in the art will be familiar with associated configurations that may be necessary for operation of the memory device, given the determined number of cell levels. When a write of data is finished, the memory device may be disconnected from the adaptive programmer system, as indicated by the last box 708. When the next write of data is to begin, the memory device may be connected to the adaptive programmer system again, and indicated by box 702, and the programming process may be repeated.

Figure 8:
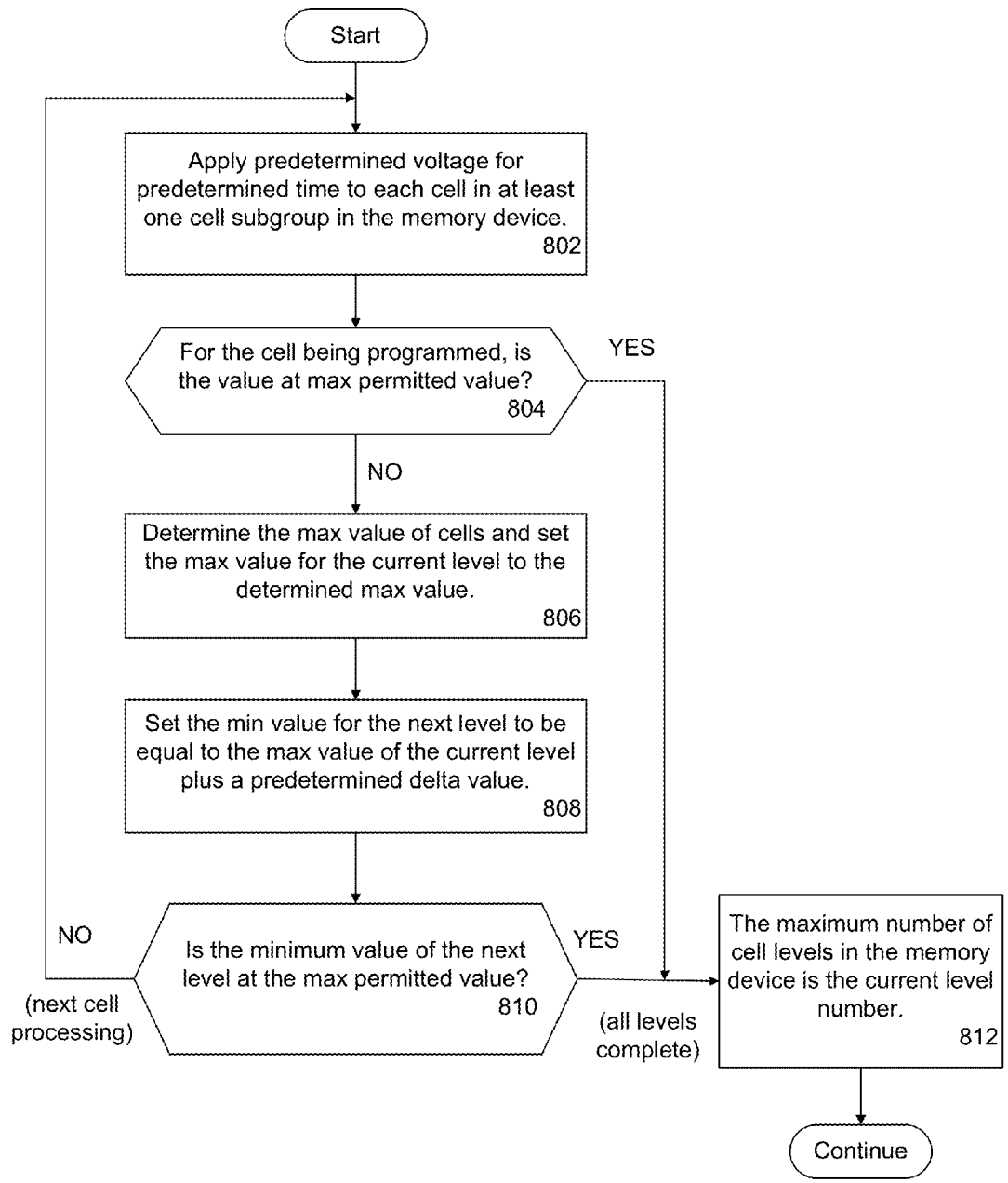
FIG. 8 is a flow diagram that illustrates the operations performed by the adaptive programmer system of FIG. 6 when writing data by programming levels and determining the number of cell levels and the set of values of each level in the memory device.

FIG. 8 is a flow diagram that illustrates the operations performed by the adaptive programmer system of FIG. 6 when writing data and determining the number of cell levels and the set of cell values of each level in the memory device. For simplicity, the illustration focuses on a memory device where a cell value is a number such as a voltage value or a resistance value. For the patterned cell scheme, where a cell value is a discrete graph-connectivity state, its diagram is analogous; and its operations will be described in the following paragraphs, placed between brackets. In the initial operation, indicated by the box numbered 802, the adaptive programmer system applies a predetermined voltage for a predetermined time to each cell in at least one subgroup of the cells in the memory device. For example, the voltage applied by the adaptive programmer system may be approximately 3.3 volts, applied for 10 microseconds. The adaptive programmer system includes circuitry that can determine the resulting cell value at the programmed cell. For the patterned cell scheme, voltage is applied to program the ON/OFF states of the vertices for a subgroup of cells. Then the adaptive programmer system can determine the resulting cell value of each programmed cell. The voltage may be applied to each cell in the memory device, or the voltage may be applied to a subgroup of the cells in the memory device.

For example, consider the programming of cell level 1. Initially, all cells are at low values. The low values for cells can be achieved by a block erasure for flash memory cells, or by a RESET operation for PCM cells. (For patterned cells, it can be assumed that initially, all cells have the value that corresponds to the case where all vertices in the graph are in the OFF state, namely, no two vertices are connected.) Let X denote the maximum value of cells, and set the range of values for level 0 to be all the values less than or equal to X. For patterned cells, let level 0 consists of the single value where all vertices are OFF. Then the minimum value for level 1, denoted by Y, is set to be X plus a safety gap increment that provides a spacing between cell levels that is beyond an expected noise level in the memory device circuitry. For patterned cells, let Y denote a "floor" cell value where only two neighboring vertices are ON and all other vertices in the graph are OFF. Then voltage is applied to a subgroup of cells for certain time until all their values are greater than or equal to Y. For patterned cells, voltage is applied to a subgroup of cells for certain time to change vertices from the OFF state to the ON state, until for every cell in the programmed subgroup, the set of ON vertices include the two neighboring vertices mentioned above. Note that due to programming noise, those vertices in the graph that are supposed to be OFF may also be accidently programmed to be ON. Multiple rounds of voltage can be applied to program a cell if necessary; and the cells in the subgroup can be programmed either in parallel or sequentially. Subsequent levels—namely, level 2, level 3, and so on—can be programmed in a similar way, and a safety gap increment is always provided for two adjacent levels to tolerate noise. Thus the sets of values for different levels do not overlap, and every cell belongs to one level.

Next, for the cells being programmed, at box 804, the adaptive programmer system determines the maximum value of the cells in the subgroup, and checks whether this maximum value exceeds a maximum permissible value. For patterned cells, the adaptive programmer system checks whether any cell in the subgroup has the value where all vertices in the graph are ON. If the answer is yes, an affirmative outcome at box 804, then cell level programming is terminated. If the answer is no, a negative outcome at the box 804, then cell level programming continues at box 806, where the maximum value of the cells in the subgroup is set as the maximum value for the current level. For example, if the programmed subgroup of cells belong to level 1, and their maximum value is 2.1 after the above applying of voltage, then the maximum value of level 1 is set as 2.1. The set of values of the current level is set to be the range of values between the minimum cell value of the subgroup and the maximum cell value of the subgroup. For patterned cells, the set of values of the current level is set to be the set of values attained by the cells in the subgroup.

At the next operation, at box 808, the adaptive programmer system sets the minimum value of the next level of the memory device to be the maximum value of the previous level set at box 806 plus a predetermined delta value that provides a safety spacing between two adjacent levels. The delta value will be determined by noise and inaccuracies in the memory device circuitry, as will be known by those skilled in the art. For example, if the applied voltage is on the order of 3.3 volts, and the voltage is applied for about 10 microseconds, then a typical delta value for a VLC configuration on flash memory cells would be about 0.3 volts. Thus, in the example above, if the maximum voltage value for Level 1 is 2.1 volts, and if the delta value is 0.3 volts, then the minimum voltage value for Level 2 will be (Level 1)+delta, equal to 2.4 volts. (For patterned cells, as an analogous step of box 808, set a "minimum" cell value Y for the next level to be a cell value that does not belong to the previously programmed cell levels.)

At the next operation, indicated by the box numbered 810, the adaptive programmer system checks whether the minimum value for the next level set in box 808 exceeds the maximum permissible value. If the answer is yes, an affirmative outcome at the box 810, then the current number of levels determined thus far is the maximum number of levels for the memory device, and operation proceeds to box 812 to terminate further cell programming, and operation of the adaptive programmer system continues with completion processing (e.g., disconnection of the memory device). If the answer is no, a negative outcome at the box 810, then cell level programming by the adaptive programmer system continues for the next cell level, at the box 802. In box 802, a subgroup of cells will be programmed for the next level until all their values are greater than or equal to the minimum value set for the next level. For patterned cells, a subgroup of cells will be programmed for the next level until for each cell in the subgroup, its value does not belong to any of the previously programmed cell levels and its ON vertices in the graph include all those vertices that need to be ON in the "minimum" cell value for the next level.

III. Summary of Operations for Programming Levels

The sequence of operations as described above and illustrated in FIGS. 7 and 8 may be summarized as follows. For simplicity, the summary below is only for memories where a cell value is a number such as a voltage value or a resistance value. The operations of programming are analogous for patterned cells, whose details have been described above, so the summary for patterned cells is omitted here.

Step a. Connect the memory device to the adaptive programmer system.

Step b. Apply a predetermined voltage (e.g. 3.3 volts) for a predetermined time (e.g. 10 microseconds), repeatedly if necessary, for a subgroup of cells until their values are greater than or equal to a target minimum value. For a VLC flash memory device, the target value corresponds to a cell voltage value. For a PCM device, memristor cell, or similar device whose resistance may be programmed, the value corresponds to a resistance value.

Step c. Detect the attained values of the first subgroup of cells of the memory device. Again, for a VLC flash memory device, the target value corresponds to a cell voltage value, and for a PCM device, memristor cell, or similar device whose resistance may be programmed, the value corresponds to a resistance value.

Step d. Determine the minimum cell value attained by the programmed subgroup of cells.

Step e. Determine the maximum cell value attained by the programmed subgroup of cells.

Step f. Set the set of cell values of the current level (e.g., Level 1) to be the range of values between the minimum cell value and the maximum cell value of the programmed subgroup of cells.

Step g. Set the minimum value of the next level to be the maximum value of the current level plus a delta (safety gap) increment that provides a spacing between cell levels that is beyond an expected noise level in the memory device circuitry.

Step h. Repeat step b to program a subgroup of cells for the next level, until for all cells in the subgroup, their values are greater than or equal to the minimum value that has been set for the next level.

Step i. Determine the minimum cell value and the maximum cell value attained by the cells in the subgroup. Set the set of values for the next level as the range of values between the minimum cell value and the maximum cell value of that subgroup of cells. Then, see the "next level" mentioned above as the "current level", and set the minimum cell value of the next level (i.e., the level that follows the "current level") to be the maximum value of the current level plus a safety gap increment that is, as before, a parameter for providing a spacing between cell levels. Then program a subgroup of cells for the next level.

Step j. Repeat programming the cells in this fashion until the value of one of the cells—or the minimum value set for the next level—exceeds a maximum permissible value for the memory device. The maximum number of cell levels in the memory device is set to be the number of levels that have been programmed so far.

Step k. The microcontroller of the memory device or additional memory cells will be set with the parameters for the number of levels and corresponding values (i.e., the range) for each level in the memory device. These parameters will be different for different memory devices. As before, and as true throughout this discussion, for a VLC flash memory device, the target value corresponds to a cell voltage value, and for a PCM device, memristor cell, or similar device whose resistance may be programmed, the value corresponds to a resistance value.

Details of programming values into a cell will be known to those skilled in the art. For example, in current memories, (including flash memory, phase-change memory, and memristor), the cell is actually programmed with multiple rounds of programming, instead of just one round of programming. The reason is that with one round, the cell generally cannot be programmed with accuracy, so multiple rounds are used instead. The process is generally as follows, where every round of programming is as described substantially as above. In the first round, a voltage is applied to a cell for a predetermined period of time; then, the cell is measured to see how far away its value is from the target value. If it is far away, then a voltage is applied again to the cell for a predetermined period of time; then, the cell is measured again to see how far away it is from the target value. If it is still far away, then the cell is programmed again in the same way as above. The process continues until the cell's value is sufficiently close to the target value (i.e., within a predetermined error tolerance). It should be noted that the voltage and time duration used in the different rounds of programming can be different, because they are generated based on how far away the cell's value is from the target value. That is, the smaller the difference is between the cell's value and the target value, the smaller the voltage and the time duration will be. By programming a cell in this way, its value can be moved closer and closer to the target value with each round of level programming.

Those skilled in the art will also understand that current practice in programming memory cells, which can be implemented consistent with the manner of operations described herein, is that cells are programmed in parallel. That is, many cells are programmed together. The specific approach is that in each round of programming (as noted above, it usually takes multiple rounds to program a cell to attain a desired target value), the same voltage is applied to many cells together for a period of time. In this way, it takes much less time to program the cells as compared to the scheme where the cells are programmed individually one at a time.

B. Coding Schemes for Adaptive Programming Configuration

Figure 10:
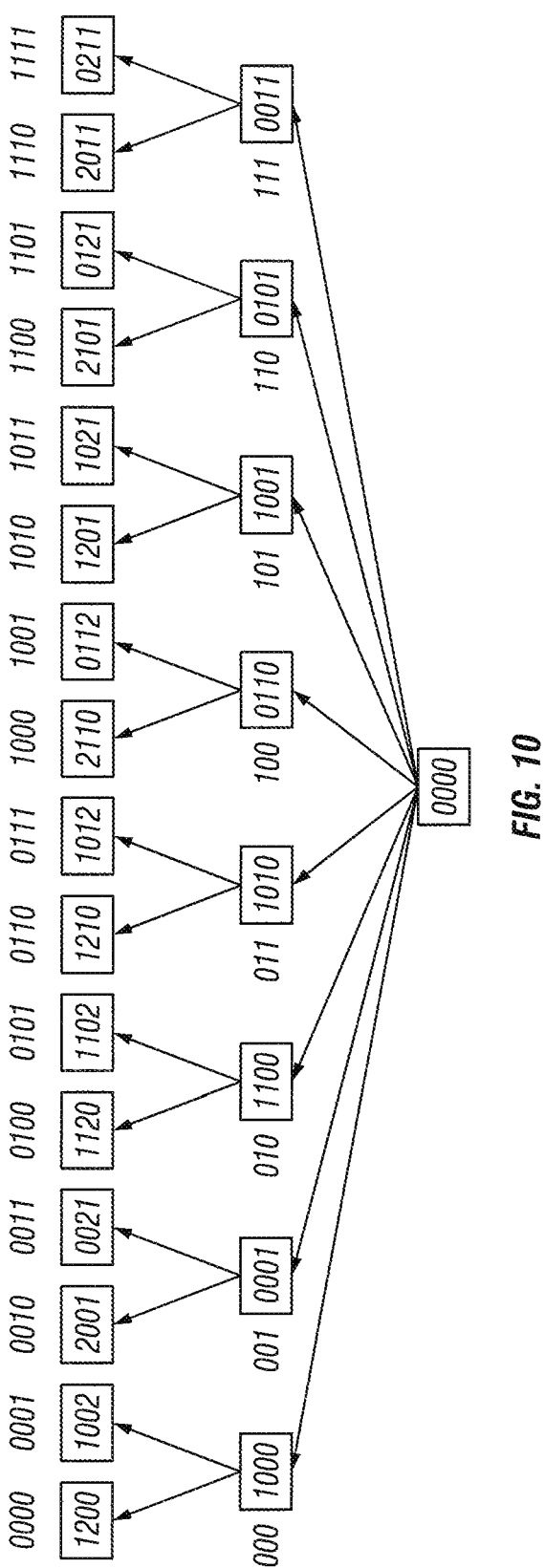
FIG. 10 is an illustration of a VLC code with n=4 cells and q=3 cell levels that stores three bits in level 1 and 1 bit in level 2.

In conjunction with the adaptive programming technique described herein, conventional codes may be used for encoding and decoding data stored into the memory device. Such conventional coding schemes are well-known and need no further description. The encoding and decoding are generally performed by the microcontroller of the memory device. In addition, particular types of codes may be useful for encoding and decoding data in a manner that can exploit the adaptive cell level programming described herein, for greater efficiencies. Specifically, particular types of codes for the adaptive cell level programming may be designed in the following way. Let q be an integral parameter that upper bounds the number of levels that cells in a memory device can practically have. Let the set of levels of the cells be called a codeword. Since the number of levels is not predetermined before a write operation, to more efficiently write data, the particular code construction considers not only codewords that use all the q levels (i.e., Level 0, Level 1, . . . , Level q−1), but also consider codewords that use only the lowest q−1 levels (i.e., Level 0, Level 1, . . . , Level q−2), codewords that use only the lowest q−2 levels (i.e., Level 0, Level 1, . . . , Level q−3), . . . , and codewords that use only the lowest 2 levels (i.e., Level 0 and Level 1). All the considered codewords are used to encode data. (This is very different from conventional coding schemes. In a conventional scheme, the number of levels is predetermined, and only codewords that use all the levels are used to encode data.) For x=2, 3, . . . , q, let a codeword that uses Level 0, Level 1, . . . , Level x−1 be called an "x-level codeword". So the coding scheme described here uses not only the q-level codewords, but also the 2-level codewords, 3-level codewords, . . . , and (q−1)-level codewords. To make the code more efficient, the following constraint may be used for the coding scheme: The constraint is that for an x-level codeword and a y-level codeword with x<y, if for every cell in the memory device (i.e., a group of cells), its level in the x-level codeword is less than or equal to its level in the y-level codeword, then the data encoded by the x-level codeword is a subset of the data encoded by the y-level codeword. An example of such a coding scheme is illustrated in FIG. 10. In FIG. 10, q=3 and there are 4 cells. The four numbers inside a box in FIG. 10 is a codeword (i.e., the levels of the 4 cells), and the 3 or 4 bits beside a box are the data encoded by the corresponding codeword. It can be seen that the above constraint is satisfied; for example, consider the two codewords (1100) and (1102). The word (1100) is a 2-level codeword, where the 1st cell has level 1, 2nd cell has level 1, 3rd cell has level 0, and 4th cell has level 0; and the codeword (1100) encodes the data (010). The word (1102) is a 3-level codeword, where the 1st cell has level 1, 2nd cell has level 1, 3rd cell has level 0, and 4th cell has level 2; and the codeword (1102) encodes the data (0101). It can be seen that the four cell levels in the codeword (1100) are all less than or equal to the corresponding four cell levels in (1102), and the data encoded by codeword (1100), which is (010), is a subset (in fact, a prefix) of the bits (0101) that are encoded by the codeword (1102). Such a code can successfully write data into cells even if the number of levels is not predetermined, which can be explained by the following example: Suppose that initially all 4 cells are at level 0, and the 4 bits of data (0101) need to be stored; to store the four bits (0101), the memory intends to change the cell levels from (0000) to (1102), because the codeword (1102) encodes bits (0101); since level 1 is programmed before level 2, if level 1 can be programmed and level 2 cannot be programmed, the attained cell levels (i.e., codeword) will be (1100), which encodes the first 3 bits of the data (010); if both level 1 and level 2 can be programmed, the attained cell levels (i.e., codeword) will be (1102), which encodes the 4 bits (0101). So no matter how many levels can be programmed, some data bits are guaranteed to be stored in the cells; and the more levels can be programmed, the more data bits can be stored; so the coding scheme is efficient and utilizes the properties of the adaptive programming method. Such coding schemes are special and very different from conventional coding schemes. In general, the coding schemes are suitable for achieving the highest storage capacity for nonvolatile memories, including flash memories, PCMs, memristors, etc. and patterned cells. More specific types of coding schemes are constructed in this patent, including constant-weight codes, non-constant-weight codes, codes for modifying data, and codes based on graph connectivity. These coding schemes are mentioned here in this section by way of introduction, but are described in greater detail in different sections below, which should be referred to for details of their construction.

I. Constant Weight Code

In the constant weight code used with the adaptive cell level technique described herein, every codeword refers to the levels of a group of cells in the memory device. The codewords consist of those codewords that have only Level 0 and Level 1 (which will be referred to as "2-level codewords" hereafter), those codewords that have only Level 0, Level 1, and Level 2 (which will be referred to as "3-level codewords" hereafter), . . . , and so forth, up to those codewords that have only Level 0, Level 1, . . . , and Level q−1 (which will be referred to as "q-level" codewords hereafter, where q is an integral parameter that upper bounds the maximum number of levels the cells in the memory device can possibly have. The constant weight code adapted for the memory device described herein maps codewords to data with the following property: for an x-level codeword and a y-level codeword with x<y, if for every cell in the cell group, its level in the x-level codeword is less than or equal to its level in the y-level codeword, then the data encoded by the x-level codeword is a subset of the data encoded by the y-level codeword. For example, if the y-level codeword encodes a sequence of binary bits, then the x-level codeword that satisfies the above condition encodes a subset of those bits.) As a special implementation, the data encoded by the x-level codeword can be a prefix of the data encoded by the y-level codeword. A constant-weight code as proposed here is a code with an additional special property: for x=0, 1, . . . , q−1, all the q-level codewords have the same number of cells in Level x. It is shown below that a constant weight code is an optimal code to use for the adaptive cell level technique. A method for constructing a constant-weight code for the adaptive cell level programming technique is as follows: Suppose that there are n cells, and let $W\_\{0\}, W\_\{1\}, \ldots, W\_\{q-1\}$ be positive integers such that $W\_\{0\}+W\_\{1\}+ \ldots +W\_\{q-1\}=n$. For the q-level codewords, they have $W\_\{0\}$ cells in level 0, $W\_\{1\}$ cells in Level 1, . . . , and $W\_\{q-1\}$ cells in level q−1. For x=2, 3, . . . , q−1, an x-level codeword has $W\_\{i\}$ cells in Level i, for i=1, 2, . . . , x−1, and has $W\_\{0\}+W\_\{x\}+W\_\{x+1\}+ \ldots +W\_\{q-1\}$ cells in Level 0. The mapping from such codewords to data can be constructed as follows: Since there are "n choose $W\_\{1\}$" ways to assign $W\_\{1\}$ cells out of the n cells to Level 1, those x-level codewords with x>=2 can use the cells in Level 1 to store a data symbol of alphabet size "n choose $W\_\{1\}$"; since there are "n-$W\_\{1\}$ choose $W\_\{2\}$" ways to assign $W\_\{2\}$ cells out of the remaining n-$W\_\{1\}$ cells to Level 2, those x-level codewords with x>=3 can use the cells in Level 2 to store an additional data symbol of alphabet size "n-$W\_\{1\}$ choose $W\_\{2\}$"; since there are "n-$W\_\{1\}$-$W\_\{2\}$ choose $W\_\{3\}$" ways to assign $W\_\{3\}$ cells out of the remaining n-$W\_\{1\}$-$W\_\{2\}$ cells to Level 3, those x-level codewords with x>=4 can use the cells in Level 3 to store an additional data symbol of alphabet size "n-$W\_\{1\}$-$W\_\{2\}$ choose $W\_\{3\}$"; and so on. Those skilled in the art will understand how to generate constant weight codes based on this explanation, without further description.

II. Non-Constant Weight Code

In this coding scheme, the number of cells assigned to different levels can be different. Non-constant weight code is a more general coding scheme than constant-weight code. An example of a non-constant weight code is illustrated in FIG. 10, and the properties of the code have been explained in paragraph [0087], so no further detail is provided here. This coding scheme is described in greater detail in Section VI below.

III. Scheme for Modifying Data

Another coding scheme is referred to as the "scheme for modifying data", such as the scheme in FIG. 24. In FIG. 24, n=10 cells in the memory device store n=10 bits of data, with each cell storing one bit of data conform to the following: Let (L1, L2, ... Ln) denote the levels of an x-level codeword, where 2<=x<=q and each level Li (for 1<=i<=n) is in the set $\{0, 1, \ldots, x-1\}$; let (B1, B2, ..., Bn) denote the n bits encoded by the codeword (L1, L2, ... Ln), then the mapping is that for 1<=i<=n, Bi=Li mod 2. Then to modify the stored data, every cell's level needs to increase by at most one. For example, as illustrated in FIG. 24 (a), if the initial cell levels are (1001101010), the stored data bits are (1001101010); then as illustrated in FIG. 24 (b), to change the data to (1100111111), the cells can be programmed—using the adaptive cell level programming scheme—to higher levels to be (1102111111), which encodes the data (1100111111); then as illustrated in FIG. 24 (c), to further change the stored data to (0101011001), the cells can be programmed—using the adaptive cell level programming scheme—to higher levels to be (2103211221), which encodes the data (0101011001). In this way, every time a new level is programmed, the data can be modified once. And the maximum number of cell levels need not be predetermined for the writing; instead, the memory can keep modifying the data until the maximum number of levels is reached; after that, the cells can be reset to very low values (such as by using a block erasure or RESET operation), and this process can be repeated. This coding scheme is both simple and effective (in terms of increasing the speed and lifetime of the nonvolatile memory). (It is understood that every time the data are modified, the levels can be programmed using the adaptive cell level programming method. If cells are raised to a level that has been programmed before, then the set of values assigned to that level may need to be adjusted. But the method of programming will still be the same, namely, programming levels from low to high adaptively.) Let the above coding scheme be called "type I" coding scheme. The "type I" coding scheme can be generalized to "type II" coding scheme for modifying data as follows. In a type II coding scheme, n cells in the memory device store nk bits of data, with each cell storing k bits of data conforming to the following: Let (L1, L2, ... Ln) denote the levels of an x-level codeword, where 2<=x<=q and each level Li (for 1<=i<=n) is in the set $\{0, 1, \ldots, x-1\}$; given 1<=i<=n, let (B1, B2, ..., Bk) denote the k bits encoded by the ith cell of level Li, then the mapping from Li to (B1, B2, ..., Bk) satisfies the following constraints: (1) for any 0<=y<z<=($2^k$)-1, the value of (B1, B2, ..., Bk) for Li=y is different from the value of (B1, B2, ..., Bk) for Li=z; and (2) for any 0<=z<=q-1, the value of (B1, B2, ..., Bk) for Li=z is the same as the value of (B1, B2, ..., Bk) for Li=z mod $2^k$. For example, if k=2, the mapping can be the following: when Li=0, (B1,B2)=(0,0); when Li=1, (B1,B2)=(0,1); when Li=2, (B1,B2)=(1,1); when Li=3, (B1,B2)=(1,0). (The other values of (B1,B2) corresponding to Li>=4 can be unique determined based on the above data. And the type II coding scheme can also be used to modify data efficiently using the adaptive cell level programming method. The type II coding scheme can be further generalized to "type III" coding scheme, defined as follows. A type III coding scheme has n cells in the memory device, each of which stores a data symbol from the set $\{0, 1, \ldots, Y-1\}$ for some integer Y, with a method of mapping that comprises: For 1<=i<=n, let Li denote the level of the ith cell, and let Si denote the data symbol stored by the ith cell, then the mapping from Li to Si satisfies the following constraints: (1) for any 0<=y<z<=Y-1, the value of Si for Li=y is different from the value of Si for Li=z; (2) for any 0<=z<=q-1, the value of Si for Li=z is the same as the value of Si for Li=z mod Y. And the type III coding scheme can be further generalized to "type IV" coding scheme, defined as follows. A type IV coding scheme has n cells in the memory device, they cells store a data symbol from the set $\{0, 1, \ldots, (Y^n)-1\}$ for some integer Y>=2, with a method of mapping that comprises: Let (L1, L2, ..., Ln) denote the levels of the n cells, and let S denote the data symbol stored by the n cells, then the mapping from the codeword (L1, L2, ..., Ln) to S satisfies the following constraints: (1) for any two different codewords, where the first codeword is an x-level codeword with x<=Y and the second codeword is a y-level codeword with y<=Y, the value of S for the first codeword is different from the value of S for the second codeword; (2) the value of S for a codeword (L1, L2, ..., Ln) is the same as the value of S for the codeword (L1 mod Y, L2 mod Y, ..., Ln mod Y). Those skilled in the art will understand how to generate the type I, type II, type III and type IV codes based on this explanation, without further description. The coding scheme is described in greater detail in Section VIII below.

IV. Graph Connectivity

Graph connectivity based coding schemes are designed for the patterned cell scheme invented in this patent. Such a coding scheme, which is suited for resistance-setting configurations, such as PCM constructions, adaptively assigns the values of a cell to discrete levels, where the value of a cell is defined to be the state of connectivity between the vertices in a graph realized in the cell; then, data are stored in cells by mapping the levels of the cells to data (such as a sequence of bits). The code can be a constant-weight code or a non-constant weight code. Furthermore, error-correcting/detecting codes can be used to detect or correct errors in the cells.

C. Information Representation and Coding for Nonvolatile Memories

I. Introduction

In this work, two novel storage technologies for next-generation PCMs and flash memories are described. The first technology, variable-level cell (VLC), adaptively and robustly controls the number and positions of levels programmed into cells. It eliminates the bottleneck imposed by cell heterogeneities and programming noise, and maximizes the number of levels stored in cells. The second technology, patterned cells, uses the internal structure of amorphous/crystalline domains in PCM cells to store data. It eliminates the high precision and power requirements imposed by programming cell levels, and opens a new direction for data storage in PCMs. Novel coding techniques for data representation, rewriting and error correction are developed. The results are able to substantially improve the storage capacity, speed, reliability and longevity of PCMs and flash memories.

In the following, we first present the basic motivations for developing the variable-level cell (VLC) and patterned cell technologies. We then outline our work on coding schemes.

II. VLC and Patterned Cell Technologies

A. Introduction to Current Flash Memory and PCM Technology

Flash memories use floating-gate cells as their basic storage elements. (See FIG. 1 (a).) The amount of charge stored in the cell's floating-gate layer, which determines its threshold voltage, is used to store data. By quantizing the amount of charge—which can be seen as an analog value and will be called the charge level—into q discrete levels, the cell can store $\log_2 q$ bits. (See FIG. 1 (b) for the charge-level distribution of a 4-level cell.) Although charge can be injected into cells individually (called programming or writing) in principle, to remove any charge from any cell, a whole block of cells ($\sim 10^6$ cells) containing it must be erased (which means to remove all charge from all cells) and then re-programmed. This is called block erasure, which significantly reduces the longevity, speed and power efficiency of flash memories. A flash memory block can guarantee to endure only about $10^3 \sim 10^5$ erasures [See P. CAPPELLETTI, C. GOLLA, P. OLIVO AND E. ZANONI (Ed.), *Flash memories*, Kluwer Academic Publishers, 1st Edition (1999)].

A PCM consists of chalcogenide-glass cells with two stable states: amorphous and crystalline. The two states have drastically different electric resistance, which is used to store data. Intermediate states, called partially crystalline states, can also be programmed [See G. W. BURR et al., *Journal of Vacuum Science and Technology*, vol. 28, no. 2, pp. 223-262 (2010)]. To make the cell amorphous, —called RESET, —a very high temperature (~600° C.) is used to melt the cell and quench it. To make the cell more crystallized, —called SET, —a more moderate temperature (~300° C.) above the crystallization threshold is used to heat the cell. The heat is generated/controlled by the current between the bottom and top electrodes of the cell. See FIG. 1 (c) for a PCM cell, where an amorphous domain—which will be called an island—is created above the thin bottom electrode. The cell is amorphous. The state transition diagram of a 4-level PCM cell is shown in FIG. 1 (d).

Flash memories and PCMs have many common properties: (1) Noisy programming. It is hard to control the charge-injection/crystallization of the cells. (2) Cell heterogeneity. Some cells are harder to program, while some are easier. When the same voltage is applied to program cells, the harder-to-program cells will have less charge-injection/crystallization. (3) Asymmetry in state transitions. A cell can gradually change in the direction of charge-injection/crystallization, but to remove charge or make the cell amorphous, the cell will be erased/RESET to the lowest level. This is especially significant for flash memories, which use block erasures. (4) limited longevity. A flash memory block can endure $10^3 \sim 10^5$ erasures. A PCM cell can endure $10^6 \sim 10^8$ RESETs [See G. W. BURR et al., *Journal of Vacuum Science and Technology*, vol. 28, no. 2, pp. 223-262 (2010)], [See P. CAPPELLETTI, C. GOLLA, P. OLIVO AND E. ZANONI (Ed.), *Flash memories*, Kluwer Academic Publishers, 1st Edition (1999)].

B. Variable-Level Cell (VLC) Coding Scheme for Maximum Storage Capacity

We introduce the VLC scheme for maximum storage capacity. To simplify the terms, we will introduce the concepts based on flash memories. However, all the concepts can be applied to PCMs equally well.

Figure 2A:
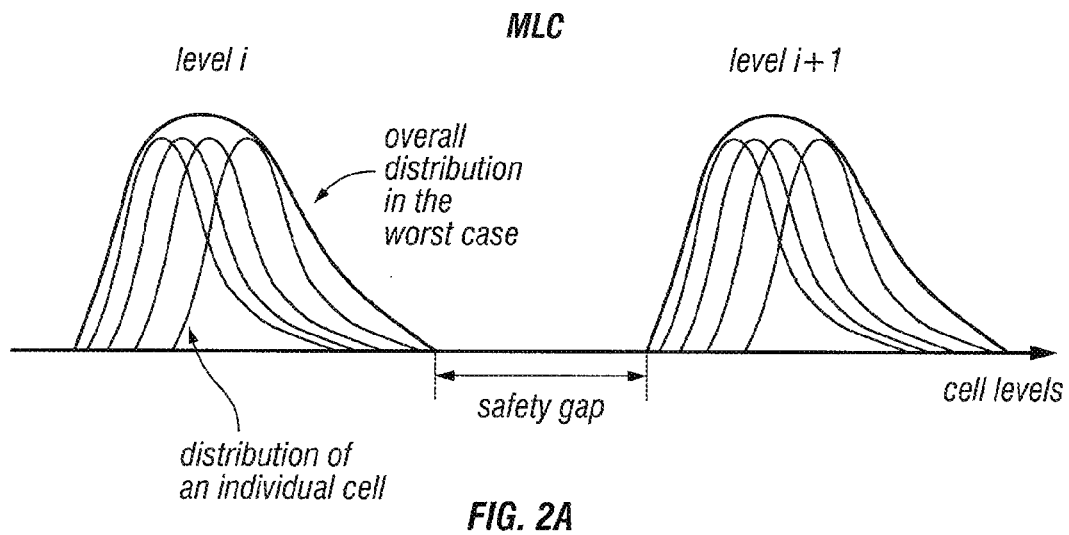
FIG. 2($a$) shows a charge-level distribution of MLC.
Figure 2B:
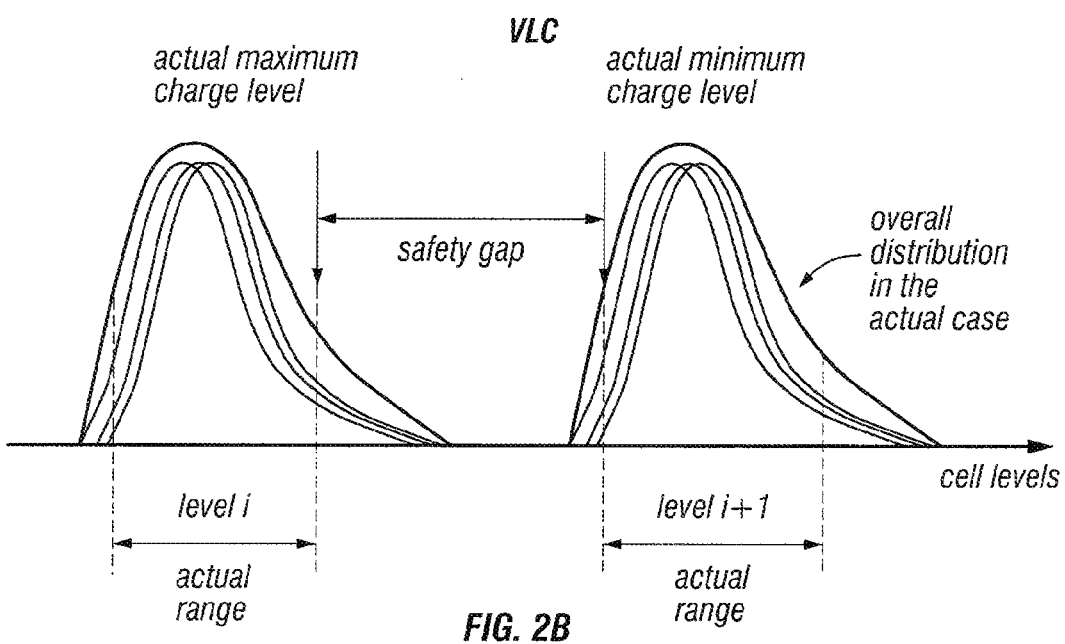
Figure 3A:
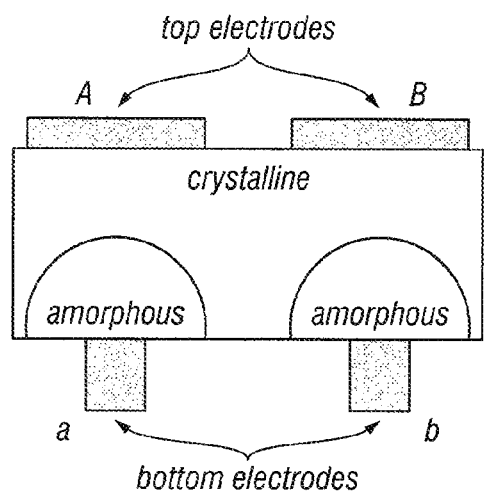
FIGS. 3($a$)-($d$) relate to a patterned cell with the amorphous-island scheme.
Figure 3B:
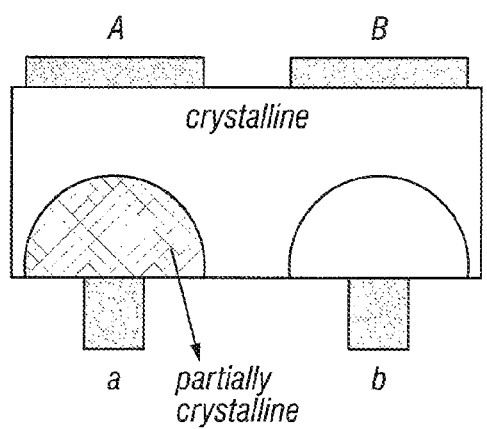
Figure 3C:
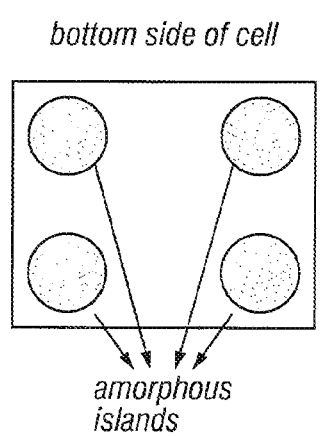
Figure 3D:
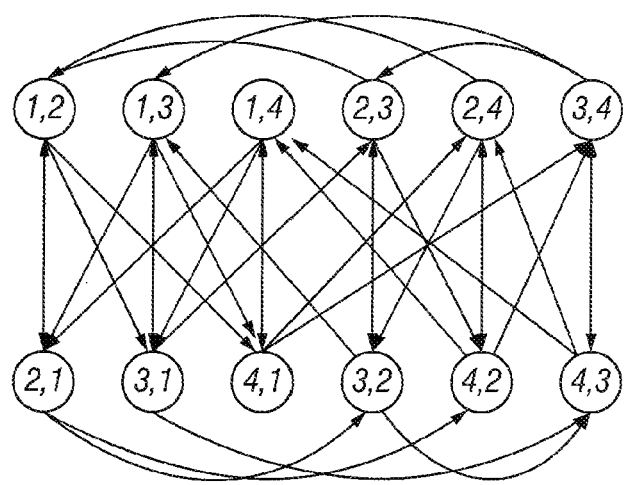

The key to maximizing storage capacity is to maximize the number of (discrete) levels programmed into cells. However, the multi-level cell (MLC) technology uses fixed levels to store data, and its performance is limited by the worst-case performance of cell programming [See P. CAPPELLETTI, C. GOLLA, P. OLIVO AND E. ZANONI (Ed.), *Flash memories*, Kluwer Academic Publishers, 1st Edition (1999)]. This is illustrated in FIG. 2 (a). A safety gap is needed to separate two adjacent levels to prevent errors after programming. Due to programming noise, the charge level of a cell cannot be pre-determined, and has a random distribution. Due to cell heterogeneity (i.e., different hardness for programming), when common voltages are used to program cells to the same level, different cells have different distributions. This is true even when multiple rounds of charge injection are used to program cells (e.g., the commonly used Incremental Step Pulse Programming scheme [H. T. LUE et al., *Proc. IEEE Int. Symp. on Reliability Physics*, vol. 30, no. 11, pp. 693-694 (2008)]). The overall distribution for a level is the closure of all the possible individual cell's distributions [See P. CAPPELLETTI, C. GOLLA, P. OLIVO AND E. ZANONI (Ed.), *Flash memories*, Kluwer Academic Publishers, 1st Edition (1999)]. Since MLC uses fixed cell levels and the cells' charge levels cannot decrease due to block erasure, the worst-case programming performance need to be focused on. So for MLC, the levels need to be sufficiently sparse to tolerate the worst-case performance of cell programming.

The variable-level cell (VLC) scheme maximizes storage capacity by flexibly programming the levels. It has two meanings: (1) The number of levels is flexibly chosen during programming; (2) The charge levels for each discrete level is flexibly chosen during programming. Let q denote the maximum number of discrete levels that can be programmed into a cell; and denote the q discrete levels by $\{0, 1, \ldots, q-1\}$. Let page denote the set of n cells programmed in parallel. (For NAND flash memories, a page is the basic unit for read/write, and is about $\frac{1}{64}$ or $\frac{1}{128}$ of a block.) Let $c_1, \ldots, c_n \in R$ denote the charge levels of the n cells; and let $l_1, \ldots, l_n \in \{0, 1, \ldots, q-1\}$ denote their discrete levels. The discrete levels of cells are determined by the relative order of the cells' charge levels, instead of the absolute values of charge levels. In principle, cells of similar charge levels are considered to have the same discrete level. There are many feasible ways to define the mapping from charge levels to discrete levels. One mapping is defined below.

Example 1

(MAPPING FROM CHARGE LEVELS TO DISCRETE LEVELS.) Let $D > \delta > 0$ be two parameters. Here D is the safety gap between adjacent levels, and $\delta$ is the maximum difference between two adjacent charge levels in the same discrete level. More specifically, let us sort the n cells' charge levels $c_1, \ldots, c_n$ as $c_{\beta(1)} < c_{\beta(2)} < \ldots < c_{\beta(n)}$. Let $0 = a_0 < a_1 < a_2 < \ldots < a_{p-1} < a_p = n$ (where $p \leq q$) be integers such that: (1) $\forall i \in \{1, \ldots, p\}$ and $j \in \{a_{i-1}+1, \ldots, a_i-1\}$, $c_{\beta(j+1)} - c_{\beta(j)} < \delta$; (2) $\forall i \in \{1, \ldots, p-1\}$, $c_{\beta(a_i+1)} - c_{\beta(a_i)} > D$. Then for $i=1, 2, \ldots, p$, the cells of charge levels $c_{\beta(a_{i-1}+1)}, c_{\beta(a_{i-1}+2)}, \ldots, c_{\beta(a_i)}$ are mapped to the discrete level $i-1$. When cells are programmed, the charge levels need to satisfy the above simple constraints so that they can be mapped to discrete levels easily and uniquely. If the range of charge levels for each discrete level needs to be bounded, an additional parameter can be defined accordingly. Here every programmed discrete level contains at least one cell. However, in general this condition can also be relaxed. If a sufficiently large gap of charge levels is intentionally left open between two existing levels, then this large gap can be understood as one or more levels that contain no cell, because if desired, cells can certainly be programmed into the gap to form non-empty levels. For simplicity, in the following, our introduction will focus on the case where every programmed level contains at least one cell. However, the introduction can be easily extended to the above more general case.

To program the cells in a page (with parallel programming), we program the discrete levels from low to high: Initially, all the charge levels are below a certain threshold (after the erasure operation) and are considered in the discrete level 0; then the memory first programs level 1, then level 2, then level 3, ..., and so on. Let $p \leq q$ be the integer such that level p−1 is programmed, but its charge levels are already very close to the physical limit; in this case, although the memory will not attempt to program level p, the first p−1 levels—namely, levels 1, 2, ..., p−1—have been successfully programmed without any ambiguity. The programming has the very nice property that it eliminates the risk of overshooting, because the gap between adjacent levels is only lower bounded, not upper bounded. This enables much more reliable and efficient writing. To better tolerate programming noise and cell heterogeneity, we can further partition a page into an appropriate number of cell groups, and apply the VLC scheme to every group.

The VLC scheme maximizes storage capacity for two reasons: (1) More compact charge-level distribution. The MLC scheme applies the same programming algorithm to all pages. So it considers the worst-case charge-level distribution. In contrast, VLC adaptively uses the actual charge-level distribution of the programmed page, which is narrower; (2) Very compact placement of levels. Since level i+1 is programmed after level i, and only their relative charge level is important, the charge levels of level i+1 just need to be above the actual—instead of the worst-possible-case—maximum charge level of level i by D (the safety gap). This is illustrated in FIG. 2 (b). To maximize the number of levels programmed into cells, VLC takes the best-effort approach. It relaxes the programming's limitation from the worst-case programming performance to the actual programming performance.

When the VLC scheme is applied to PCMs, the concept of charge injection is replaced by cell crystallization for programming. Although PCMs do not have block erasures, it is still very beneficial to take the level-by-level programming method to place the levels as compactly as possible.

The VLC coding scheme is distinct from conventional coding schemes in that the symbol written into the cells is adaptively chosen during programming. More specifically, the number of programmed levels depends on the actual programming process. So the coding theories developed for VLC are not only important for flash memories and PCMs, but also for other emerging storage media with heterogeneous storage elements that need similar storage schemes. We study a comprehensive set of important coding topics, including data representation, codes for rewriting data with low computational complexity, error-correcting codes, data management, and their integration. The designed codes can substantially improve the storage capacity, writing speed, longevity, reliability and efficiency of flash memories and PCMs.

1) Data Representation:

Flash memories and PCMs use the cell levels to represent data. An optimal data representation scheme can not only fully utilize the storage capacity provided by VLC, but also make encoding and decoding of data very efficient. So it is very important. Since for VLC, the number of levels that will be programmed into a page is not predetermined, the representation schemes are very distinctive. An example of the schemes is presented below.

Example 2

(DATA REPRESENTATION FOR VLC WITH UNIFORM-WEIGHT CELL-STATE VECTORS.) Let P be a page of n cells equipped with the VLC scheme that programs at most q discrete levels: $\{0, 1, \ldots, q-1\}$. A vector $v=(v_1, v_2, \ldots, v_n) \in \{0, 1, \ldots, q-1\}^n$ is called a cell-state vector, where $v_i$ denotes the discrete level of the ith cell. Define the weight of v, $w(v)=(w_1, w_2, \ldots, w_{q-1})$, as follows: $\forall i \in \{1, 2, \ldots, q-1\}, w_i = |\{j | 1 \leq j \leq n, v_j = i\}|$. Without loss of generality (WLOG), assume q|n. The vector v is called "uniform-weighted" if $$w_1 = w_2 = \ldots = w_{q-1} = \frac{n}{q};$$

namely, v has the same number of cells allocated to each level. Let $C \subseteq \{0, 1, \ldots, q-1\}^n$ denote the set of uniform-weight cell-state vectors. Let us first consider the scheme where only uniform-weight cell-state vectors are used to store data.

Let S denote a large volume of data to store in cells. Since a page is the basic unit of parallel programming, we will store the bits of S page after page. Consider the first page. Given any $v \in C$, for $i=1, 2, \ldots, q-1$, let $L_i(v)=\{j | 1 \leq j \leq n, v_j=i\}$ denote the set of $$\frac{n}{q}$$

cells of level i. For $i=1, 2, \ldots, q-1$, given $L_1(v), \ldots, L_{i-1}(v)$, there are $$\binom{n-(i-1)n/q}{n/q}$$

ways to select $L_i(v)$ for a uniform-weight cell-state vector v; and furthermore, those $$\binom{n-(i-1)n/q}{n/q}$$

possible values of $L_i(v)$ can be mapped to the index set $\{0, 1, \ldots,$ $$\binom{n-(i-1)n/q}{n/q}$$

efficiently in polynomial time:
Label the $$n - \frac{(i-1)n}{q}$$

cells that may be assigned to level i (i.e., the cells indexed by $$\{1, 2, \ldots, n\} - \bigcup_{j=1}^{i-1} L_j(v)$$

as $a_1, a_2, \ldots,$ $$a\left(n - \frac{(i-1)n}{q}\right).$$

Every possible value of $L_i(v)$ can be uniquely mapped to $$\left(n - \frac{(i-1)n}{q}\right)$$

-bit binary vector $b=(b_1, b_2, \ldots,$ $$b_{n-\frac{(i-1)n}{q}}$$

as follows:

$$\forall\, 1 \le j \le n - \frac{(i-1)n}{q},$$

$b_j=1$ iff the cell $a_j$ is assigned to level i. (Clearly, the Hamming weight of b is n/q.) Let $f$ be a bijection that maps b to a number in $\{0, 1, \ldots,$ $$\binom{n-(i-1)n/q}{n/q} - 1\}$$

based on the lexical order of b. $f(b)$ can be computed recursively as follows. Let k be the smallest integer in $\{1, 2, \ldots,$ $$n - \frac{(i-1)n}{q}\}$$

such that $b_k=1$. Let b' be the vector obtained by flipping the kth bit of b from 1 to 0. Then $f(b)$, which equals the number of $$\left(n - \frac{(i-1)n}{q}\right)$$

-bit vectors of Hamming weight n/q that are lexically smaller than b, equals $$\binom{(n-(i-1)n/q)-k}{n/q}$$

plus the number of $$\left(n - \frac{(i-1)n}{q}\right)$$

-bit vectors of Hamming weight $$\frac{n}{q} - 1$$

that are lexically smaller than b'.

So we can efficiently store the first $$\left\lfloor \log_2 \binom{n}{n/q} \right\rfloor$$

bits of the data S into level 1 when the memory programs level 1; then store the next $$\left\lfloor \log_2 \binom{n-n/q}{n/q} \right\rfloor$$

bits of S into level 2 when the memory programs level 2; and so on . . . , until the memory ends programming the page. The subsequent data of S will be written into the next page. The encoding and decoding are very efficient, and the data are written into the pages sequentially.

The number of cells in a page, n, is often a large number. For NAND flash memories, $n \sim 10^4$. The above scheme can be generalized by letting every level have $$\frac{n}{q}(1 + o(1))$$

cells. As such cell-state vectors form the "typical set" of all cell-state vectors, the storage capacity of VLC is very well utilized. The scheme can also be generalized to constant-weight cell-state vectors for better performance, where the numbers of cells in the q levels are not necessarily uniform, but are still appropriately-chosen constant numbers.

The optimal data representation schemes can maximize the expected amount of data written into a page by utilizing the probability for each level to be programmed. It is sometimes also desirable to maximize the amount of data that can be written into a page with guarantee. The schemes should also be designed to conveniently support other functions of the memory system.

2) Efficient Codes for Rewriting Data:

Codes for rewriting (i.e., modifying) data are very important for flash memories and PCMs [See A. JIANG, V. BOHOSSIAN AND J. BRUCK, *Proc. IEEE International Symposium on Information Theory (ISIT)*, pp. 1166-1170, Nice, France (2007)], [A. JIANG, J. BRUCK AND H. LI, *Proc. IEEE Information Theory Workshop (ITW)* (2010), [L. A. LASTRAS-MONTANO et al., *Proc. IEEE International Symposium on Information Theory (ISIT)*, pp. 1224-1228, Seoul, Korea (2009)]. Flash memories use block erasures, where a block contains about $10^6$ cells. Modifying even a single bit may require removing charge from a cell, which will lead to the very costly block erasure and reprogramming operations. Although PCMs do not use block erasures, to low the level (i.e., increase the resistance) of a PCM cell, the cell must be RESET to the lowest level, which is also costly. Codes designed for rewriting data can substantially improve the longevity, speed and power efficiency of flash memories and PCMs [see, e.g., A. JIANG et al., *Proc. IEEE International Symposium on Information Theory (ISIT)*, pp. 1219-1223, Seoul, Korea (2009)].

The VLC technology can maximize the number of levels in cells. And codes for rewriting are a particularly effective way to utilize the levels. Consider a cell with q levels. If it is used to store data at full capacity, the cell can store $\log_2 q$ bits; however, it has no rewriting capability without erasure/RESET. Let us compare it with a simple rewriting code that uses the cell to store one bit: if the cell level is an even integer, the bit is 0; otherwise, the bit is 1. The code allows the data to be rewritten q−1 times without erasure/RESET, where every rewrite will increase the cell level by only one. To see how effective it is, consider a VLC or MLC technology that improves q from 8 to 16. When the cell stores data at full capacity, the number of bits stored in the cell increases from 3 bits to 4 bits, a 33% improvement; and 4 bits are written into the cell per erase/RESET cycle. When the above rewriting code is used, the number of rewrites supported by the cell increases from seven rewrites to fifteen rewrites, a 114% improvement; and overall 15 bits can be sequentially written into the cell per erase/RESET cycle. Rewriting codes with better performance can be shown to exist [See A. JIANG, V. BOHOSSIAN and J. BRUCK, *Proc. IEEE International Symposium on Information Theory (ISIT)*, pp. 1166-1170, Nice, France (2007)], [R. L. Rivest and A. Shamir, *Information and Control*, vol. 55, pp. 1-19 (1982)]; and in general, the number of supported rewrites increases linearly (instead of logarithmically) with q, the number of levels. Given the limited endurance of flash memories and PCMs, rewriting codes can substantially increase the amount of data written into them over their lifetime [see A. JIANG, V. BOHOSSIAN and J. BRUCK, *Proc. IEEE International Symposium on Information Theory (ISIT)*, pp. 1166-1170, Nice, France (2007), and L. A. LASTRAS-MONTANO et al., *Proc. IEEE International Symposium on Information Theory (ISIT)*, pp. 1224-1228, Seoul, Korea (2009)].

We design highly efficient rewriting codes for VLC. The codes are also useful for MLC and SLC (single-level cells). Although high-rate rewriting codes can be shown to exist [R. L. Rivest and A. Shamir, *Information and Control*, vol. 55, pp. 1-19 (1982)], how to design such codes with low computational-complexity is a significant challenge. In our work, we have focused on optimal rewriting codes that fully utilize the different properties of flash memories and PCMs.

3) Error-Correcting Codes:

Strong error-correcting codes are very important for the data reliability of flash memories and PCMs [G. W. BURR et al., *Journal of Vacuum Science and Technology*, vol. 28, no. 2, pp. 223-262 (2010)], [P. CAPPELLETTI, C. GOLLA, P. OLIVO AND E. ZANONI (Ed.), *Flash memories*, Kluwer Academic Publishers, 1st Edition (1999)]. The cell levels of flash memories can be disturbed by write disturbs, read disturbs, charge leakage, cell coupling and other error mechanisms [P. CAPPELLETTI, C. GOLLA, P. OLIVO AND E. ZANONI (Ed.), *Flash memories*, Kluwer Academic Publishers, 1st Edition (1999)]. The cell levels of PCMs can be disturbed by the drifting of the resistance levels and thermal interference [G. W. BURR et al., *Journal of Vacuum Science and Technology*, vol. 28, no. 2, pp. 223-262 (2010)]. For cells of multiple levels, the likelihood of errors also depends on the magnitude of the errors. Currently, BCH codes and Hamming codes are widely used in flash memories [see P. CAPPELLETTI, C. GOLLA, P. OLIVO AND E. ZANONI (Ed.), *Flash memories*, Kluwer Academic Publishers, 1st Edition (1999)]; LDPC codes and other codes are actively under study.

In addition to the types of errors common to VLC and MLC, the VLC scheme also has a unique source of "partial erasure": the programming of levels. Consider VLC with at most q levels: levels 0, 1, ..., q−1. Before programming, all cells are in level 0; then levels 1, 2, ... are programmed from low to high. If the maximum discrete level is p<q−1 when programming ends, then for a cell still in level 0, it may belong to any level in the set {0, p+1, p+2, ..., q−1} in the original plan. So the cell can be considered partially erased. When data are stored as error-correcting codes, such partial erasures can be corrected by adaptively adjusting the construction of the code (i.e., add more redundant cells to the codeword when less data is written into a page), or by designing codes that can tolerate the partial erasures. An example of the latter codes is presented below.

Example 3

Error-Correcting Codes For Cell Groups. Partition the n cells in a page into m cell groups, and apply the VLC scheme (i.e., the mapping from charge levels to discrete levels) to every cell group independently. Compared to applying VLC to a whole page, for such a smaller cell group, the number of cells in a level is usually smaller, which makes it easier to program levels and enables more levels to be programmed in expectation. Choose an (m, k) error-correcting code C whose symbols are over large alphabets. For i=1, ..., m, let the ith cell group store the ith codeword symbol of C. The code C can be Reed-Solomon codes, BCH codes, fountain codes, etc. An appropriate mapping can be used that maps the cell levels of a cell group to the codeword symbol, such that when the partial erasure or errors happen, the number of induced bit erasures/errors in the codeword symbol is minimized. The number of levels programmed into the different cell groups may be different (due to programming noise and cell heterogeneity); so the amount of partial erasure in the different cell groups can be different. An efficient decoding algorithm for C, such as soft-decoding algorithms for Reed-Solomon codes or BCH codes, can be designed to correct the partial erasures due to programming and the errors due to the disturbs in cell levels.

The codeword symbols of the code C can also be mapped to the cell groups in different ways, in order to minimize the number of symbols that contain partial erasures. One method is to map every symbol to a fixed level. Compared to higher levels, lower levels are much more robust against partial erasures.

We have explored optimal code constructions for error correction. The memories have very strong requirements for reliability, and the study of codes for VLC is very important for high-capacity memories with various magnitude-related errors.

4) Data Management:

Data management consists of a set of functions that can substantially affect the performance of storage systems. For flash memories and PCMs, data are frequently read, rewritten and relocated. For memories with high storage capacity, these operations can be even more frequent. Due to the limited endurance and data retention of flash memories and PCMs, it is very important to maximize their longevity, reliability and speed with optimized data management schemes. In this work, we study: (1) Data aggregation and movement based on rewriting codes and other novel coding schemes for memory longevity and performance; (2) Data reliability schemes that maintain the global reliability of data, especially for combating the drift of cell levels (charge leakage for flash memories and resistance drift for PCMs); (3) File systems that present an integrated solution for flash memories and PCMs.

C. Patterned Cell Technology for Phase-Change Memories

PCM is the most promising emerging memory technology for the next generation. Currently, PCM prototypes of 512 MB using 4-level cells have been sampled. Despite their great potential, PCMs are facing two significant challenges: (1) Hardness of programming cell levels. It is very challenging to control the crystallization of cells using heat, which makes it hard to increase the number of cell levels for MLC (where fixed cell levels are used); (2) High power requirement. PCMs require extensive power when data are written. This constraint is currently significantly limiting the application of PCMs, especially for mobile and embedded systems [see D. LAMMERS, *IEEE Spectrum*, pp. 14 (September 2010)].

We develop a novel data storage technology for PCMs named Patterned Cells. It uses the internal structure of amorphous/crystalline domains (i.e., islands) in PCM cells to store data. It eliminates the high precision and power requirements imposed by programming cell levels, and opens a new direction for data storage in PCMs. It should be noted that the internal structure of PCM cells is an active topic of study in industry and research [see G. W. BURR et al., *Journal of Vacuum Science and Technology*, vol. 28, no. 2, pp. 223-262 (2010)], [see M. FRANCESCHINI et al., *Proc. Information Theory Workshop*, UCSD (2010)]. However, so far the effort has been for a single island in the PCM cell, and the focus is on controlling (i.e., programming) the position, size and shape of the island [see M. FRANCESCHINI et al., *Proc. Information Theory Workshop*, UCSD (2010)]. Patterned cell is distinct in that it uses multiple islands in a PCM cell. Clearly, the programming techniques developed for controlling a single island can also be applied to multiple islands. In the following, we present two designs of patterned cells: the amorphous-island scheme and the crystalline-island scheme.

In the following introduction, for simplicity of description, we assume that the electrodes are attached to two sides of a cell—top side and bottom side—and the electrodes that are connected to amorphous/crystalline islands are always on the bottom side of the cell. This can be easily generalized to the case where the electrodes are attached to various sides of the cell in various ways.

1) Amorphous-Island Scheme:

In the amorphous-island scheme, the cell as a base is in the crystalline state, and multiple bottom-electrodes are attached to the bottom of the cell that can create multiple amorphous islands. An example with two bottom-electrodes is shown in FIG. 3 (*a*). The amorphous islands can be created by applying voltage between the islands' bottom electrodes and their respective top electrodes. The high temperature induced by current will RESET the domains around the thin bottom electrodes and create the amorphous islands. An amorphous island can also be crystallized (including partially crystallized) by applying a more moderate voltage between its corresponding bottom and top electrodes. (See FIG. 3 (*b*). Due to the parallel structure of the islands, and due to the fact that the crystalline base of the cell has a much lower resistance than the amorphous islands (or partially crystalline islands later), most of the current will pass through the island being programmed; and the thermal interference to other islands is also smaller than its effect on the programmed island. FIG. 3 (*c*) shows a cell with four amorphous islands. The resistance level of an island can be measured by measuring the electrical resistance between its corresponding top and bottom electrodes. (For example, for the left island in FIG. 3 (*b*), the memory measures the resistance between electrodes A and a.) This is valid again because of the parallel structure of the islands and the much lower resistance of the crystalline base (compared to the islands).

The state a cell can be described by the resistance level measured for each island. In the simplest case, the resistance level can be quantized into two states: low resistance (no island) and high resistance (island exists). If the island has partially crystalline states, then more levels are used. However, it is challenging to program the resistance levels of the islands precisely, and the thermal interference from the SET/ RESET operation on an island can affect the state of other islands (e.g., to crystallize the other islands). To conquer the difficulty of programming cell levels and the thermal interference during the SET (i.e., crystallization) operation [see A. PIROVANO et al., *IEEE Trans. Device and Materials Reliability*, vol. 4, no. 3, pp. 422-427 (2004)] or RESET operation, we can use the relative order of the resistance levels of the islands to represent data. Specifically, for a cell with m amorphous islands, let $R_1, R_2, \ldots, R_m$ denote their resistance. For PCMs, usually the logarithm of the resistance is used. To achieve robust programming, every time the memory SET an island, it makes it more and more crystallized until its resistance is lower than all the other islands. Since the thermal interference from the SET operation may partly affect other islands, we choose an integer k≤m such that only the order of the k islands with lowest resistance is used to represent data. For example, if k=1, the programming is very robust. The islands can alternatively become more crystallized for rewriting data; and when the islands become nearly fully crystallized (namely, when they disappear), the cell will be RESET to create the amorphous islands again. The state of a cell is represented by a vector $s=(s_1, s_2, \ldots, s_k)$, where $s_1, \ldots, s_k \in \{1, 2, \ldots, m\}$ are the indices of the k islands with the lowest resistance. Namely, $R_{s_1} < R_{s_2} < \ldots < R_{s_k} < \min_{i \in \{1, 2, \ldots, m\} - \{s_1, s_2, \ldots, s_k\}} R_i$. With the programming method described above, the state-transition diagram of a cell is a directed graph with m(m−1) ... (m−k+1) vertices (i.e., states) and regular out-degree m−1. (Every directed edge corresponds to crystallizing one island to make its resistance the lowest.) An example of the state-transition diagram for m=4 islands and k=2 is shown in FIG. 3 (*d*).

In the above scheme, the cell programming is robust because only the relative order of resistance levels is used to store data. The exact value of the resistance does not need to be precisely controlled. This makes it easier to fully utilize the wide resistance range of the PCM material for repeated changing of the cell state and for rewriting data. And since the resistance level does not have to be programmed precisely using multiple cautious SET operations, the power for programming may be reduced.

2) Crystalline-Island Scheme:

In the crystalline-island scheme, the cell as a base is in the amorphous state, and multiple bottom-electrodes are attached to the cell that can create multiple crystalline islands. Initially, the cell is RESET using top and bottom electrodes. Then every bottom electrode can create a crystalline island using SET (the crystalline temperature). The resistance between two bottom electrodes becomes low when their two corresponding islands both exist and overlap, because the crystalline state has a much lower resistance (up to $10^3$ times) than the amorphous state. And bottom electrodes with low resistance between them are called connected. See FIG. 4(*a*), (*b*). The cell can keep creating islands to connect more and more bottom electrodes. When all electrodes become connected, the cell can be RESET to the initial fully-amorphous state, and the process starts again.

Figure 4A:
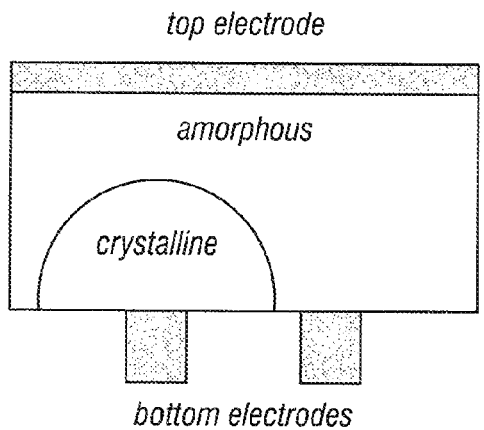
FIGS. 4($a$)-($d$) relate to a patterned cell with the crystalline-island scheme.
Figure 4B:
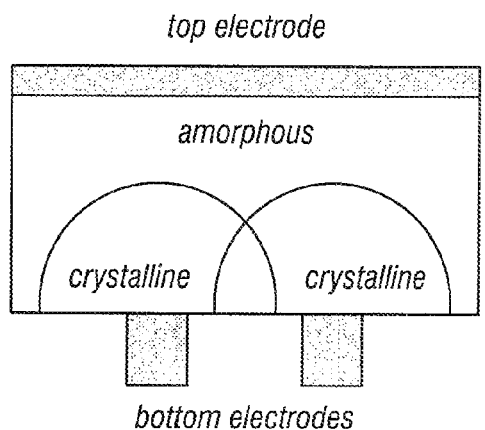
Figure 4C:
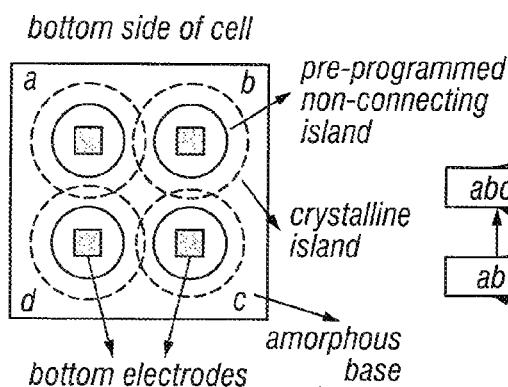
Figure 4D:
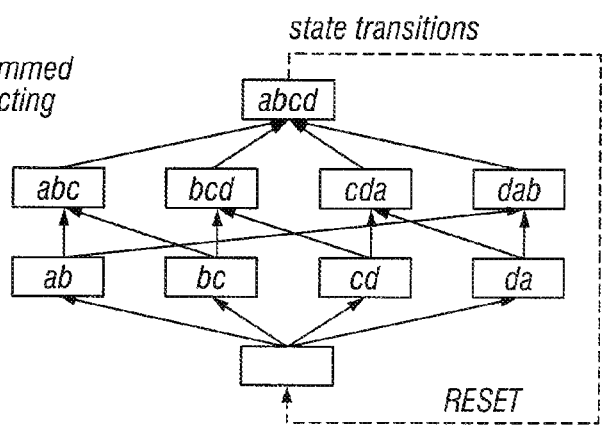

The state of the cell can be represented by the connectivity of the bottom electrodes. There are different geometric ways to place the bottom electrodes. An example using a 2×2 array is shown in FIG. 4(c), where a bottom electrode is only allowed to connect to its neighbors in the same row or column. In general, the electrodes can form an a×b array with m=ab electrodes. The state-transition diagram of a cell with m=4 electrodes is shown in FIG. 4(d). In each state, the letters represent the connected electrodes.

The crystalline-island scheme is a novel geometric coding scheme for PCMs. It only uses the existence/nonexistence of crystalline islands to represent data, and there is little requirement on controlling the programming precision of cell levels. This makes programming more robust. The scheme also provides an important way to pre-process the cells during idle time, in order to reduce the power requirement when data are actually written. Since most of time memories are idle, and the power becomes a constraint usually only when (a large volume of) data are written (i.e., during the peak time) [see D. LAMMERS, *IEEE Spectrum*, pp. 14 (September 2010)], the following strategy can be taken: when the memory is idle, create small crystalline islands in cells such that they are relatively close to each other but are still isolated. This is the preprocessing step. When the memory writes data, the cells just need to expand the islands to connect them, and this costs less power. See FIG. 4 (c) for an illustration.

We discuss some natural extensions. In the crystalline-island scheme, we can adaptively control the size of each island, or gradually increase them over time to change the connectivity of the bottom electrodes and to rewrite data. Also, since the different configurations of islands can change the resistance measured between different parts of the cell, the resistance level can also be used to store data.

3) Coding Schemes for Patterned Cells:

The patterned cell scheme is very distinct from all existing memory storage schemes [G. W. BURR et al., *Journal of Vacuum Science and Technology*, vol. 28, no. 2, pp. 223-262 (2010)] because it uses the geometry of cells to store data. So the coding theories developed for patterned cells are not only important for PCMs, but also for other emerging storage media where geometrical structures can be used to represent data [D. LAMMERS, *IEEE Spectrum*, pp. 14 (September 2010)], [H. J. RICHTER et al., *IEEE Trans. Magn.*, vol. 42, no. 10, pp. 2255-2260 (2006)]. We study a comprehensive set of important coding topics, including data representation, codes for rewriting data with low computational complexity, error-correcting codes, data management, and their integration. The topics are related to the corresponding topics for VLC. The distinction is that for patterned cells, the width of the cell's state-transition diagram is more than one. (For VLC, the diagram can be considered a cycle.) Also, the errors can be geometry related. More details on the coding topics will be presented in the following sections. The codes can substantially improve the reliability, longevity and performance of PCMs.

D. Outline of Coding Schemes

Variable-level cells (VLC) and patterned cells are novel technologies for next-generation PCMs and flash memories. By adaptively programming the cell levels, VLC can maximize the number of levels written into cells. By using the structures of amorphous/crystalline domains in cells, the patterned cell scheme opens a new direction for data representation. In this work, we study the following major coding functions:

1) Efficient and Robust Data Representation.

Data representation constructions are explored to maximize the storage capacity, be robust to the uncertainty in programming cell levels, and enable very efficient encoding and decoding of data.

2) Codes for Rewriting with High Rates and Low Computational Complexity.

Codes with very high rates and very low computational complexity for rewriting data are designed. The code construction can fully utilize the many levels provided by VLC and the cell states provided by patterned cells. They can maximize the amount of data a memory can write during its lifetime, which can also optimize its write speed and power efficiency.

3) Error Correction.

Error-correcting codes for VLC and patterned cells of high rates and efficient encoding/decoding algorithms are developed. The focus is to explore how to design the codes when cell levels may not be fully programmed, or when the errors are related to geometry. The codes can significantly increase the reliability of PCMs and flash memories.

4) Data Management.

New data management schemes are designed to optimally aggregate/migrate data in the memory systems, and maintain the long-term reliability of data.

5) Integration of Coding Schemes.

It is very important to integrate the different coding schemes designed for the different functions discussed above. Our results can provide a unified and practical solution for PCMs and flash memories, and fully optimize its performance.

These results provide a fundamental understanding of the VLC and patterned cell technologies, which is for the non-volatile memory technology of the next generation. The following sections provide more details on the coding functions that are listed above.

III. Efficient and Robust Data Representation

Data representation is the mapping between the cell states and data. In this work, highly efficient and robust data representation schemes are studied for VLC and patterned cells.

A. Data Representation for VLC

We focus on data representation schemes for VLC with these important properties: (1) The storage capacity provided by VLC is fully utilized; (2) The encoding and decoding of data is very efficient despite partial erasures, namely, the uncertainty in which set of levels will be programmed in a page (the basic unit for parallel programming). A good understanding of such schemes are not only useful for VLC, but also for future storage media where storage elements are heterogeneous and best-effort writing is needed to achieve maximum storage capacity.

Figure 5A:
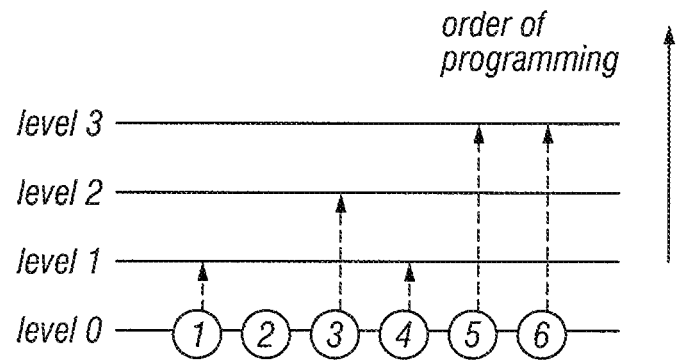
FIGS. 5($a$)-($c$) relate to a data representation for VLC memory.
Figure 5B:
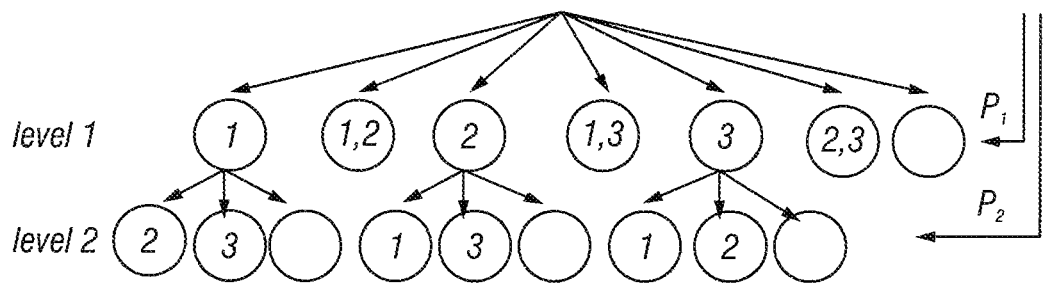

The data representation scheme is an interesting and new optimization problem. Consider a page with n cells, where at most q discrete levels can be programmed into the cells using VLC. Let $L=(l_1, l_2, \ldots, l_n) \in \{0, 1, \ldots, q-1\}^n$ be the cell-state vector, where $l_i$ is the discrete level of the ith cell. Before programming, $\forall i \in \{1, \ldots, n\}$ we have $l_i=0$. Let $T=(t_1, t_2, \ldots, t_n) \in \{0, 1, \ldots, q-1\}^n$ be the target vector, namely, assuming all q levels can be programmed, we would like the ith cell to be programmed to level $t_i$. The levels are programmed sequentially: first level 1, then level 2, and so on. See FIG. 5(a) for an illustration for a particular target vector. The values of all target vectors can be represented by a tree, as the toy example in FIG. 5(b) illustrates. The tree has a maximum depth of q−1; and every vertex at depth i represents a set of cells that can be programmed to level i given the assignment of cells to levels specified by the ancestors of that vertex.

Its ancestors correspond to levels 1, 2, ..., i−1. An empty vertex in the tree indicates that there is no cell in that level.

Figure 5C:
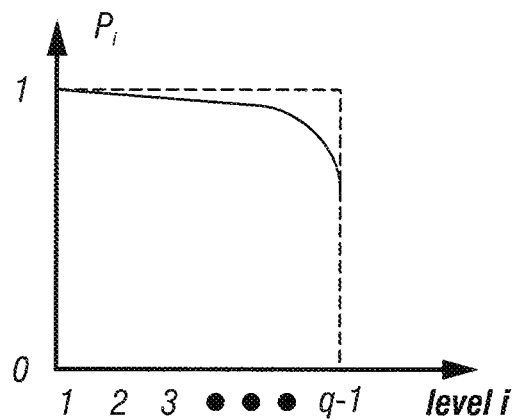

For i=1, 2, ..., q−1, let $P_i$ denote the probability that when the memory programs the page, level i will be successfully programmed. (This is assuming that all q levels contain cells, which is the typical case). Clearly, $1=P_1 \geq P_2 \geq P_3 \geq \ldots \geq P_q-1$. The distribution of $P_i$'s are as illustrated in FIG. 5(c). The objective of the data representation scheme is to find a mapping from the target vectors T to the data such that even if the q levels are not all programmed, those already programmed levels can still represent a portion of the data represented by the target vector T. And for high storage capacity and efficient encoding/decoding, this portion should be large, and is preferred to be the prefix of the data. The mapping should be optimized based on $P_i$.

We present a new data-representation scheme based on constant-weight cell-state vectors. It generalizes the scheme using uniform-weight cell-state vectors presented in the previous section. Let $w=(w_0, w_1, \ldots, w_{q-1})$ be a vector, such that every $w_i$ is a positive integer and $\Sigma_{i=0}^{q-1} w_i = n$. The scheme uses only those target vectors to represent data where for i=0, 1, ..., q−1, the target vector has $w_i$ cells in level i. With the low-to-high programming method of VLC, for i=1, 2, ..., q−1, there are $$A_i = \binom{n - \sum_{j=1}^{i-1} w_j}{w_i}$$

ways to allocate $w_i$ cells to level i given the previously programmed i−1 lower levels. So level i can store $B_i = \lfloor \log_2 A_i \rfloor$ bits. The expected number of bits that will be stored in the page is $\Sigma_{i-1}^{q-1} P_i B_i$. If our objective is to maximize the expect amount of data stored in a page, then we should choose the vector w to maximize the objective function $\Sigma_{i-1}^{q-1} P_i B_i$. Alternatively, robust programming problems can also be defined for more guaranteed performance [S. BOYD AND L. VANDENBERGHE, Convex optimization, Cambridge University Press (2004)]. The above scheme also enables very efficient encoding and decoding of data.

The above scheme can be generalized to the case where every level i contains $w_i(1+o(1))$ cells. It can be proved that as n→∞1, such a scheme can maximize the storage capacity. The scheme can also be generalized to the case where a page in partitioned into multiple cell groups. Various important functions of memory systems can be explored for optimal solutions.

B. Data Representation for Patterned Cells

Patterned cells use the structures of amorphous/crystalline islands in cells to store data. In the amorphous-island scheme, the relative order of the resistance levels of amorphous islands can be used. In the crystalline-island scheme, the connectivity of the crystalline islands can be used. When the cell states are mapped to data, to achieve robust programming, it is important to understand how robust the data representation is toward noisy programming.

Consider the crystalline-island scheme introduced in the previous section, where the bottom electrodes in a cell form an a×b array. Every island is allowed only to connect to its neighbors in the same row or column. If the programming of islands is noisy, the most common form of error is that two islands that are diagonal from each other are too large and become connected. (See FIG. 4 (c), where such diagonal errors can happen between islands a, c or islands b, d.) However, we can prove the following theorem, which shows that interestingly, the array structure of islands have inherent error-correction capabilities:

Theorem 4. The Crystalline-Island Scheme with Islands Positioned as any a×b Rectangular Array can Correct all Diagonal Errors.

Various important error types, design optimal structures and programming algorithms can be studied for patterned cells, and corresponding coding schemes can be explored. The results can achieve high storage capacity, very robust/efficient cell programming and high power efficiency.

IV. Error Correction and Data Management

Error-correcting codes are very important for flash memories and PCMs. When cells become smaller and more levels are stored in cells for higher storage capacity, errors appear more easily in cells. Currently, flash memories and PCMs use the Hamming codes and BCH codes for error correction [see P. CAPPELLETTI, C. GOLLA, P. OLIVO AND E. ZANONI (Ed.), *Flash memories*, Kluwer Academic Publishers, 1st Edition (1999)]; and other codes, including LDPC codes and Reed-Solomon codes, are also explored. However, due to the memories' special error mechanisms (read/write disturbs, coupling, charge leakage and drifting of cell levels, thermal interference) and cell properties (multiple levels in cells, programming algorithms, etc.), new codes of better performance are urgently needed.

We study and design strong error-correcting codes that fully utilize the high storage capacity of VLC and the rich structures of patterned cells, and are fully compatible with other coding schemes. The maximized number of levels of VLC provides more cell states that can be used to combat errors; on the other side, the uncertainty in the highest programmable level requires the code to be adaptive. One solution is to encode the information bits in the lower levels, which are more robust for programming, and store the parity-check information in the higher levels. Another solution is to partition a page into cell groups, and concatenate an erasure code (for each cell group) with an MDS code (across the cell groups) for optimized performance. The MDS code can also be replaced by other large-alphabet codes such as BCH codes or fountain codes. The above two solutions can also be combined. For patterned cells, it has been shown in the previous section that they have inherent robustness against geometry-related errors. By exploring more error types, strong error-correcting codes can be designed accordingly.

The coding schemes for different functions can be combined to form a comprehensive data management solution. For example, the above MDS code construction can be generalized for both error correction and rewriting, where every codeword symbol (cell group) is a small error-detecting rewriting code and is much easier to design due to the lower computational complexity. Page-level coding is also new and interesting. We have shown that to migrate data among n flash-memory blocks, coding-based solutions over GF(2) can reduce the number of block erasures from O(n log n) to O(n)[see, e.g., A. JIANG et al., *Proc. 47th Annual Allerton Conference on Communication, Control and Computing (Allerton)*, pp. 1031-1038, Monticello, Ill. (2009)], [see also A. JIANG et al., *Proc. IEEE International Symposium on Information Theory (ISIT)*, pp. 1918-1922, Austin, Tex. (2010)], [see also A. JIANG et al., *IEEE Transactions on Information Theory*, vol. 56, no. 10 (2010)]. The results can be further extended from conventional codes to rewriting codes for better performance. These comprehensive coding schemes are very suitable for VLC and patterned cells. Based on the study of data management systems that integrate different coding schemes, we can significantly improve the overall performance, longevity and reliability of PCMs and flash memories.

V. Conclusion

In this work, we present two novel storage technologies—variable-level cell and patterned cells—for PCMs and flash memories. They can also be used for other storage media with similar properties. The new technologies can maximize the storage capacity of PCMs and flash memories, enable robust and efficient programming, and substantially improve their longevity, speed and power efficiency.

D. Variable Level Cells for Nonvolatile Memories

I. Introduction

For nonvolatile memories (NVMs)—including flash memories, phase-change memories (PCMs), memristors, etc.,—maximizing the storage capacity is a key challenge. The existing method is to use multi-level cells (MLCs) of more and more levels, where a cell of q discrete levels can store $\log_2 q$ bits. See J. E. Brewer and M. Gill (Ed), *Nonvolatile memory technologies with emphasis on flash*, John Wiley & Sons, Inc., Hoboken, N.J., 2008. Flash memories with four and eight levels have been used in products, and MLCs with sixteen levels have been demonstrated in prototypes. For PCMs, cells with four or more levels have been in development. How to maximize the number of levels in cells is a most important topic for study.

The number of levels that can be programmed into cells is seriously constrained by the noise in cell programming and by cell heterogeneity. See the Brewer document referenced above. We explain it with flash memories as an example, and the concepts can be naturally extended to PCMs and memristors. A flash memory uses the charge stored in floating-gate cells to store data, where the amount of charge in a cell is quantized into q values to represent q discrete levels. Cell programming—the operation of injecting charge into cells—is a noisy process, which means that the actual increase in the cell levels can deviate substantially from the target value. And due to the block erasure property,—which means that to remove charge from any cell, a whole block of about $10^5$ cells must be erased together to remove all their charge,—during the writing procedure, the cell levels are only allowed to monotonically increase using charge injection. That makes it infeasible to correct over-injection errors. See the Brewer document referenced above. Beside cell-programming noise, the difficulty in programming is also caused by cell heterogeneity, which means that even when the same voltage is used to program different cells, the increments in the different cells' levels can differ substantially, due to the heterogeneity in cell material and geometry. H. T. Lue et al., "Study of incremental step pulse programming (ISPP) and STI edge effect of BE-SONOS NAND flash," *Proc. IEEE Int. Symp. on Reliability Physics*, vol. 30, no. 11, pp. 693-694, May 2008. Since memories use parallel programming for high write speed, a common voltage is used to program many cells during a programming step, which cannot be adjusted for individual cells. See Brewer and Lue documents referenced above. As cell sizes scale down, the cell heterogeneity will be even more significant. See the Brewer document referenced above.

The storage capacity of MLC is limited by the worst-case performance of cell-programming noise and cell heterogeneity. See the Brewer and Lue documents referenced above. We illustrate it in FIG. 9 (*a*). A safety gap is needed to separate two adjacent levels to prevent errors after programming. The charge level for an individual cell has a random distribution due to the cell-programming noise. See the Brewer and Lue documents referenced above. The actual value of the charge level varies from one write to another. Due to cell heterogeneity, the charge-level distributions of different cells in the same level shift away from each other, which widens the overall charge-level distribution of the level. See the Brewer and Lue documents referenced above. Since MLC uses fixed levels for storage, it needs to accommodate the worst-case programming performance: the charge-level range for a level is set to be sufficiently wide to accommodate not only the worst-case programming noise for each cell, but also the worst-case cell heterogeneity. That limits the number of levels in MLC.

In this document, we introduce a new storage scheme named variable-level cells (VLC) for maximum storage capacity. It has two unique properties: the number of levels is not fixed, and the positions of the levels are chosen adaptively during programming. More specifically, we program the levels sequentially from low to high. After level i is programmed, we program level i+1 such that the gap between the two adjacent levels is at least the required safety gap. (There are many ways to differentiate the cells in different levels. For example, we can require the cells of the same level to have charge levels within $\delta$ from each other, and require cells in different levels to have charge levels at least $\Delta$ away from each other, for appropriately chosen parameters $\delta$, $\Delta$.) We program as many levels into the cells as possible until the highest programmed level reaches the physical limit.

Figure 9A:
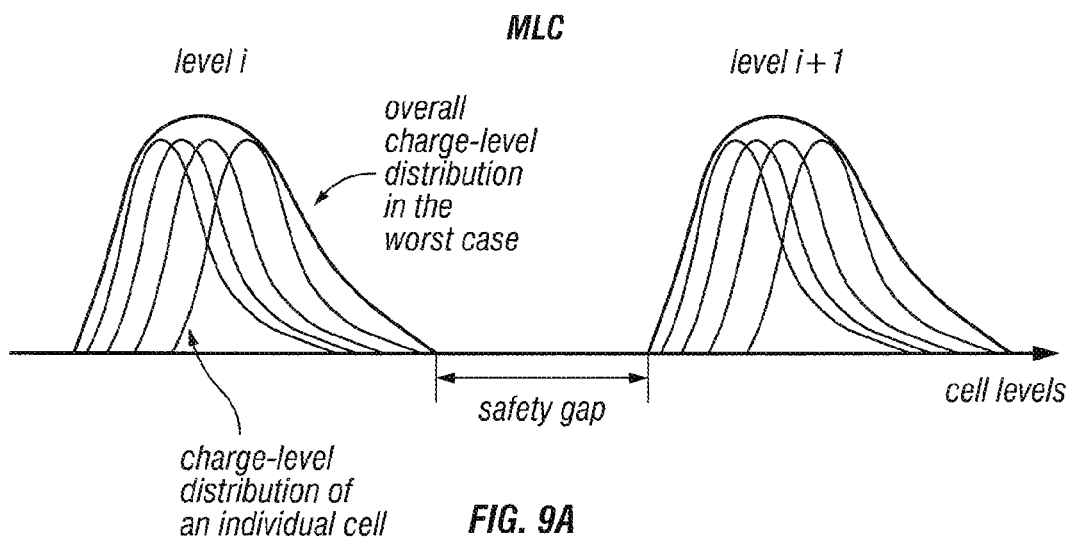
FIGS. 9($a$) and 9($b$) illustrate charge-level distributions for an MLC configuration and a VLC configuration, respectively.
Figure 9B:
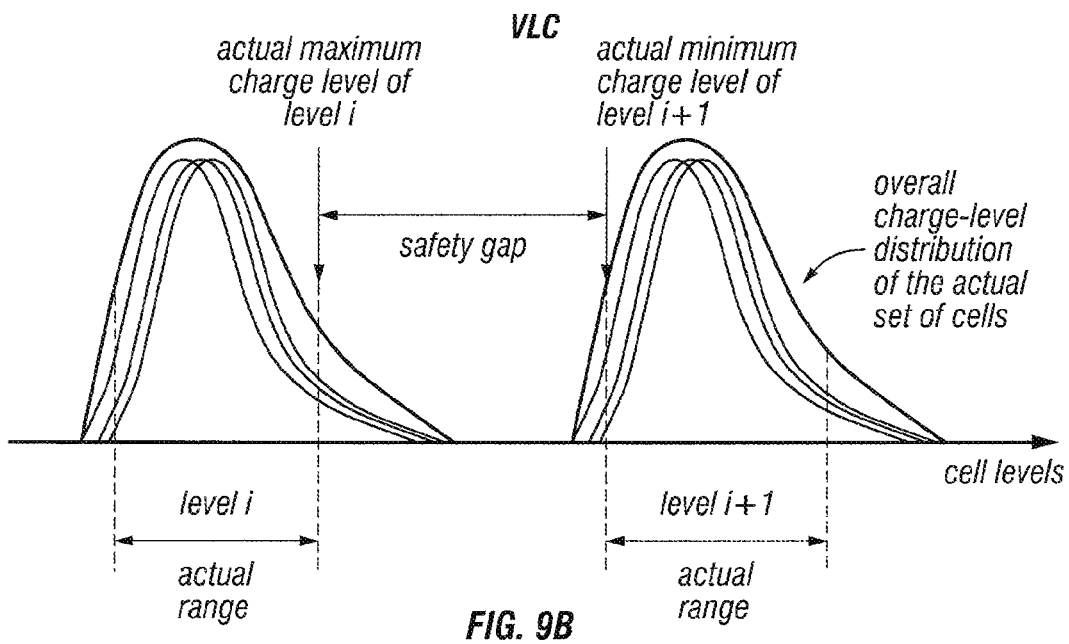

The VLC scheme places the levels as compactly as possible, and maximizes the number of programmed levels, which is determined by the actual instead of the worst-case programming performance. It is illustrated in FIG. 9 (*b*). Note that for a set of cells programmed in parallel, their heterogeneity is usually not as significant as the worst-case heterogeneity of all memory cells, which helps narrow the actual charge-level range for a level. See Brewer, referenced above. Furthermore, the actual cell-programming noise is often not as large as its worst-case value, which further narrows the actual range of charge levels for the level. The VLC scheme places level i+1 as low as possible based on the actual position of level i. The better the actual programming performance is, the more levels we write into the cells.

The VLC scheme shifts data representation into the stochastic regime, because the number of levels actually used is not determined in advance. New coding schemes are needed for this new paradigm. In this paper, we present a data representation scheme, and prove that it achieves the storage capacity of VLC. We also study rewriting codes, which are important for improving the longevity of flash memories and PCMs, and present bounds for achievable rates. See A. Jiang, V. Bohossian, and J. Bruck, "Floating codes for joint information storage in write asymmetric memories," Proc. IEEE International Symposium on Information Theory (ISIT), Nice, France, June 2007, pp. 1166-1170 and L. A. Lastras-Montano, M. Franceschini, T. Mittelholzer, J. Karidis and M. Wegman, "On the lifetime of multilevel memories," *Proc. IEEE International Symposium on Information Theory (ISIT)*, Seoul, Korea, 2009, pp. 1224-1228.

The remaining of the paper is organized as follows. In Section II, data representation schemes are studied, and the storage capacity of VLC is derived. In Section III, data rewriting and the achievable rates are studied. In Section IV, concluding remarks are presented.

II. Data Representation and Capacity of VLC

In this section, we present a probabilistic model for VLC, study its representation scheme, and derive its capacity.

A. Discrete Model for VLC

For a storage scheme, it is key to have a discrete model that not only enables efficient code designs, but is also robust to the physical implementation of the scheme. In this paper, we use the following simple probabilistic model for VLC.

Let q denote the maximum number of levels we can program into cells, and call the q levels level 0, level 1, ..., level q−1. Let n denote the number of cells, and for i=1, 2, ..., n, denote the level of the ith cell by $c_i \in \{0, 1, \ldots, q-1\}$. Before writing, all cells are at level 0. Let $L=(l_1, l_2, \ldots, l_n) \in \{0, 1, \ldots, q-1\}^n$ denote the target levels, which means that for i=1, ..., n, we plan to program $c_i$ as $l_i$. Since VLC uses the relative positions of charge levels to store data, we usually require for i=0, 1, ..., $\max_{1 \leq j \leq n} l_j$, at least one cell is assigned to level i. However when n→∞, this constraint has a negligible effect on the code rate. So when we analyze capacity, this constraint can be neglected. To program cells to the target levels L, we first program level 1 (namely, push some cells from level 0 to level 1), then program level 2, level 3, ..., until we reach a certain level i such that its charge levels are so close to the physical limit that we will not be able to program level i+1. All the cells that should belong to levels 1, 2, ..., i are successfully programmed to those levels. The cells that should belong to levels $\{i+1, i+2, \ldots, \max_{1 \leq j \leq n} l_j\}$ are still in level 0 (together with the cells that should belong to level 0). So the final cell levels are $L_i \triangleq (c'_1, c'_2, \ldots, c'_n)$, where for j=1, ..., n, $c'_j = l_j$ if $1 \leq l_j \leq i$, and $c'_j = 0$ otherwise.

For i=1, 2, ..., q−1, let $p_i$ denote the probability that level i can be programmed given that levels 1, 2, ..., i−1 are successfully programmed. (And for convenience, define $p_q = 0$.) Let T denote the target levels, and S denote the written levels. So when $T = L \in \{0, 1, \ldots, q-1\}^n$, for i=0, 1, ..., q−1, we have $\Pr\{S = L_i\} = (1-p_{i+1})\Pi_{j=1}^{i} p_j$.

We define the capacity of VLC by $$C = \lim_{n \to \infty} \frac{1}{n} \max_{p_T(t)} I(T; S),$$

where $P_T(t)$ is the probability distribution of T, and I(T; S) is the mutual information of T and S. Here we view the n cells as one symbol for the channel, and normalize its capacity by the number of cells. The capacity defined this way equals the expected number of bits a cell can store.

B. Data Representation Schemes

We present a data representation scheme with a nice property: every level i (for i=1, 2, ..., q−1) encodes a separately set of information bits. It enables efficient encoding and decoding of data. The code also achieves capacity and is therefore optimal. The code is of constant weight: the number of cells assigned to each level is fixed for all codewords.

Let $\mu_1, \mu_2, \ldots, \mu_{q-1} \in (0,1)$ be parameters. The code-words of our code are the target levels T that have this property: "$n\mu_1$ cells are assigned to level 1; and for i=2, 3, ..., q−1, $n\mu_i \Pi_{j=1}^{i-1}(1-\mu_j)$ cells are assigned to level i." (This is a general definition of constant-weight codes. Clearly, $\mu_i$ denotes the number of cells assigned to level I divided by the number of cells assigned to levels $\{0, i, i+1, \ldots, q-1\}$. Here we consider n→∞ and $p_i > 0$ for $1 \leq i \leq q-1$.) The constant-weight code enables convenient encoding and decoding methods as follows. Since there are $$\binom{n}{n\mu_1}$$

ways to choose the $n\mu_1$ cells in level 1, level 1 can encode log 2

$$\binom{n}{n\mu_1} \doteq nH(\mu_1)$$

information bits. Then, for i=2, 3, ..., q−1, given the cells already assigned to levels $\{1, 2, \ldots, i-1\}$, there are $$\begin{pmatrix} n\prod_{j=1}^{i-1}(1-\mu_j) \\ n\mu_i \prod_{j=1}^{i-1}(1-\mu_j) \end{pmatrix}$$

ways to choose the $n\mu_i \Pi_{j=1}^{i-1}(1-\mu_j)$ cells in level i; so level i can encode $$\log_2 \begin{pmatrix} n\prod_{j=1}^{i-1}(1-\mu_j) \\ n\mu_i \prod_{j=1}^{i-1}(1-\mu_j) \end{pmatrix} \doteq \left( n\prod_{j=1}^{i-1}(1-\mu_j) \right) H(\mu_i)$$

information bits. The mapping from cells in level i to information bits that level i represents has a well-studied solution in enumerative source coding. See T. M. Cover, "Enumerative source coding," *IEEE Transactions on Information Theory*, vol. IT-19, no. 1, pp. 73-77, January 1973, so we skip its details.

Given a stream of information bits, we can store its first $nH(\mu_1)$ bits in level 1, its next $n(1-\mu_1)H(\mu_2)$ bits in level 2, its next $n(1-\mu_1)(1-\mu_2)H(\mu_3)$ bits in level 3, and so on. This makes encoding and decoding convenient despite the nondeterministic behavior of writing. In memories, the n cells represent a page of cells that are programmed in parallel. If the target levels are L and the written levels are $L_i$, then we have written the first $\Sigma_{k=1}^{i}(n\Pi_{j=1}^{k-1}(1-\mu_j))H(\mu_k)$ information bits of the stream to the page of n cells. The rest of the stream can be written to the other pages in the memory. The expected number of information bits that can be written into the n cells is $\Sigma_{i=1}^{q-1}(\Pi_{j=1}^{i} p_j(n\Pi_{j=1}^{i-1}(1-\mu_j)))H(\mu_i)$. So the rate of the code, measured as number of stored bits per cell, is $$R = \sum_{i=1}^{q-1} \left( \prod_{j=1}^{i} p_j \right) \left( \prod_{j=1}^{i-1}(1-\mu_j) \right) H(\mu_i)$$

Let us define $A_1, A_2, \ldots, A_q-1$ recursively: $A_{q-1} = 2^{p_{q-1}}$; and for i=q−2, q−3, ..., 1, $A_i = (1+A_{i+1})^{p_i}$. Theorem 2 below shows the maximum rate of the code and the corresponding optimal configuration of the parameters $\mu_1, \mu_2, \ldots, \mu_{q-1}$. We first prove the following lemma.

Lemma 1.

Let $x \in [0,1]$ and $y \in [0,1]$ be given numbers. Let $$\mu^* = \frac{1}{1 + 2^{\frac{y}{x}}}.$$

Then $$\max_{\mu \in [0,1]} xH(\mu) + y(1 - \mu) = xH(\mu^*) + y(1 - \mu^*)$$
$$= \log_2(1 + 2^{\frac{y}{x}})$$

Proof: Define $f(\mu) \triangleq xH(\mu) + y(1 - \mu)$.

Then $$f(\mu) = y - \frac{1}{\ln 2}(x\mu \ln \mu + x(1-\mu)\ln(1-\mu) + y\mu \ln 2).$$

So $$f'(\mu) = -\frac{1}{\ln 2}\left(x \ln \frac{\mu}{1-\mu} + y \ln 2\right).$$

Where $f'(\mu)$ is the derivative of $f(\mu)$. By setting $f'(\mu)=0$, we get $$u = \frac{1}{1 + 2^{\frac{y}{x}}} \triangleq \mu^*.$$

And we get $f(\mu^*) = \log_2(1+2^{y_x})^x$.

Theorem 2. The maximum rate of the constant-weight code is $R = \log_2 A_1$, which is achieved when $$\mu_i = A_i^{-\frac{1}{p_i}}$$

for $i=1, 2, \ldots, q-2$ and $$\mu_{q-1} = \frac{1}{2}.$$

Proof: Since $$R = \sum_{i=1}^{q-1}\left(\prod_{j=1}^{i} p_j\right)\left(\prod_{j=1}^{i-1}(1 - \mu_j)\right)H(\mu_i)$$

$$= \sum_{i=1}^{q-2}\left(\prod_{j=1}^{i} p_j\right)\left(\prod_{j=1}^{i-1}(1 - \mu_j)\right)H(\mu_i) +$$

$$\left(\prod_{j=1}^{q-1} p_j\right)\left(\prod_{j=1}^{q-2}(1 - \mu_j)\right)H(\mu_{q-1})$$

to maximize R, we should have $$\mu_{q-1} = \frac{1}{2}.$$

So in the following discussion, we always assume that $$\mu_{q-1} = \frac{1}{2}.$$

For $k=q-2, q-3, \ldots, 1$, define $$\overline{R}_k \triangleq \sum_{i=k}^{q-1}\left(\prod_{j=k}^{i} p_j\right)\left(\prod_{j=k}^{i-1}(1 - \mu_j)\right)H(\mu_i).$$

We will prove the following property by induction, for $k=q-2, q-3, \ldots, 1$:

Property ♠: $\overline{R}_k$ is maximized when $$\mu_i = A_i^{-\frac{1}{p_i}}$$

for $i=k, k+1, \ldots, q-2$. And the maximum value of $\overline{R}_k$ is $\log_2 A_k$.

As the base case, let $k=q-2$. We have $$\overline{R}_{q-2} = \sum_{i=q-2}^{q-1}\left(\prod_{j=q-2}^{i} p_j\right)\left(\prod_{j=q-2}^{i-1}(1 - u_j)\right)H(\mu_i)$$

$$= p_{q-2}H(\mu_{q-2}) + p_{q-2}p_{q-1}(1 - \mu_{q-2})H(\mu_{q-1})$$

$$= p_{q-2}H(\mu_{q-2}) + p_{q-2}p_{q-1}(1 - \mu_{q-2})$$

To maximize $\overline{R}_{q-2}$, by Lemma 1 (where we let $x=p_{q-2}$, $y=q-1p_{q-1}$ and $\mu=\mu_{q-2}$), we should make $$\mu_{q-2} = \frac{1}{1 + 2^{p_{q-1}}} = \frac{1}{1 + A_{q-1}} = A_{q-2}^{-\frac{1}{p_{q-2}}},$$

and the maximum value of $\overline{R}_{q-2}$ is $\log_2(1+2^{p_{q-1}})^{p_{q-2}} = \log_2(1+A_{q-1})^{p_{q-2}} = \log_2 A_{q-2}$. So Property ♠ is true for the base case $k=q-2$.

We now consider the induction step. For $k \in \{q-3, q-4, \ldots, 1\}$, we have $$\overline{R}_k = \sum_{i=k}^{q-1}\left(\prod_{j=k}^{i} p_j\right)\left(\prod_{j=k}^{i-1}(1 - u_j)\right)H(\mu_i)$$

$$= p_k H(\mu_k) + p_k(1 - \mu_k) \cdot$$

$$\left(\sum_{i=k+1}^{q-1}\left(\prod_{j=k+1}^{i} p_j\right)\left(\prod_{j=k+1}^{i-1}(1 - u_j)\right)H(\mu_i)\right)$$

$$= p_k(H(\mu_k)\overline{R}_{k+1}(1 - \mu_k))$$

By the inductive assumption, $\overline{R}_{k+1}$ is maximized when $$\mu_i = A_i^{-\frac{1}{p_i}}$$

for I=k+1, k+2, ..., q−2 and the maximum value of $\overline{R}_{k+1}$ is $\log_2 A_{k+1}$. Note that $\overline{R}_{k+1}$ is not a function of $\mu_k$. To maximize $\overline{R}_k$, by Lemma 1 (where we let $x=1$, $y=\overline{R}_{k+1}=\log_2 A_{k+1}$ and $\mu=\mu_k$), we should make $$\mu_k = \frac{1}{1+2^{\log_2 A_{k+1}}} = \frac{1}{1+A_{k+1}} = A_k^{-\frac{1}{p_k}},$$

and the maximum value of $\overline{R}_k$ is $p_k \log_2(1+2^{\log_2 A_{k+1}}) = \log_2(1+A_{k+1})^{p_k} = \log_2 A_k$. So Property ♣ is true for $1 \leq k < q-2$. And that completes the proof by induction. Since $R=\overline{R}_1$, we see that the theorem holds.

Example 3

Consider VLC constant-weight codes with $q=5$. We have $A_4 = 2^{p_4}$, $A_3 = (1+2^{p_4})^{p_3}$, $A_2 = (1+(1+2^{p_4})^{p_3})^{p_2}$, $A_1 = (1+(1+(1+2^{p_4})^{p_3})^{p_2})^{p_1}$.

By Theorem 2, to maximize the rate of the code, we should choose the parameters $\mu_1, \mu_2, \mu_3, \mu_4$ as follows:

$$\mu_1 = \frac{1}{1+(1+(1+2^{p_4})^{p_3})^{p_2}},$$

$$\mu_2 = \frac{1}{1+(1+2^{p_4})^{p_3}},$$

$$\mu_3 = \frac{1}{1+2^{p_4}},$$

$$\mu_4 = \frac{1}{2}.$$

The above parameters make the code achieve the maximum rate $$R = \log_2\left(1+\left(1+(1+2^{p_4})^{p_3}\right)^{p_2}\right)^{p_1}.$$

We now discuss briefly data representation for VLC when n is small. In this case, it can be beneficial to use codes that are not of constant weight to improve code rates. At the same time, the need for every target level to contain at least one cell no longer has a negligible effect on the code rates. We illustrate such codes with the following example.

Example 4

Consider n=4 cells that can have at most q=3 levels. We show a code in FIG. 10, which stores 3 information bits in level 1 and 1 information bit in level 2. The four numbers inside a box are the cell levels, and the bold-font numbers beside a box are the corresponding information bits. Even if only level 1 and not level 2 can be programmed, we can still store three bits. The rate of the code is $3p_1 + p_1 p_2$ bits per cell.

C. Capacity of VLC

We now derive the capacity of VLC, and prove that the constant-weight code shown above is optimal.

Figure 11A:
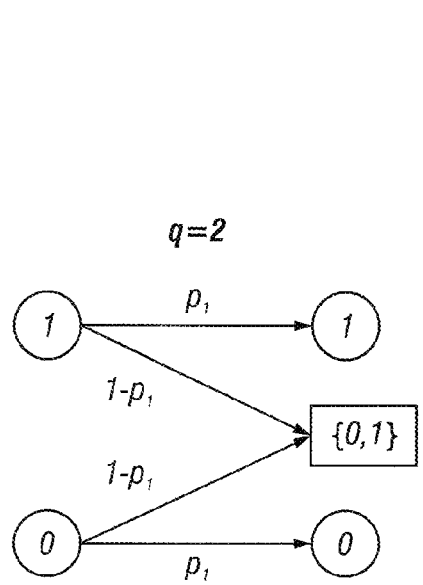
FIGS. 11($a$) and ($b$) illustrate a partial-erasure channel for q levels where q=2 and q=3, respectively.
Figure 11B:
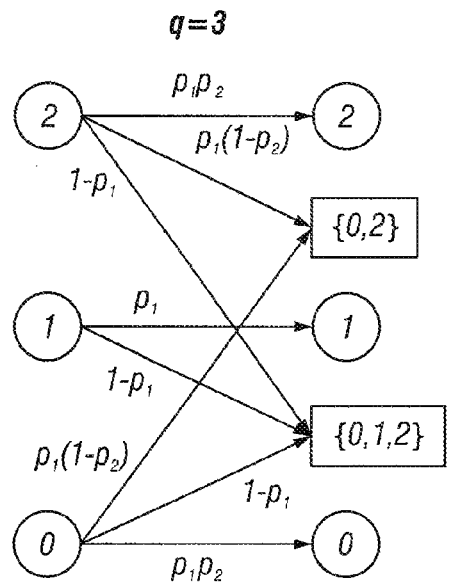

We first present a channel model for a single cell. Let X denote the target level for a cell, and let Y denote the actual state of the cell after writing. Clearly, $X \in \{0, 1, \ldots, q-1\}$. The level X can be successfully programmed with probability $p_1 p_2 \ldots p_X$ if $X \geq 1$, and with probability $p_1 p_2 \ldots p_{q-1}$ if $X=0$; and if so, we get $Y=X$. It is also possible that level X is not successfully programmed. For $i=0, 1, \ldots, q-2$, the highest programmed level will be level i with probability $(1-p_{i+1}) \Pi_{j=1}^{i} p_j$; and if so, the cells with target levels in $\{0, i+1, i+2, \ldots, q-1\}$ will all remain in level 0. In that case, if $X=0$ or $i+1 \leq X \leq q-1$, we denote that state of the cell after writing (namely, Y) by $E_{\{0, i+1, i+2, \ldots, q-1\}}$ and call it a partial erasure, because it is infeasible to tell which level in $\{0, i+1, i+2, \ldots, q-1\}$ is the target level of the cell. So we have $Y \in \{0, 1, \ldots, q-1\} \cup \{E_{\{0, 1, 2, \ldots, q-1\}}, E_{\{0, 2, 3, \ldots, q-1\}}, \ldots E_{\{0, q-1\}}\}$. We call the channel the partial-erasure channel. Examples of the channel for q=2, 3 are shown in FIG. 11, where the states in rectangles are the partial erasures. We can see that when q=2, the channel is the same as the binary erasure channel (BEC) with erasure probability $1-p_1$.

Lemma 5. The capacity of the partial-erasure channel for q levels is $\log_2 A_1$ bits per cell.

Proof: The capacity of the partial-erasure channel is $\max_{P_X(x)} I(X; Y)$, where $P_X(x)$ is the probability distribution for X. For $i=2, 3, \ldots, q$, we define $Ch_i$ to be a partial-erasure channel with i levels and the following alternation of notations:

Its i levels—from low to high—are denoted by levels 0, $q-i+1, q-i+2, \ldots q-1$ (instead of levels 0, 1, ... i−1);

The probabilities that the highest programmed level will be level $q-i+1$, level $q-i+2$, ..., level $q-1$ are $p_{q-i+1}$, $p_{q-i+1} p_{q-i+2}$, ..., $p_{q-i+1} p_{q-i+2} \cdots p_{q-1}$, respectively (instead of $p_1, p_1 p_2, \ldots, p_1 p_2 \cdots p_{i-1}$).

Let $\overline{X}_i$ and $\overline{Y}_i$ denote the input and output symbols to the channel $Ch_i$, respectively. (Clearly, we have $X=\overline{X}_q$ and $Y=\overline{Y}_q$.) We now prove the following claim by induction:

Claim ♣ : For $i=2, 3, \ldots q$, we have $$\max_{P_{\overline{X}_i}(x)}$$

First, consider the base case i=2. The channel $Ch_2$ is a binary erasure channel with erasure probability $1-p_{q-1}$, and its capacity is $p_{q-1}$. We have $A_{q-1} = 2^{p_{q-1}}$, so $\log_2 A_{q-1} = p_{q-1}$. So claim ♣ holds for i=2.

As the inductive step, consider $i \geq 3$. We have $\overline{X}_i \in \{0, q-i+1, q-i+2, \ldots, q-1\}$ and $\overline{Y}_i \in \{0, q-i+1, q-i+2, \ldots, q-1\} \cup \{E_{\{0,q-i+1, \ldots, q-1\}}, E_{\{0, q-i+2, \ldots, q-1\}}, \ldots, E_{\{0, q-1\}}\}$.

For convenience, in the following equation we use P(x) to denote $P_{\overline{X}_i}(x)$, use P(y) to denote $P_{\overline{Y}_i}(y)$, use P(x, y) to denote the joint distribution $P_{\overline{X}_i, \overline{Y}_i}(x, y)$, and use P(y|x) to denote the conditional distribution $P_{\overline{Y}_i|\overline{X}_i}(y|x)$. Define $\mu \triangleq P(x=q-i+1)$. We have $$I(\overline{X}_i; \overline{Y}_i) = \sum_x \sum_y P(x, y) \log \frac{P(x, y)}{P(x)P(y)}$$

$$= \sum_x P(x) \sum_y P(y|x) \log \frac{P(y|x)}{P(y)}$$

$$= P(x=q-i+1) P(y=q-i+1 | x=q-i+1) \cdot$$

-continued $$\log\frac{P(y=q-i+1\mid x=q-i+1)}{P(y=q-i+1)}+P(x=q-i+1)$$

$$P(y=E_{\{0,q-i+1,\ldots,q-1\}}\mid x=q-i+1)\cdot$$

$$\log\frac{P(y+E_{\{0,q-i+1,\ldots,q-1\}}\mid x=q-i+1)}{P(y=E_{\{0,q-i+1,\ldots,q-1\}})}+$$

$$\sum_{x\in\{0,q-i+2,\ldots,q-1\}}P(x)\sum_y P(y\mid x)\log\frac{P(y\mid x)}{P(y)}$$

$$=\mu p_{q-i+1}\log\frac{p_{q-i+1}}{\mu p_{q-i+1}}+\mu(1-p_{q-i+1})\log\frac{1-p_{q-i+1}}{1-p_{q-i+1}}+$$

$$\sum_{x\in\{0,q-i+2,\ldots,q-1\}}P(x)\sum_y P(y\mid x)\log\frac{P(y\mid x)}{P(y)}$$

$$=p_{q-i+1}\mu\log\frac{1}{\mu}+$$

$$\sum_{x\in\{0,q-i+2,\ldots,q-1\}}P(x)\sum_y P(y\mid x)\log\frac{P(y\mid x)}{P(y)}$$

$$=p_{q-i+1}\mu\log\frac{1}{\mu}+P(x\ne q-i+1)\cdot$$

$$\sum_{x\in\{0,q-i+2,\ldots,q-1\}}P(x\mid x\ne q-i+1)\cdot$$

$$\left[P(y=E_{\{0,q-i+1,\ldots,q-1\}}\mid x)\right.$$

$$\log\frac{P(y+E_{\{0,q-i+1,\ldots,q-1\}}\mid x)}{P(y+E_{\{0,q-i+1,\ldots,q-1\}})}+$$

$$\left.\sum_{y\ne E_{\{0,q-i+1,\ldots,q-1\}}}P(y\mid x)\log\frac{P(y\mid x)}{P(y)}\right]$$

$$=P_{q-i+1}\mu\log\frac{1}{\mu}+(1-\mu)\cdot$$

$$\sum_{x\in\{0,q-i+2,\ldots,q-1\}}P(x\mid x\ne q-i+1)\cdot$$

$$\sum_{y\ne E_{\{0,q-i+1,\ldots,q-1\}}}P(y\mid x)\log\frac{P(y\mid x)}{P(y)}$$

$$=p_{q-i+1}\mu\log\frac{1}{\mu}+p_{q-i+1}(1-\mu)\cdot$$

$$\sum_{x\in\{0,q-i+2,\ldots,q-1\}}P(x\mid x\ne q-i+1)\cdot$$

$$\sum_{y\ne E_{\{0,q-i+1,\ldots,q-1\}}}P(y\mid x,y\ne E_{\{0,q-i+1,\ldots,q-1\}})\cdot$$

$$\log\frac{(p_{q-i+1}P(y\mid x,y\ne E_{\{0,q-i+1,\ldots,q-1\}}))}{((1-\mu)p_{q-i+1}P(y\mid x\ne q-i+1,y\ne E_{\{0,q-i+1,\ldots,q-1\}}))}$$

$$=p_{q-i+1}\mu\log\frac{1}{\mu}+p_{q-i+1}(1-\mu)\cdot$$

$$\sum_{x\in\{0,q-i+2,\ldots,q-1\}}P(x\mid x\ne q-i+1)\cdot$$

$$\sum_{y\ne E_{\{0,q-i+1,\ldots,q-1\}}}P(y\mid x,y\ne E_{\{0,q-i+1,\ldots,q-1\}})\cdot$$

$$\log\frac{1}{1-\mu}+p_{q-i+1}(1-\mu)\cdot$$

-continued $$\sum_{x\in\{0,q-i+2,\ldots,q-1\}}P(x\mid x\ne q-i+1)\cdot$$

$$\sum_{y\ne E_{\{0,q-i+1,\ldots,q-1\}}}P(y\mid x,y\ne E_{\{0,q-i+1,\ldots,q-1\}})\cdot$$

$$\log\frac{P(y\mid x,y\ne E_{\{0,q-i+1,\ldots,q-1\}})}{P(y\mid x\ne q-i+1,y\ne E_{\{0,q-i+1,\ldots,q-1\}})}$$

By defining $B$ as $$B\triangleq\sum_{x\in\{0,q-i+2,\ldots,q-1\}}P(x\mid x\ne q-i+1)\cdot$$

$$\sum_{y\ne E_{\{0,q-i+1,\ldots\}}}P(y\mid x,y\ne E_{\{0,q-i+1,\ldots,q-1\}})\cdot\log$$

$$\frac{P(y\mid x,y\ne E_{\{0,q-i+1,\ldots,q-1\}})}{P(y\mid x\ne q-i+1,y\ne E_{\{0,q-i+1,\ldots,q-1\}})},$$

we get $$I(\overline{X}_i;\overline{Y}_i)=p_{q-i+1}\mu\log\frac{1}{\mu}+p_{q-i+1}(1-\mu)\log\frac{1}{1-\mu}+p_{q-i+1}(1-\mu)B$$

$$=p_{q-i+1}(H(\mu)+(1-\mu)B)$$

We see that B is actually the mutual information between the input and output symbols of the channel $Ch_{i-1}$, namely $B=I(\overline{X}_{i-1};\overline{Y}_{i-1})$. By the induction assumption, the maximum value of B is $\log_2 A_{q-i+2}$. So $$\max_{P_{\overline{X}_i}(x)} I(\overline{X}_i;\overline{Y}_i)=\max_{\mu\in[0,1]}p_{q-i+1}(H(\mu)+(1-\mu)\log_2 A_{q-i+2}).$$

By Lemma 1, $$\max_{\mu\in[0,1]}H(\mu)\log_2 A_{q-i+2}=\log_2(1+A_{q-i+2}).$$

So $$\max_{P_{X_i}(x)}I(\overline{X}_i;\overline{Y}_i)=\log_2(1+A_{q-i+2})^{p_{q-i+1}}\log_2 A_{q-i+1}.$$

So claim ♣ is proved. Since $X=\overline{X}_q$ and $Y=\overline{Y}_q$, we have $$\max_{P_X(x)} I(X;Y)=\log_2 A_{q-q+1}=\log_2 A_1.$$

That completes the proof.

Theorem 6. The capacity of VLC is $$C=\log_2 A_1.$$

Proof.

Let $T=(x_1,\ldots,x_n)\in\{0,1,\ldots,q-1\}^n$ denote the target levels of the n cells, and $S=(y_1,\ldots,y_n)\in\{0,1,\ldots,q-1,E_{\{0,1,\ldots,q-1\}},E_{\{0,2,\ldots,q-1\}},\ldots,E_{\{0,q-1\}}\}^n$ denote the written levels of the n cells. Note that the requirement for every level to have at least one cell has a negligible effect on the capacity, because we can satisfy the requirement by assigning q auxiliary cells $a_0, a_1, \ldots, a_{q-1}$ to the q levels, where for $i=0, 1, \ldots, q-1$, we let auxiliary cell $a_i$'s target level be level i. As $n\to\infty$, the q auxiliary cells do not affect the code's rate.

So in the following, we can assume that the set of values that T can take are exactly the set $\{0, 1, \ldots, q-1\}^n$. Namely, every cell's target level can be freely chosen from the set $\{0, 1, \ldots q-1\}$. We also assume the q auxiliary cells exist without loss of generality (w.l.o.g.).

Let $h \in \{0, 1, \ldots q-1\}$ denote the highest programmed level. $\Pr\{h=0\}=1-p_1$, and for $i=1, 2, \ldots, q-1$, $\Pr\{h=i\}=p_1 p_2 \ldots p_i$. The value of h can be determined after writing this way: h is the highest written level of the q auxiliary cells. Note that the random variable h is independent of the n target levels $x_1, x_2, \ldots, x_n$; and for $i=1, \ldots, n$, the value of $y_i$ is determined by $x_i$ and h. So $\max_{PT(t)} I(T; S) = n \max_{px\ (x)} I(x_i; y_i) = n \max_{PX\ (x)} I(X;Y) = n \log_2 A_1$, where X, Y are the input and output symbols of the partial-erasure channel. Since the capacity of VLC is $$C = \lim_{n \to \infty} \frac{1}{n} \max_{pT(t)} I(T; S)$$

(where we see every VLC group of n cells as one symbol for the channel, and the channel has infinitely many such symbols), we have $C = \log_2 A_t$.

The above theorem shows that the constant-weight code introduced in the previous subsection achieves capacity.

III. Rewriting Data in VLC

In this section, we study codes for rewriting data in VLC, and bound its achievable rates. There has been extensive study on rewriting codes for flash memories and PCMs (for both single-level cells (SLCs) and MLCs) for achieving longer memory lifetime. See Jiang and Lastras-Montano. In the well known write-once memory (WOM) model, the cell levels can only increase when data are rewritten. See F. Fu and A. J. Han Vinck, "On the capacity of generalized write-once memory with state transitions described by an arbitrary directed acyclic graph," *IEEE Transactions on Information Theory*, vol. 45, no. 1, pp. 308-313, 1999. For flash memories and PCMs, the model describes the behavior of cells between two global erasure operations. Since erasures reduce the quality of cells, it is highly desirable to avoid them. Given the number of rewrites, T, our objective is to maximize the rates of the code for the T rewrites, when cell levels can only increase for rewriting.

A. Codes for Rewriting Data

We first consider some specific code constructions. Consider a VLC cell group that has n cells of q levels. Let $p_1, P_2, \ldots, P_{q-1}$ be the same probabilities as defined before. And for convenience, we define $p_q=0$.

Example 7

Parity Code for Rewriting in VLC

Let $(c_1, c_2, \ldots, c_n) \in \{0, 1, \ldots, q-1\}^n$ denote the n cells' levels. Let them represent n bits of data, $(b_1, b_2, \ldots, b_n) \in \{0, 1\}^n$ this way: for $1 \leq i \leq n$, $b_i = c_i \mod 2$. For convenience, we assume $n \to \infty$, and we have q auxiliary cells with target levels $0, 1, \ldots, q-1$, respectively. The auxiliary cells will ensure every programmed level will maintain at least one cell, and will help us tell the levels of the n cells. Clearly, for every rewrite, a cell's level needs to increase by at most one. The rewriting has to end when we cannot program a higher level. The rate of the code is one bit per cell for each rewrite. And the expected number of rewrites this parity code can support is $\Sigma_{i=1}^{q-1} i \cdot (p_i p_2 \ldots p_i (1-p_{i+1})) = p_1(1+p_2(1+p_3( \ldots +p_{q-2}(1+p_{q-1}))))$.

More generally, given a WOM code that rewrites k bits of data t times in n two-level cells, by a similar level-by-level approach, we can get a rewriting code in VLC of rate k/n that supports $tp_1 (1+p_2(1+p_3( \ldots +p_q-2(1+p_{q-1}))))$ rewrites in expectation. See the Fu document referenced above.

B. Bounding the Capacity Region for Rewriting in VLC

We now study the achievable rates for rewriting in VLC. Note that unlike MLC, which are deterministic, the highest programmable level of a VLC group is a random variable. So we need to define code rates accordingly.

Consider a VLC group of n cells, whose highest programmable level is a random variable $h \in \{1, 2, \ldots, q-1\}$. (We assume $h \geq 1$—namely $p_1=1$—for the convenience of presentation. The analysis can be extended to $h \geq 0$.) Note that the value of h remains unknown until level h is programmed. To simplify rate analysis, we suppose that there are q auxiliary cells $a_0, a_1, \ldots, a_{q-1}$ in the same VLC group, whose target levels are $0, 1, \ldots, q-1$, respectively. For $i=1, \ldots, h$, when level i is programmed, the auxiliary cell $a_i$ will be raised to level i and always remain there. If $h<q-1$, after level h is programmed (at which point we find that level h+1 cannot be programmed), we push $a_{h+1}, \ldots, a_{q-1}$ to level h, too. So having more than one auxiliary cell in a level i indicates h=i. For sufficiently large n, the q auxiliary cells have a negligible effect on the code rate.

Now consider N VLC groups $G_1, G_2, \ldots, G_N$, each of n cells. (For capacity analysis, we consider $N \to \infty$.) For $i=1, \ldots, N$, denote the highest programmable level of $G_i$ by $h_i \in \{1, \ldots, q-1\}$, and denote its cells by $(c_i, 1, \ldots, c_{i,n})$. Here $h_1, \ldots, h_N$ are i.i.d. random variables, where for $1 \leq i \leq N$ and $1 \leq j \leq q-1$, $\Pr\{h_i=j\}=p_1 p_2 \ldots p_j(1-p_{j+1})$. (Note $p_1=1$ and $p_q \triangleq 0$.) If the target level of cell $c_{i,j}$ is $l_{i,j}$, we will program it to level $\min\{l_{i,j}, h_i\}$. Then if $h_i<q-1$ and the written level of cell $c_{i,j}$ is $h_i$, we say that the cell is in the partially-erased state $E_{hi}$, since its target level could be any value in $\{h_i, h_i+1, \ldots, q-1\}$. In addition, for any two vectors $x=(x_1, x_2, \ldots, x_k)$ and $y=(y_1, y_2, \ldots, y_k)$, we say $x \leq y$ if $x_i \leq y_i$ for $i=1, \ldots, k$.

Definition 8.

A $(T, V_1, V_2, \ldots, V_T)$ rewriting code for the N VLC groups consists of T pairs of encoding and decoding functions $\{(f_t, g_t)\}_{t=1}^T$, with the message index sets $I_t=\{1, 2, \ldots, V_t\}$, the encoding functions $f_t: I_t \times \{0, 1, \ldots, q-1\}^{Nn} \to \{0, 1, \ldots, q-1\}^{Nn}$, and the decoding functions $g_t: \{0, 1, \ldots, q-1\}^{Nn} \to I_t$. Let $x_0^{Nn}=(0, 0, \ldots, 0) \in \{0, 1, \ldots, q-1\}^{Nn}$. Given any sequence of T messages $m_1 \in I_1, m_2 \in I_2, \ldots, m_T \in I_T$, for the T rewrites, the target levels for the cells $(c_{1,1}, \ldots, c_{1,n}, c_{2,1}, \ldots, c_{2,n}, c_{N,1}, \ldots, c_{N,n})$ are $x_1^{Nn}=f_1(m_1, x_0^{Nn})$, $x_2^{Nn}=f_2(m_2, x_1^{Nn}), \ldots, x_T^{Nn}=f_T(m_T, x_{T-1}^{Nn})$, respectively, where $x_{t-1}^{Nn} \leq x_t^{Nn}$ for $t=1, \ldots, T$. However, while the target cell levels for the tth rewrite (for $t=1, \ldots, T$) are $x_t^{Nn}=(l_{1,1}, \ldots, l_{1,n}, l_{2,1}, \ldots, l_{2,n}, \ldots, l_{N,1}, \ldots, l_{N,n})$, the written cells levels are $y_t^{Nn}=(l'_{1,1}, \ldots, l'_{1,n}, l'_{2,1}, \ldots, l'_{2,n}, \ldots l'_{N,1}, \ldots, l'_{N,n})$, where $l'_{i,j}=\min\{l_{i,j}, h_i\}$. For decoding, it is required that for $t=1, \ldots, T$, we have $\Pr\{g_t(y_t^{Nn})=m_t\} \to 1$ as $N \to \infty$.

For $t=1, \ldots T$, define $$R_t = \frac{1}{Nn} \log_2 V_t.$$

Then $(R_1, R_2, \ldots, R_T)$ is called the rate vector of the code.

We call the closure of the set of all rate vectors the capacity region, and denote it by $A_T$. We present its inner/outer bounds.

1) Inner Bound to Capacity Region:

We consider a sub channel code for VLC. Let $c_1, c_2, \ldots, c_N$ be N cells, one from each of the N VLC groups. The Nn cells in the N VLC groups can be partitioned into n such "subchannels." We define the rewriting code for the N cells in the same way as in Definition 8 (by letting n=1). We denote its capacity region by $A_T$. Clearly, for any given n, we have $\overline{A}_T \subseteq A_T$.

Let $L=\{0, 1, \ldots, q-1\}$ denote the set of target levels. Let $E=\{E_1, E_2, \ldots, E_{q-2}\}$ denote the set of partially-erased states. Then $L \cup E$ are written levels. For two random variables X, Y taking values in L, we say "$X \Rightarrow Y$" if $Pr\{X=x, Y=y\}=0$ for any $0 \leq y < x \leq q-1$. Let random variables $S_1, S_2, \ldots, S_T$ form a Markov chain that takes values in L. We say "$S_1 \Rightarrow S_2 \Rightarrow \ldots \Rightarrow S_T$" if $S_{t-1} \Rightarrow S_t$ for t=2, 3, ..., T. For i=1, 2, ..., T, let $\{s_{i,0}, s_{i,1}, \ldots, s_{i,q-1}\}$ denote the probability distribution where $s_{i,j}=Pr\{S_i=j\}$ for j=0, 1, ... q-1.

Given the random variables $S_1, S_2, \ldots, S_T$, we define $a_{i,j}$ and $B_{i,j}$ (for i=1, 2, ..., T and j=1, 2, ..., q-2) as follows. Let $\alpha_{i,j} = (\sum_{k=j}^{q-1} s_{i,k})(\prod_{k=2}^{j} p_k)(1-p_{j+1})$. We define $B_{i,j}$ to be a random variable taking values in $\{j, j+1, \ldots, q-1\}$, where $Pr\{B_{i,j}=k\} = s_{i,k}/(\sum_{l=j}^{q-1} s_{i,l})$ for k=j, j+1, ..., q-1. We now present an inner bound to $\overline{A}_T$. Since $\overline{A}_T \subseteq A_T$, it is also an inner bound to $A_T$.

Theorem 9.

Define $D_T = \{(R_1, R_2, \ldots, R_T) \in \mathfrak{R}^T\}$ there exist Markov-chain random variables $S_1, S_2, \ldots, S_T$ taking values in $\{0, 1, \ldots, q-1\}$, such that $S_1 \Rightarrow S_2 \Rightarrow \ldots \Rightarrow S_T$ and $$R_1 \leq H(S_1) - \sum_{i=1}^{q-2} \alpha_{1,i} H(B_{1,i}),$$

$$R_2 \leq H(S_2 | S_1) - \sum_{i=1}^{q-2} \alpha_{2,i} H(B_{2,i}),$$

$$\vdots$$

$$R_T \leq H(S_T | S_{T-1}) - \sum_{i=1}^{q-2} \alpha_{T,i} H(B_{T,i}).$$

Then, we have $D_T \subseteq \overline{A}_T$.

Proof:

Suppose $S_1, S_2, \ldots, S_T$ are Markov-chain random variables that take values in $\{0, 1, \ldots, q-1\}$, and that $S_1 \Rightarrow S_2 \Rightarrow \ldots \Rightarrow S_T$. For any constant $\epsilon > 0$ (which can be arbitrarily small), we set $$V_1 = 2^{N[H(S_1) - \sum_{i=1}^{q-2} \alpha_{1,i} H(B_{1,i}) - 2\epsilon]},$$

$$V_t = 2^{N[H(S_t|S_{t-1}) - \sum_{i=1}^{q-2} \alpha_{t,i} H(B_{t,i}) - 2\epsilon]}, \text{ for } t=2, 3, \ldots T.$$

We will prove that when N is sufficiently large, there exists an $(T, V_1, V_2, \ldots, V_T)$ rewriting code for the N cells $c_1, c_2, \ldots, c_N$.

We first consider the case T=2. Let $T_{S_1}^N$ denote the vectors in $L^N = \{0, 1, \ldots, q-1\}^N$ of type $(s_{1,0}, s_{1,1}, \ldots, s_{1,q-1})$. That is, $$T_{S_1}^N = \left\{ (x_1, x_2, \ldots, x_N) \in L^N \mid \text{for } i=0, 1, \ldots, q-1, \frac{|\{j \mid 1 \leq j \leq N, x_j = i\}|}{N} = s_{1,i} \right\}.$$

Similarly, let $T_{S_2}^N$ denote the vectors in $L^N$ of type $(s_{2,0}, s_{2,1}, \ldots, s_{2,q-1})$. We construct two sets $\overline{T}_{S_1}^N$ and $\overline{T}_{S_2}^N$ using random coding as follows. From the set $T_{S_1}^N$, we uniformly randomly select $$\frac{|T_{S_1}^N|}{2^{N[\sum_{i=1}^{q-2} \alpha_{1,i} H(B_{1,i}) + \epsilon]}}$$

elements, and denote the selected subset by $\overline{T}_{S_1}^N$. Similarly, from the set $T_{S_2}^N$, we uniformly randomly select $$\frac{|T_{S_2}^N|}{2^{N[\sum_{i=1}^{q-2} \alpha_{2,i} H(B_{2,i}) + \epsilon]}}$$

elements, and denote the selected subset by $\overline{T}_{S_2}^N$.

We first prove the following property:

Property ♣: $\forall x \in \overline{T}_{S_1}^N$, if we program the N cells $c_1, \ldots, c_N$ with x as the target levels, let $y \in (L \cup E)^N$ denote their written levels. Then with high probability (which approaches 1 as N approaches infinity), the vector y can be correctly decoded to x.

Figure 12:
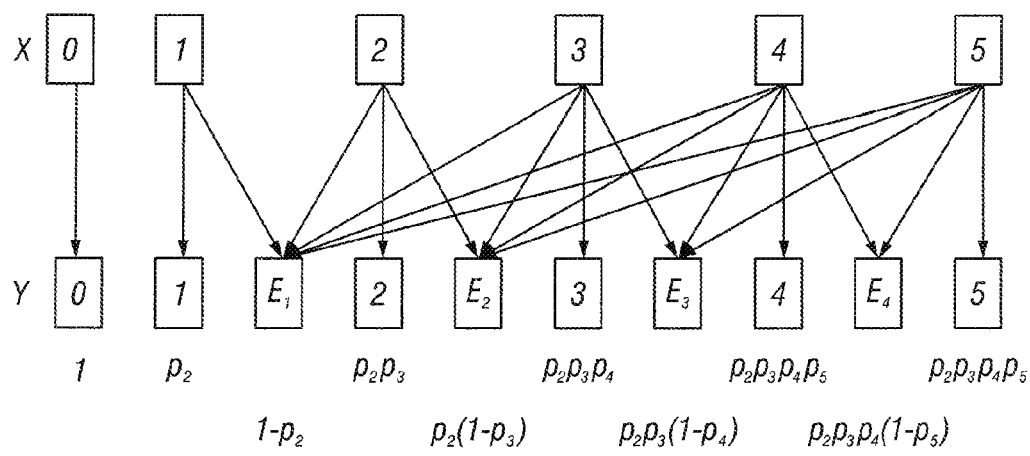
FIG. 12 illustrates a channel model for q=6 levels, with X, Y as input and output symbols, respectively.

To prove Property ♣, consider the channel model for a cell $c_i$, with its target level $X \in L$ as the input symbol and its written level $Y \in L \cup E$ as the output symbol. We have $Pr\{Y=0 | X=0\}=1$; for i=1, 2, ..., q-2, we have $Pr\{Y=i | X=i\} = p_2 p_3 \ldots p_{i+1}$ and for j=1, 2, ..., i, $Pr\{Y=E_j | X=i\} = p_2 p_3 \ldots p_j(1-p_{j+1})$; and we have $Pr\{Y=q-1 | X=q-1\} = p_2 p_3 \ldots p_{q-1}$ and for j=1, 2, ..., q-2, $Pr\{Y=E_j | X=q-1\} = p_2 p_3 \ldots p_j(1-p_{j+1})$. The channel model for q=6 is illustrated in FIG. 12.

We can see that if X has the same distribution as the random variable $S_1$, then for i=1, 2, ..., q-2, $$Pr\{Y = E_i\} = \left(\sum_{j=i}^{q-1} s_{1,j}\right)\left(\prod_{j=2}^{i} p_j\right)(1 - p_{i+1}) = \alpha_{1,i};$$

also, for i=1, 2, ..., q-2 and j=i, i+1, ..., q-1, $$Pr\{X = j | Y = E_i\} = \frac{s_{1,j}}{\sum_{k=i}^{q-1} s_{1,k}} = Pr\{B_{1,i} = j\}.$$

For any $i \in L$, if Y=i, then X=i and $H(X|Y=i)=0$. So we have $$H(X|Y) = \sum_{z \in L \cup \mathcal{E}} Pr\{Y = z\} H(X | Y = z)$$

$$= \sum_{z \in \mathcal{E}} Pr\{Y = z\} H(X | Y = z)$$

$$= \sum_{i=1}^{q-2} \alpha_{1,i} H(B_{1,i})$$

Since $$\lim_{N\to\infty} (\log_2 |\overline{T}_{S_1}^N|)/N = \lim_{N\to\infty} (\log_2 |T_{S_1}^N|)/N -$$

$$\left[\sum_{i=1}^{q-2} \alpha_{1,i} H(B_{1,i}) + \epsilon\right]$$

$$= H(S_1) - \sum_{i=1}^{q-2} \alpha_{1,i} H(B_{1,i}) + \epsilon$$

$$= H(X) - H(X \mid Y) - \epsilon$$

$$= I(X; Y) - \epsilon$$

$$< I(X; Y),$$

when $N \to \infty$, with probability one we can decode x from y based on their joint typicality. So Property ♣ is true. Using the same analysis, we get the following property for $T_{S_2}^N$:
Property ♠: $\forall x \in \overline{T}_{S_2}^N$, if we program the N cells $C_1, \ldots, c_N$ with x as the target levels, let $y \in (L \cup \epsilon)^N$ denote their written levels. Then with high probability (which approaches 1 as N approaches infinity), the vector y can be correctly decoded to x.

We now discuss the encoding and decoding of the T=2 writes. For the first write, we choose $V_1$ different elements $x_1, x_2, \ldots, x_{V_1} \in \overline{T}_{s_1}^N$, and set the encoding function as $f_1(i) = x_i$. To write data $i \in I_1 = \{1, 2, \ldots, V_1\}$, we program the cells with $x_i$ as their target levels. Let $y \in (L \cup \epsilon)^N$ denote the written levels. We set the decoding function $g_1(y)$ as follows: it first recovers $x_i$ from y based on joint typicality (which succeeds with high probability by Property ♣), then maps $x_i$ to i. So the first write succeeds with high probability.

Consider the second write. Let $\{F_1, F_2, \ldots, F_{V_2}\}$ be a partition of the set $\overline{T}_{S_2}^N$. Namely, $\cup_{i=1}^{V_2} F_i = \overline{T}_{S_2}^N$ and for any $i \neq j$, $F_i \cup F_j = 0$. We first show that the following property holds:

Property ◊: There exists a partition $\{F_1, F_2, \ldots, F_{V_2}\}$ of the set $\overline{T}_{S_2}^N$ such that for any $u \in \overline{T}_{S_2}^N$ and any $v \in I_2 = \{1, 2, \ldots, V_2\}$, there exists a vector $x \in F_v$ such that $u \leq x$.

To prove Property ◊, we use the method of random coding. For every $z \Delta \overline{T}_{S_2}^N$, associate it with an index r, that is uniformly randomly and independently chosen from the message index set $I_2 = \{1, 2, \ldots, V_2\}$. For i=1, 2, ..., $V_2$, define $$F = \{z \in \overline{T}_{S_2}^N \mid r_z = i\}.$$

Then $\{F_1, F_2, \ldots, F_{V_2}\}$ form a partition of the set $\overline{T}_{S_2}^N$.

For any $u \Delta (u_1, u_2, \ldots, u_N) \in \overline{T}_{S_1}^N$, define the set of conditional typical sequences $\overline{T}_{S_2|S_1}^N(u)$ as $$T_{S_2|S_1}^N(u) = \left\{ (v_1, v_2, \ldots, v_N) \in L^N \mid \forall (a, b) \in L^2, \frac{|\{i \mid 1 \leq i \leq N, u_i = a, v_i = b\}|}{N} = Pr\{S_1 = a, S_2 = b\} \right\},$$

and define G(u) as $$G(u) = \{v \in \overline{T}_{S_2}^N \mid u \leq v\}.$$

Since $S_1 \Rightarrow S_2$, we have $\overline{T}_{S_2|S_1}^N(u) \subseteq G(u)$. By the property of typical sequences, we have $|G(u)| \geq |\overline{T}_{S_2|S_1}^N(u)| \geq (N+1)^{-q^2} 2^{NH(S_2|S_1)}$. For the property of typical sequences, see I. Csiszar and J. Korner, Information Theory: Coding Theorems for Discrete Memoryless Systems, New York: Academic, 1981. and Fu.

For any $v \in I_2 = \{1, 2, \ldots, V_2\}$ and $u \in \overline{T}_{S_2}^N$, we get $$Pr\{F_v \cap G(u) = 0\} = Pr\left\{\begin{array}{l} \text{for every } z \in G(u), \\ \text{either } r_z \neq v \text{ or } \notin \overline{T}_{S_2}^N \end{array}\right\}$$

$$= \left(1 - \frac{1}{V_2 \cdot 2^{N[\sum_{i=1}^{q-2} \alpha_{2,i} H(B_{2,i}) + \epsilon]}}\right)^{|G(u)|}$$

$$\leq \exp\left\{-\frac{|G(u)|}{V_2 \cdot 2^{N[\sum_{i=1}^{q-2} \alpha_{2,i} H(B_{2,i}) + \epsilon]}}\right\}$$

$$\leq \exp\left\{-\frac{(N+1)^{-q^2} 2^{NH(S_2|S_1)}}{2^{N|H(S_2|S_1) - \sum_{i=1}^{q-2} \alpha_{2,i} H(B_{2,i}) - 2\epsilon| + N[\sum_{i=1}^{q-2} \alpha_{2,i} H(B_{2,i}) + \epsilon]}}\right\}$$

$$= \exp\left\{-\frac{(N+1)^{-q^2} 2^{NH(S_2|S_1)}}{2^{N|H(S_2|S_1)}}\right\}$$

$$= \exp\{-(N+1)^{-q^2} 2^{N\epsilon}\}$$

By the union bound, we get $$Pr\{\exists v \in I_2\} \text{ and } u \in \overline{T}_{S_2}^N \text{ such that } F_v \cap G(u) = 0\} \leq V_2 \cdot |\overline{T}_{S_1}^N| \cdot \exp\{-(N+1)^{-q^2} 2^{N\epsilon}\} \leq q^{2N} \cdot \exp\{-(N+1)^{-q^2} 2^{N\epsilon}\} \to 0 \text{ as } N \to \infty.$$

This implies that Property ◊ is true.

We now describe the encoding and decoding functions of the second write. Let $\{F_1, F_2, \ldots, F_{V_2}\}$ be a partition of the set $\overline{T}_{S_2}^N$ that has the property described in Property ◊. For any $u \in \overline{T}_{S_1}^N$ and any $v \in I_2 = \{1, 2, \ldots, V_2\}$, there exists a vector $x_v(u) \in F_v$ such that $u \leq x_v(u)$. We set the encoding function $f_2(v, u')$ as follows: given the written levels u' of the first write, it first recovers the target levels u of the first write (which succeeds with high probability by Property ♣), then sets $f_2(v, u') = x_v(u)$. When the target cell levels of the first write are u, to write data $v \in I_2$ in the second write, we program the cells with $x_v(u)$ as their target levels. Let $y \in (L \cup E)^N$ denote the written levels. We set the decoding function $g^2(y)$ as follows: it first recovers $x_v(u)$ from y based on joint typicality (which succeeds with high probability by Property ♠), then maps $x_v(u)$ to v. So the second write succeeds with high probability.

The above proof for T=2 can be easily generalized to the proof for general T. The encoding and decoding functions for the tth write (for t=3, 4, ..., T) can be defined in the same way as for the second write. So we get the conclusion.

Note that if $p_2 = p_3 = \ldots = p_{q-1} = 1$ (namely, every cell can be programmed to the highest level q−1 with guarantee), we get $a_{i,j} = 0$ for all Consequently, the set of achievable rates presented in the above theorem, $D_T$, becomes $D_T = \{(R_1, R_2, \ldots, R_T) \in R^T \mid$ there exist Markov-chain random variables $S_1, S_2, \ldots, S_T$, such that $S_1 \Rightarrow S_2 \Rightarrow \ldots \Rightarrow S_T$ and $R_1 \leq H(S_1)$, $R_2 \leq H(S_2|S_1)$, ..., $R_T \leq T(S_T|S_{T-1})\}$, which is exactly the capacity region of MLC with q levels. See F. Fu and A. J. Han Vinck, "On the capacity of generalized write-once memory with state transitions described by an arbitrary directed acyclic graph," *IEEE Transactions on Information Theory*, vol. 45, no. 1, pp. 308-313, 1999.

2) Outer Bound to Capacity Region:

To derive an outer bound to the capacity region $A_T$, we consider the rewriting code as defined in Definition 8, but with an additional property: the highest reachable levels $h_1, h_2, \ldots, h_N$ for the N VLC groups are known in advance. Thus the encoding and decoding functions can use that information. Let $A_T^*$ denote its capacity region. Clearly, $A_T^* \supseteq A_T$, so it is an outer bound to $A_T$.

Theorem 10.

Define $G_T = \{(R_1, R_2, \ldots R_T) \in R_T | \text{ for } i=1, 2, \ldots, q-1, \text{ there exist } (r_1, r_2, \ldots, r_{T,i}) \in R_T$ and Markov-chain random variables $S_{1,i}, S_{2,i}, \ldots, S_{T,i}$ taking values in $\{0, 1, \ldots, i\}$, such that $$S_{1,i} \Rightarrow S_{2,i} \Rightarrow \ldots \Rightarrow S_{T,i},$$

$$r_{1,i} \leq H(S_{1,i}), r_{2,i} \leq H(S_{2,i}|S_{1,i}), \ldots, r_{T,i} \leq H(S_{T,i}|S_{T-1,i})$$

and for $j=1, 2, \ldots, T$, $$R_j = \sum_{k=1}^{q-1} p_1 p_2 \ldots p_k (1-p_{k+1}) r_{j,k}.\}$$

Let $C_T$ be the closed set generated by $G_T$. We have $A_T^* = C_T$.

Proof:

For $i=1, 2, \ldots, q-1$, let $Q_i$ be the indices of the VLC groups whose highest reachable levels are all level i. That is, $Q_i = \{j \in \{1, 2, \ldots, N\} | h_j = i\} \subseteq \{1, 2, \ldots, N\}$. Also, define $\gamma_i = p_1 p_2 \ldots p_i (1-p_{i+1})$. (As before, $pq \triangleq 0$.) Clearly, $$\frac{|Q_i|}{N} \to \gamma_i$$

with high probability as $N \to \infty$.

We first prove that all rate vectors $(R_1, R_2, \ldots, R_T)$ in $G_T$ are achievable rate vectors. It is known that for WOM of $i+1$ levels [4], the rate vector, $r_{1,i}, r_{2,i}, \ldots, r_{T,i}$ is achievable for T writes if and only if there exist Markov-chain random variables $S_{1,i}, S_{2,i}, \ldots, S_{T,i}$ taking values in $\{0, 1, \ldots, i\}$ such that $S_{1,i} \Rightarrow S_{2,i} \Rightarrow, \ldots, \Rightarrow S_{T,i}$ and $r_{1,i} \leq H(S_{1,i})$, $r_{2,i} \leq H(S_{2,i}|S_{1,i}), \ldots, r_{Ti} \leq H(S_{T,i}|S_{T-1,i})$. So for $i=1, 2, \ldots, q-1$, we can use the cells in the VLC groups indexed by $Q_i$ to achieve T writes with the rate vector $(r_{1,i}, r_{2,i}, \ldots, r_{T,i})$. Together, the N VLC groups achieve T writes with the rate vector $(R_1, R_2, \ldots, R_T)$.

Next, we prove the converse. Given a $(T, V_1, V_2, \ldots, V_T)$ code, we need to show that $$\left(\frac{1}{N_n}\log_2 V_1, \frac{1}{N_n}\log_2 V_2, \ldots, \frac{1}{N_n}\log_2 V_T\right) \in G_T.$$

We use the same technique of proof as described in the Fu reference (Theorem 3.1). For $t=1, 2, \ldots, T$, let $f_t, g_t$ denote the encoding and decoding functions of the code for the t-th write, respectively.

Let $W_1, W_2, \ldots, W_T$ be independent random variables that are uniformly distributed over the message index set $I_t = \{1, 2, \ldots, V_t\}$ (for $t=1, 2, \ldots, T$), respectively. Let $Y_t^{Nn} \triangleq \{0, 0, \ldots, 0\}$ denote the all-zero vector of length Nn. Then for $t=1, 2, \ldots, T$, define $Y_t^{Nn} = (Y_{t,1}, Y_{t,2}, \ldots, Y_{t,Nn})$ as $Y_t^{Nn} = f_t(W_t, Y_{t-1}^{Nn})$. That is, $Y_t^{Nn}$ denotes the cell levels after the t-th write. It is not hard to see that $H(W_t) = H(Y_t^{Nn}|Y_{t-1}^{Nn})$ for $t=1, 2, \ldots, T$.

For $i=1, 2, \ldots, q-1$, let $Q_i \subseteq \{1, 2, \ldots, Nn\}$ denote the indices of the cells whose highest reachable levels are all i, and let $L_i$ be an independent random variable that is uniformly distributed over the index set $Q_i$. Specifically, the indices for cells in VLC group $G_1$ are $\{1, 2, \ldots, n\}$, the indices for cells in G2 are $\{n+1, n+2, \ldots, 2n\}$, and so on. Let L be an independent random variable that is uniformly distributed over the index set $\{1, 2, \ldots, Nn\}$. We get $$\frac{1}{Nn}\log_2 V_t = \frac{1}{Nn}H(W_t)$$

$$= \frac{1}{Nn}H(Y_t^{Nn}|Y_{t-1}^{Nn})$$

$$\leq \frac{1}{Nn}\sum_{i=1}^{Nn} H(Y_{t,i}|Y_{t-1,i})$$

$$= \sum_{i=1}^{Nn} Pr\{L=i\}H(Y_{t,L}|Y_{t-1,L}, L=i)$$

$$= \sum_{i=1}^{q-1} \gamma_i \sum_{j \in \overline{Q}_i} Pr\{L=j | L \in \overline{Q}_i\}H(Y_{t,L}|Y_{t-1,L}, L=i)$$

$$= \sum_{i=1}^{q-1} \gamma_i H(Y_{t,L_i}|Y_{t-1,L_i}, L_i)$$

$$\leq \sum_{i=1}^{q-1} \gamma_i H(Y_{t,L_i}|Y_{t-1,L_i})$$

For $i=1, 2, \ldots, q-1$, define a set of new random variables $S_{1,i}, S_{2,i}, \ldots, S_{T,i}$ taking values in $\{0, 1, \ldots, i\}$, whose joint probability distribution is defined as $$Pr\{S_{1,i} = j_1, S_{2,i} = j_2, \ldots, S_{T,i} = j_T\}$$
$$= Pr\{Y_{1,L_i} = j_1\}Pr\{Y_{2,L_i} = j_2 | Y_{1,L_i} = j_1\} \ldots$$
$$Pr\{Y_{T,L_i} = j_T | Y_{T,L_i}, j_{T-1}\}.$$

Define $S_{0,i} \triangleq 0$. It is not hard to see that, $S_{1,i}, S_{2,i}, \ldots, S_{T,i}$ form a Markov chain, and for any $t \in \{1, 2, \ldots, T\}$ the random variables $(S_{t-1,i}, S_{t,i})$ and $Y_{t-1,Li}, Y_{t,Li}$ have the same probability distribution. So $H(S_{1,i}) = H(Y_{1,Li})$ and for $t=2, 3, \ldots, T$, $H(S_{t,i}|S_{t-1,i}) = H(Y_{t,Li}|S_{t-1,Li})$. Since $Y_{t-1,Li} = Y_{t,Li}$ for $t=2, 3, \ldots, T$, we have $S_{1,i} \Rightarrow S_{2,i} \Rightarrow \ldots \Rightarrow S_{T,i}$. Therefore for $t=1, 2, \ldots, T$, $$\frac{1}{Nn}\log_2 V_t \leq \sum_{i=1}^{q-1} \gamma_i H(S_{t,i}|S_{t-1,i}).$$

So we have $$\left(\frac{1}{Nn}\log_2 V_1, \frac{1}{Nn}\log_2 V_2, \ldots, \frac{1}{Nn}\log_2 V_T\right) \in G_T.$$

That completes the converse part of the proof. So $A_T^* = C_T$.

Let $MT \triangleq \max\{\Sigma_{t=1}^T R_t|(R_1, R_2, \ldots, R_T) \in A_T\}$ denote the maximum total rate of all rewriting codes for VLC. It is known that for WOM (i.e., MLC) of $i+1$ levels, the maximum total rate over T writes is $$\log_2\binom{T+1}{i}.$$

See the Fu. By Theorem 10, we get $M_T \leq$ $$\max\left\{\sum_{t=1}^{T} R_1 \;\middle|\; (R_1, R_2, \ldots R_T) \in A_T^*\right\} = $$

$$\sum_{k=1}^{q-1} p_1 p_2 \cdots p_k (1-p_{k+1}) \log_2 \binom{T=K}{k}.$$

IV. Conclusion

This paper introduces a new data representation scheme, variable-level cells, for nonvolatile memories. By adaptively choosing the number and positions of levels in cells, higher storage rates can be achieved. The storage capacity of the VLC scheme is proved, and it is shown that it can be achieved by constant-weight codes. Codes for rewriting data are also analyzed for the VLC scheme, and both inner and outer bounds to the capacity region of rewriting are presented.

E. Patterned Cells for Phase Change Memories

I. Introduction

Phase-change memory (PCM) is an important emerging nonvolatile memory (NVM) technology that promises high performance. It uses chalcogenide glass as cells, which has two stable states: amorphous and crystalline. See G. W. Burr et al., "Phase change memory technology," *Journal of Vacuum Science and Technology*, vol. 28, no. 2, pp. 223-262, March 2010. The amorphous state has very high electrical resistance, and the crystalline state has low resistance. Intermediate states, called partially crystalline states, can also exist. High temperatures induced by electrical currents are used to switch the state of a portion of the cell, which is called a domain. By quantizing cell resistance into multiple discrete levels, one or more bits per cell can be stored. Currently, four-level cells have been developed. To improve data density, more levels are needed. See the Burr article referenced above.

The current multi-level cell (MLC) approach faces a number of challenges, including cell-programming noise, cell-level drifting, and high power consumption. See the Burr article and D. Lammers, "Resistive RAM gains ground," in *IEEE Spectrum*, pp. 14, September 2010. It is difficult to program cell levels accurately due to cell heterogeneity and noise. The cell levels can drift away significantly after they are programmed, making it even harder to control their accuracy. And the high power requirement for cell programming is hindering PCM's application in mobile devices. See Lammers, referenced above.

In this paper, we explore a new cell structure and its data representation scheme. In the new structure, called patterned cells, multiple domains per cell are used. An example is shown in FIG. 13, where two or four domains exist in a cell, whose states are independently controlled by their respective bottom electrodes. The state of a domain is switched by the current between the bottom and top electrodes. We assume that the PCM layer is sufficiently thin such that changing a domain to the crystalline state, which is called the SET operation and requires a lower temperature/current, will not affect its neighboring domains. The base of a cell is in the amorphous state, while every domain can be switched to the crystalline state. To change domains back to amorphous, called the RESET operation, we can RESET them together to avoid interference. We call this model the crystalline-domain model, because the domains have a different state from the cell base when they are crystalline. The amorphous-domain model, where the cell base is crystalline and the domains can be amorphous, can also be defined. Due to the space limitation, we omit its details, and focus on the crystalline-domain model.

Figure 13A:
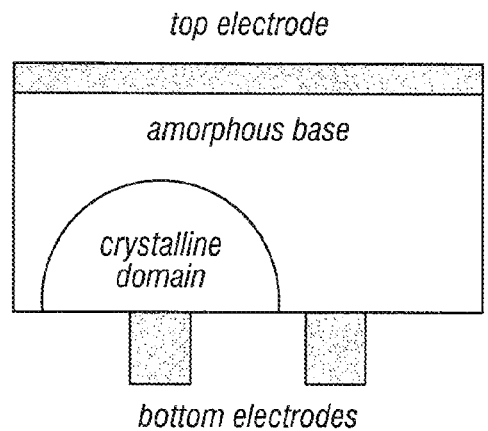
FIGS. 13($a$)-($d$) are illustrations of a patterned cell described by a crystalline-domain model.
Figure 13B:
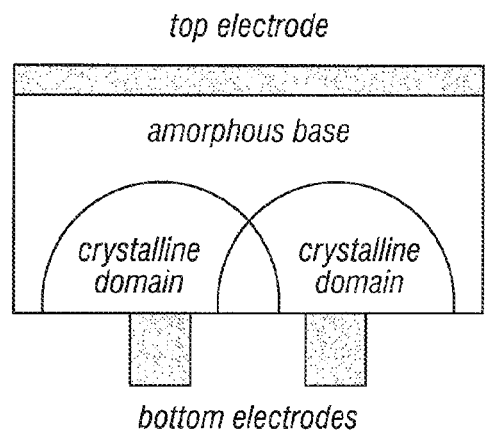
Figure 13C:
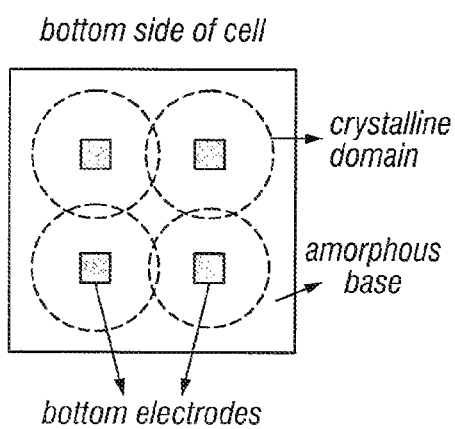
Figure 13D:
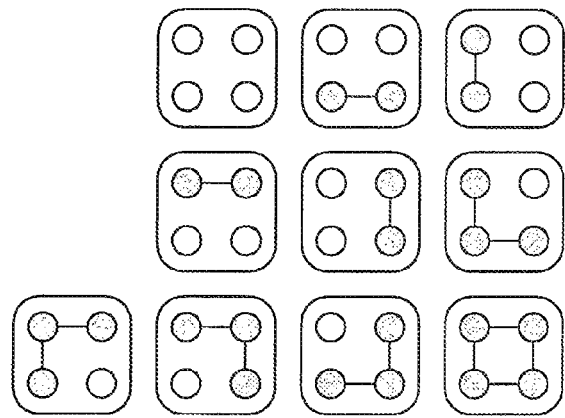

We let every domain have two basic states: on (crystalline) or off (amorphous). If two neighboring domains are both on, they overlap and become electrically connected (i.e., low resistance). The connectivity of domains can be detected by measuring the resistance between their bottom electrodes, which uses low reading voltage and does not change the state of the domains. We use the connectivity patterns of domains to represent data. As an example, the connectivity patterns of the four domains in FIG. 13(c) are illustrated in FIG. 13(d).

The patterned cell is a new approach to store data using the internal structure of domains in PCM cells. The two basic states of its domains may eliminate the high precision and power requirements imposed by programming cell levels. The data representation scheme is a new type of code defined based on graph connectivity. In this paper, we explore this new scheme, analyze its storage capacity, and study its error-correction capability and the construction of error-control codes.

The rest of the paper is organized as follows. In Section II, we study the storage capacity of patterned cell. In Section III, we study error correction and detection for patterned cell. In Section IV, we present concluding remarks.

II. Storage Capacity of Patterned Cell

In this section, we present the graph model for connectivity-based data representation. Then we analyze the storage capacity of domains that form one or two dimensional arrays.

A. Graph Model for Connectivity-Based Data Representation

Let $G=(V, E)$ be a connected undirected graph, whose vertices V represent the domains in a cell. An edge $(u,v)$ exists if the two domains are adjacent (which means they overlap if they are both on). Let $S: V \to \{0,1\}$ denote the states of vertices: $\forall v \in V$, $S(v)=1$ if v is on, and $S(v)=0$ if v is off. Denote the $|V|$ vertices by $v_1, v_2, \ldots, v_{|V|}$. We call $(S(v_1), S(v_2), \ldots, S(v_{|V|}))$ a configuration of G. Let $\overline{U}=\{0,1\}^{|V|}$ denote the set of all configurations. Since in the crystalline-domain model, the purpose of making a domain crystalline is to connect it to at least one crystalline neighbor, we focus on configurations denoted by U that satisfy this property: "For any $v \in V$ that is on, at least one of its neighbors is also on." That is, $U=\{(S(v_1), S(v_2), \ldots, S(v_{|v|})) \in \overline{U} \forall 1 \leq i \leq |V|, \text{ if } S(v_i)=1, \text{ then } \exists v_j \in V \text{ such that } (v_i,v_j) \in E \text{ and } S(v_j)=1\}$. We call U the set of valid configurations.

Let $C: V \times V \to \{0,1\}$ denote the connectivity between vertices: "$\forall w_1 \neq w_2 \in V$, $C(w_1,w_2)=1$ if there exists a sequence of vertices $(w_1=u_1, u_2, \ldots, u_k=w_2)$ such that $(u_i, u_{i+1}) \in E$ and $S(u_i)=S(u_{i+1})=1$ for $i=1, 2, \ldots, k-1$; otherwise, $C(w_1,w_1)=0$. And for any $w \in V$, we set $C(w,w)=1$ by default." Two vertices $w_1, w_2$ are connected if $C(wi,w2)=1$. The vector $(C(v_1,v_1), C(v_1, v_2), \ldots, C(v_1, v|V|); C(v_2, v_1), C(v_2, v_2), \ldots, C(v_2, v|V|); \ldots; C(v|V|, v_1), C(v|V|, v2), \ldots, C(v|V|,v|V|))$ is called the connectivity pattern of G. Clearly, not all vectors in $\{0,1\}^{|V| \times |V|}$ are connectivity patterns that correspond to valid configurations (or even just configurations). So to be specific, let if $f: U \to \{0,1\}^{|V| \times |V|}$ be the function that maps a valid configuration to its connectivity pattern. Let $C=\{f(\overline{u}) | \overline{u} \in U\}$, and we call C the set of valid connectivity patterns.

Lemma 1. The mapping $f: U \to C$ is a bijection.

Proof:

Given a connectivity pattern $\overline{c} \in C$, we see that a vertex $v \in V$ is on if and only if it is connected to at least one neighbor. So the configuration is determined by $\overline{c}$.

A PCM can read the connectivity pattern. We store data by mapping elements in C to symbols. The rate of graph G is $$\log_2 |C|^{\frac{1}{|V|}} = \log_2 |U|^{\frac{1}{|V|}}$$

bits per vertex (i.e., domain).

B. Capacity of One-Dimensional Array

It is not difficult to compute the rate of G when |V| is small. In this paper, we focus on large |V| (especially for $|V|\to\infty$), which corresponds to using numerous domains in a large PCM layer. Let $n=|V|$ and define $N(n) \triangleq |C|=|U|$. We define the capacity of G as $$cap = \lim_{n\to\infty} \log_2 N \frac{(n)}{n}.$$

We first consider the case where the domains form a one-dimensional array. That is, in graph $G=(V,E)$, we have $V=\{v_1, v_2, \ldots, v_n\}$ and $E=\{(v_1,v_2),(v_2,v_3),\ldots,(v_{n-1},v_n)\}$. We denote the capacity of the one-dimensional array by $cap_{ID}$.

Theorem 2.

Let $$\lambda^* = \frac{1}{6}\left(100 + 12\times\sqrt{69}\right)^{1/3} + \frac{2}{3\left(100 + 12\times\sqrt{69}\right)^{1/3}} + \frac{2}{3} \approx 1.7549.$$

We have $cap_{1D}=\log_2 \lambda^* \approx 0.8114$.

Figure 14:
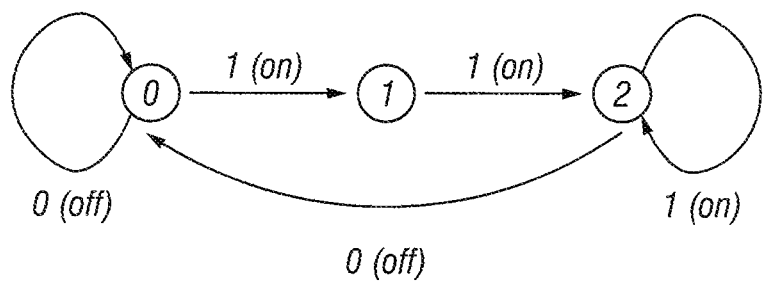
FIG. 14 is a diagram of a Shannon cover for a one-dimensional array.

Proof:

The valid configuration of a one-dimensional array is a constrained system, where every run of is (i.e., "on" vertices) needs to have length at least two. The Shannon cover of the system is shown in FIG. 14. Its adjacency matrix is $$A = \begin{pmatrix} 1 & 1 & 0 \\ 0 & 0 & 1 \\ 1 & 0 & 1 \end{pmatrix}.$$

By solving $|A-\lambda I|=-(\lambda^3-2\lambda^2+\lambda-1)=0$, we find that for matrix A, its eigenvalue of the greatest absolute value is $\lambda^*\approx 1.7549$. It is known that the capacity of the constrained system is $\log_2 \lambda^*$.

We further present the number of valid configurations for a one-dimensional array with n vertices.

Theorem 3.

Let $a_1, a_2, a_3$ be the three solutions to x for the equation $x^3-2X^2+x-I=0$, and let $\mu_1, \mu_2, \mu_3$ be the numbers that satisfy the linear equation set $$\begin{cases} \mu_1\alpha_1 + \mu_2\alpha_2 + \mu_3\alpha_3 = 1 \\ \mu_1\alpha_1^2 + \mu_2\alpha_2^2 + \mu_3\alpha_3^2 = 2 \\ \mu_1\alpha_1^3 + \mu_2\alpha_2^3 + \mu_3\alpha_3^3 = 4 \end{cases}$$

We get $$\alpha_1 = \frac{1}{6}\cdot(100+12\sqrt{69})^{\frac{1}{3}} + \frac{2}{3}\cdot(100+12\sqrt{69})^{-\frac{1}{3}} + \frac{2}{3} \approx 1.7549,$$

$$\alpha_2 = -\frac{1}{12}\cdot(100+12\sqrt{69})^{\frac{1}{3}} - \frac{1}{3}\cdot(100+12\sqrt{69})^{-\frac{1}{3}} + \frac{2}{3} +$$

$$i\cdot\left(\frac{\sqrt{3}}{12}\cdot(100+12\sqrt{69})^{\frac{1}{3}} - \frac{\sqrt{3}}{3}\cdot(100+12\sqrt{69})^{-\frac{1}{3}}\right) \approx$$

$$0.1226 + 0.7449i, \alpha_3 =$$

$$-\frac{1}{12}\cdot(100+12\sqrt{69})^{\frac{1}{3}} - \frac{1}{3}\cdot(100+12\sqrt{69})^{-\frac{1}{3}} + \frac{2}{3} -$$

$$i\cdot\left(\frac{\sqrt{3}}{12}\cdot(100+12\sqrt{69})^{\frac{1}{3}} - \frac{\sqrt{3}}{3}\cdot(100+12\sqrt{69})^{-\frac{1}{3}}\right) \approx$$

$$0.1226 - 0.7449i, \mu_i \approx 0.7221,$$

$\mu_2 \approx 0.1389 + 0.2023i$, and $\mu_3 \approx 0.1389 - 0.2023i$.

Then for a one-dimensional array with n vertices, we have $N(n)=|C|=|U|=\mu_1\alpha_1^n+\mu_2\alpha_2^n+\mu_3\alpha_3^n.$ Proof:

We derive the value of N(n) by recursive functions. Define g(n) to be the set of valid configurations for a linear array with n vertices given that the first vertex is "on". That is, $g(n)=\{(s_1, s_2, \ldots, s_n)\in|s_1=1\}$.

To compute g(n), we notice that for a valid configuration $\{(s_1, s_2, \ldots, s_n)\in U$, if $s_1=1$, then $s_2=1$ and we also have the following properties:

If $s_3=0$, the states of the last n–3 vertices can be any configuration for a one-dimensional array with n–3 vertices. There are N(n–3) such configurations.

If $s_3=1$, the states of the last n–1 vertices can be any configuration in g(n–1). There are |g(n–1)| such configurations.

So we get $|g(n)|=N(n-3)+|g(n-1)|$.

To compute N(n), we notice that for a valid configuration $(s_1, s_2, \ldots, s_n)\in U$:

If $s_1=0$, the states of the last n–1 vertices can be any configuration for a one-dimensional array with n–1 vertices. There are ./V(n–1) such configurations.

If $s_1=1$, the states of the n vertices can be any configuration in g(n). There are |g(n)| such configurations.

So we get $N(n)=N(n-1)+1|g(n)|$.

Combing the above two equations, we get the recursive function $N(n)=2N(n-1)-N(n-2)+N(n-3).$ By solving the recursive function and using the boundary conditions that N(1)=1, N(2)=2, N(3)=4, we get the conclusion.∎

C. Capacity of Two-Dimensional Arrays

Figure 15A:
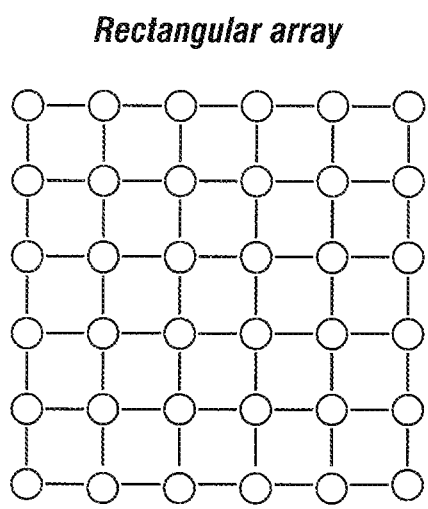
FIGS. 15($a$) and 15($b$) show two types of two-dimensional arrays, a rectangular array and a triangular array, respectively.
Figure 15B:
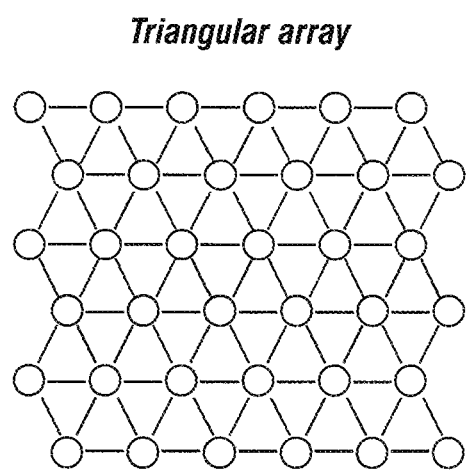

We now consider the case where the domains form a two-dimensional array. Specifically, we study two types: the rectangular array and the triangular array, illustrated in FIG. 15. We denote the capacity of the two-dimensional array by cap. It will be clear from the context which array it refers to. And we comment that compared to the rectangular array, it is possible to pack domains more compactly in the triangular array. Some existing techniques based on convex/concave programming, including tiling, bit-stuffing, and the like, can be applied here to obtain the upper and lower bounds of the capacity. We summarize the bounds in Table I listed below. It is interesting that the capacity is relatively high (close to 1) for both arrays. In the rest of this section, we will discuss the bounds in detail.

TABLE I

UPPER AND LOWER BOUNDS FOR TWO-DIMENSIONAL ARRAY'S CAPACITY.

|  | Lower (Tiling) | Lower (Bit-Stuffing) | Upper Bound |
|---|---|---|---|
| Rectangular | 0.959338 | 0.961196 | 0.963109 |
| Triangular | 0.987829 | 0.987218 | 0.990029 |

(1) Lower Bound based on Tiling: If we consider a distribution θ on the valid configuration set U, then the rate of G is $$R(\theta) = \frac{H(\theta)}{n}.$$

So another expression for capacity is $$cap = \max_{\theta} \lim_{n \to \infty} R(\theta).$$

For any distribution θ, $\lim_{n \to \infty} R(\theta)$ is a lower bound for cap. Different ways of constructing θ lead us to different methods.

In A. Sharov and R. M. Roth, "Two-Dimensional constrained coding based on tiling", *IEEE Transactions on Information Theory*, vol. 56, no. 4, pp. 1800-1807, 2010, tiling was proposed as a variable-length encoding technique for two-dimensional (2-D) constraints, such as runlength-limited (RLL) constraints and no isolated bits (n.i.b.) constraints. The idea of tiling is that we can divide all the 2-D plane using shifted copies of two certain shapes, referred as 'W' and 'B' tiles. Here, we say that a set of vertices A is a shift or shifted copy of another set B if and only if their vertices are one-to-one mapped and the position movement (vector) between each vertex in A and its corresponding vertex in B is fixed. For these two types of tiles—'W' tiles and 'B' tiles—they have the following properties:

1) The 'W' tiles are freely configurable. That means given any configuration for all the 'W' tiles, we can always find a configuration for all the 'B' tiles such that they satisfy the 2-D constraints.
2) Given any configuration for all the 'W' tiles, the configurations for the 'B' tiles are independent with each other.

According to these properties, we can first set 'W' tiles independently based on a predetermined distribution n, and then configure the 'B' tiles uniformly and independently (given the 'W' tiles). Finally, the maximal information rate $\max_\pi R(\pi)$ is a lower bound of the array's capacity.

As discussed previously, our constraint for a valid configuration is that each "on" vertex has at least one "on" neighbor. For the rectangular/triangular arrays, we can use the tiling schemes in FIG. 16.

According to Theorem 3.1 in A. Sharov and R. M. Roth, "Two-Dimensional constrained coding based on tiling", *IEEE Transactions on Information Theory*, vol. 56, no. 4, pp. 1800-1807, 2010, we have $$cap \geq \max_\pi R(\pi) = \max_\pi H(\pi) + \frac{\sum_\phi P_\pi(\phi)|S(\phi)|}{|W|+|B|}.$$

Figure 16:
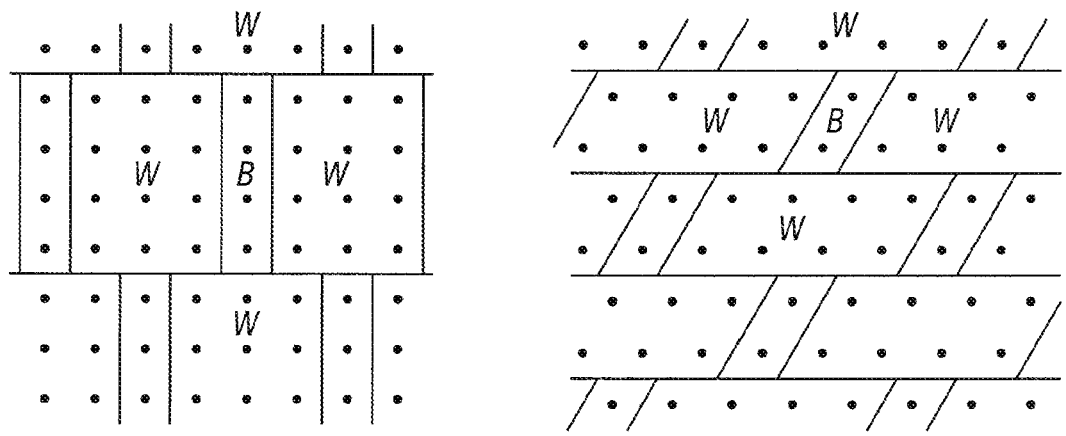
FIG. 16 illustrates tiling schemes for the rectangular array (left side) and the triangular arrays (right side), respectively, of FIGS. 15($a$) and 15($b$).

Here, |W| (or |B| is the size of each 'W' ('B') tile, e.g., |W|=12 in the left-side tiling of FIG. 16 and |B|=2 in the right-side tiling of FIG. 4; H(π) is the entropy corresponding to distribution π; φ is the configuration of the 'W' blocks around a 'B' block (four blocks in FIG. 16), whose distribution is a function of π, denoted as $P_\pi(\phi)$; |S(φ)| is the number of available distinct configurations for a 'B' blocks given the 'W' blocks around it. Based on this formula, we are able to get the lower bounds in the first column of Table I using convex programming with linear constraints.

(2) Lower Bound based on Bit-Stuffing: Another way to obtain the lower bounds for the capacities of 2-D constraint codes is based on bit-stuffing I. Tal and R. M. Roth, "Bounds on the rate of 2-D bit-stuffing encoders", IEEE Trans, on Information Theory vol. 56, no. 6, pp 2561-2567, 2010. In bit-stuffing, let ∂ denote the vertices near the left and top boundaries, called boundary vertices. Assume we know the state configuration of ∂; then we can program the remaining vertices one by one such that the ith vertex depends on a set of programmed vertices near it, denoted by $D_i$. In this scheme, for different i,j we have that the set $D_i \cup i$ is a shift of the set $D_j \cup j$, and for all i, the conditional distribution $P(x_i|x(D_i))$ is fixed, denoted by γ, where $x(D_i)$ is the configuration of $D_i$.

Let θ denote the probability distribution of the configuration on all the vertices V, and let δ denote the probability distribution of the configuration on the boundary islands ∂. Then we see that θ is uniquely determined by δ and the conditional distribution γ. It is not hard to prove that for any conditional distribution γ, when the 2-D array is infinitely large, there exists a distribution δ such that θ is stationary. That means for any subset A ⊂ V and its arbitrary shift σ(A) ⊂ V, A and σ(A) have the same configuration distribution, namely, $$P\theta(x(A)=a)=P\theta(x(\sigma(A))=a)$$

for any state configuration a. Note that this equation is true only when the block is infinity large; otherwise, θ is quasi-stationary. See Tal referenced above.

Given this stationary distribution θ, we would like to calculate the relative entropy $R_i$ of the ith vertex given the states of the vertices programmed before it. Here the ith vertex is not a boundary vertex. Assume the state distribution on Di is φ; then according to the definition of bit-stuffing $$R_i = \sum_{y \in \{0,1\}, z \in \{0,1\}^{|D_i|}} \phi(z) H(\gamma(y \mid z))$$

where $|D_i|$ is the same for different i, so we can also write it as |D|. It is not easy to get the exact value of $R_i$ because φ is unknown (it depends on γ) and there are too many constraints to guarantee that θ is stationary. By relaxing the constraints, we get a set of distributions on $D_i$, denoted as {φ'}, such that θ is stationary near the ith vertex (limited in a fixed area T near the ith vertex). Therefore, $$R_i \geq \min_{\phi'} \sum_{y \in \{0,1\}, z \in \{0,1\}^{|D|}} \phi'(z) H(\gamma(y \mid z))$$

such that (1) the configuration distribution on T is stationary, and (2) given some z ∈ $\{0,1\}^{|D|}$, we have γ(0|z)=0 to guarantee that each "on" vertex has at least one "on" neighbor.

Since the inequality above holds for all the vertices except the boundary vertices, a lower bound of the capacity can be written as $$\max_{\gamma} \min_{\phi'} \sum_{z} \phi'(z) H(\gamma(y \mid z))$$

under the constraints. For more discussions, please see the Tal article referenced above.

Figure 17:
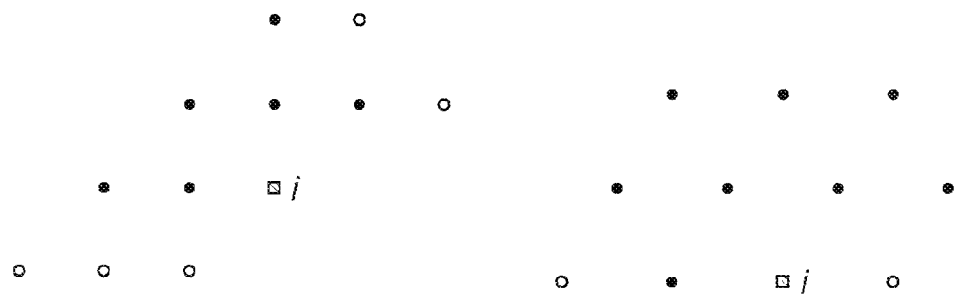
FIG. 17 illustrates bit-stuffing schemes for the rectangular array (left side) and triangular array (right side), respectively, of FIGS. 15($a$) and 15($b$).

FIG. 17 shows the bit-stuffing schemes that we use to calculate the lower bounds of the 2-D arrays' capacities. In this figure, the vertex i is marked as a gray square; $D_i$ is indicated by the black vertices that the vertex i depends on; the stationary constraint is applied to the region T that includes all the vertices plotted. Based on these schemes, we get the lower bounds for the capacities, which are given in the second column in Table I.

(1) Upper Bound based on Convex Programming: In I. Tal and R. M. Roth, "Convex programming upper bounds on the capacity of 2-D constraints", *IEEE Transactions on Information Theory* vol. 57, no. 1, pp 381-391, 2011, convex programming was used as a method for calculating an upper bound on the capacity of 2-D constraints. The idea is based on the observations that there exists an optimal distribution $\theta^*$ such that $\theta^*$ is stationary and symmetric when the array is sufficiently large. The stationary property implies that for any set of vertices A,—let $\sigma(A)$ be an arbitrary shift of A,—A and $\sigma(A)$ have the same state (configuration) distribution. The symmetric property depends on the type of the array. For a rectangular array, if two sets of vertices A and B are reflection symmetric about a horizontal/vertical line or a 45-degree line, then they have the same state (configuration) distribution. Note that the reflection symmetry about a 45-degree line is also called transposition invariance in Tal and Roth referenced immediately above. For a triangular array, there are more symmetries: if two sets of vertices A and B are reflection symmetric about a horizontal/vertical line or a 30/60-degree line, then they have the same state (configuration) distribution.

Figure 18:
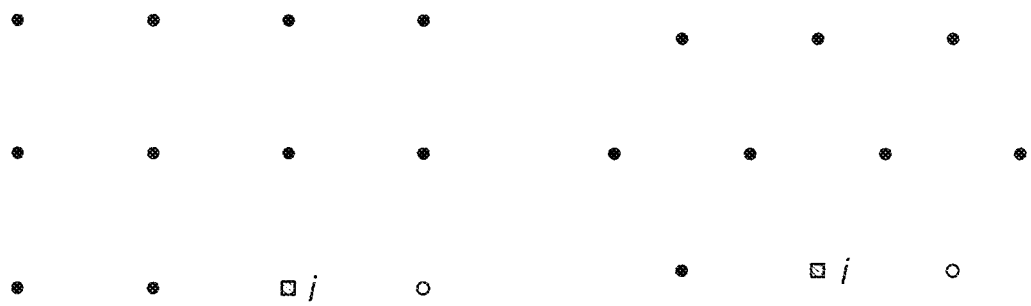
FIG. 18 illustrates schemes for calculating upper bounds of the capacities for the rectangular array (left side) and triangular array (right side), respectively, of FIGS. 15($a$) and 15($b$).

Now let us consider the distribution over a small region T for both arrays, as shown in FIG. 18. For example, in the rectangular array, assume the distribution on T (the 12 vertices) is $\phi$; then given the first ten vertices, the relative entropy of the next vertex is a function of $\phi$, denoted by $R(\phi)$. Let's index all the vertices by 1, 2, 3, n from left to right and then from top to bottom and let $R_i = H(x_i | x_i, x_2, \ldots x_{i-1})$.

It is easy to see that if a vertex i is not on the boundary, then $$R_i \leq H(x_i | \{x_1, x_2, \ldots, x_{i-1}\} \cap T) = R(\phi).$$

That implies that $R(\phi)$ is an upper bound for $$cap = \lim_{n \to \infty} \max_{\theta} \sum_{i=1}^{n} \frac{R_i}{n}$$

So our work is to maximize $R(\phi)$ such that $\phi$ is stationary and symmetric on T. Thus we get the upper bounds for the capacity of the rectangular array in Table I. The same method also applies to the triangular array.

III. Error Correction and Detection

Figure 19A:
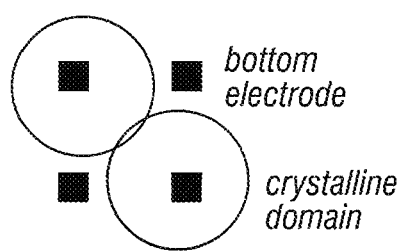
FIGS. 19($a$) and 19($b$) show error models, for 19($a$) when two diagonal domains overlap, and 19($b$) for overreach error.
Figure 19B:
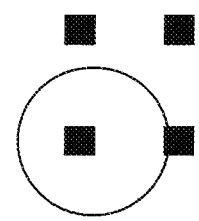

In this section, we study error correction/detection for patterned cells. We focus on one-dimensional arrays and two-dimensional rectangular arrays. When programming domains, a common error is to make a domain too large such that it changes the connectivity pattern unintentionally. Two types of such errors are shown in FIG. 19, where in (a) two diagonal "on" domains overlap, and in (b) an "on" domain touches its neighboring "off" domain's bottom electrode. It can be proved that the former type of errors can always be corrected, because the two concerned domains' states can be correctly determined by checking if they are connected to one of their four neighbors. So in this paper, we focus on the latter type of error, which is important and less trivial. We call the latter error an overreach error, which happens only between an "on" vertex and a neighboring "off" vertex, and the error makes them become connected. We assume that between every pair of neighboring "on" and "off" vertices, the overreach error happens independently with probability $p_e$. Given $p_e$, we define the capacity as the maximum number of bits that can be stored per vertex such that the data can be decoded correctly with high probability (which approaches one as the array's size approaches infinity).

A. One-Dimensional Array

Let $G=(V, E)$ be a one-dimensional array of n vertices: $v_1, v_2, \ldots, v_n$. When $n \to \infty$ and given the overreach error probability $p_e$, let $cap_1(p_e)$ denote its capacity.

Theorem 4.

For one-dimensional array, $cap_1(p_e) \geq$ $$\max\left\{0.5, \max_{x \in [0, 0.4]} x(1 - H(p_e)) + \frac{2-x}{4} H\left(\frac{4x}{2-x}\right)\right\}$$

Proof:

We prove the theorem constructively by presenting error-correcting codes for one-dimensional arrays.

To see that $cap_1(p_e) \geq 0.5$, consider n to be even. Partition the n vertices into pairs: $(v_1, v_2), (v_3, v_4), \ldots, (v_{n-1}, v_n)$. Store one bit in every pair $(v_{2i-1}, v_{2i})$ (for $i=1, 2, \ldots,$ $$\frac{n}{2})$$

this way: if the bit is 0, set both vertices as "off"; if the bit is 1, set both vertices as "on". Clearly, the code can correct all overreach errors. And its rate is 0.5 bit per vertex. So $cap_1(p_e) \geq 0.5$. In the following, we need to prove that $$cap_1(p_e) \geq \max_{x \in [0, 0.4]} x(1 - H(p_e)) + \frac{2-x}{4} H\left(\frac{4x}{2-x}\right).$$

Given a valid configuration $\bar{s} = (s_1, s_2, \ldots, s_n) \in U \subseteq \{0, 1\}^n$ a 1-run (respectively, 0-run) is a maximal segment in the vectors $\bar{s}$ whose elements are all 1s (respectively, all 0s). Let m be a positive integer. Define $U_{m,1} \subseteq U$ to be the set of valid configurations that satisfy the following constraints: "The configuration has exactly m+1 1-runs and 0-runs in total. Every 1-run or 0-run has at least two elements. The first run (i.e., the left-most run) is a 1-run." Define $U_{m,0}$ in the same way except that a configuration in $U_{m,0}$ starts with a 0-run (instead of a 1-run). The analysis below is very similar for both $U_{m,1}$ and $U_{m,0}$. So to be succinct, we sometimes only present the analysis for $u_{m,1}$.

For a configuration $\bar{s} = (s_1, s_2, \ldots, s_n)$ in $U_{m,1}$ (or $U_{m,0}$) let $L_1, L_2, \ldots, L_{m+1}$ denote the lengths of its m+1 1-runs and 0-runs. (Clearly, $\Sigma_{i=1}^{m+1} L_i = n$.) We define the signature of $\bar{s}$, denoted by sig($\bar{s}$), as sig($\bar{s}$)=($L_1$ mod 2, $\Sigma_{i=1}^{2} L_i$ mod 2, $\Sigma_{i=1}^{3} L_i$ mod 2, ..., $\Sigma_{i=1}^{m} L_i$ mod 2).

sig($\bar{s}$) is a binary vector of length m.

Given a binary vector $\bar{d}=(d_1 d_2, \ldots, d_m)$, we define its difference vector $\Delta(\bar{d})$ as $$\Delta(\bar{d})=(d_1, d_2+d_1 \bmod 2, d_3+d_2 \bmod 2, \ldots, d_m+d_{m-1} \bmod 2).$$

$\Delta(\bar{d})$ is also a binary vector of length m. Given any binary vector $\bar{y}$, let $w(\bar{y})$ denote its Hamming weight.

We first prove the following property: ●

Property ♣: Let $\bar{d}=(d_1, d_2, \ldots, d_m)$ be a binary vector of length m. Let $n \geq 2m+w(\Delta(\bar{d}))+2$, and let $n-w(\Delta(\bar{d}))$ be even. Then we have $$|\{\bar{s} \in U_{m,1} \mid sig(\bar{s}) = \bar{d}\}| = |\{\bar{s} \in U_{m,0} \mid sig(\bar{s}) = \bar{d}\}| = \frac{\frac{n-w(\Delta(\bar{d}))}{2}}{m} - 1.$$

Due to the symmetry between $U_{m,1}$ and $U_{m,0}$ (just replace 1-runs with 0-runs and vice versa), we have $|\{\bar{s} \in U_{m,1} | sig(\bar{s}) = \bar{d}\}| = |\{\bar{s} \in U_{m,0} | sig(\bar{s}) = \bar{d}\}|$. So we just need to show that $$|\{\bar{s} \in U_{m,1} \mid sig(\bar{s}) = \bar{d}\}| = \frac{\frac{n-w(\Delta(\bar{d}))}{2}}{m} - 1.$$

To prove that, consider a configuration $\bar{s}=(s_1, s_2, \ldots, s_n) \in U_{m,1}$ whose signature $sig(\bar{s})=\bar{d}$. $L_1, L_2, \ldots, L_{m+1}$ denote its m+1 1-runs and 0-runs, from left to right. It is not hard to see that if the ith element in the vector $\Delta(\bar{d})$ is 0, then $L_1 \geq 2$ and $L_1$ is even; if the ith element in $\Delta(\bar{d})$ is 1, then $L_1 \geq 3$ and $L_1$ is odd.

Let us obtain a new binary vector $$\bar{y} = (y_1, y_2, \ldots, y_{\frac{n-w(\Delta(\bar{d}))}{2}})$$

this way: first, for $i=1, 2, \ldots, m$, if the ith element in $\Delta(\bar{d})$ is 1, decrease the length of the ith 1-run or 0-run in $\bar{s}$ by one; then, for $i=1, 2, \ldots, m+1$, reduce the length of the ith 1-run or 0-run by half. Clearly, $\bar{y}$ is a binary vector of length $$\frac{n-w(\Delta(\bar{d}))}{2}$$

that m+1 1-runs and 0-runs (without any limitation on the lengths of the 1-runs and 0-runs), and there is a one-to-one mapping between configurations in $U_{m,1}$ of signature $\bar{d}$ and such $\bar{y}$ vectors. There are $$\frac{\frac{n-w(\Delta(\bar{d}))}{2}}{m}$$

such vectors $\bar{y}$. So Property ♣ is true.

We now consider $m \to \infty$, let m be even, and let $\epsilon$ be an arbitrarily small constant. Define $\bar{K} \triangleq \{\bar{y} \in \{0,1\}^m | w(\Delta(\bar{y}))=\frac{m}{2}\}$. Note that for a random binary vector $\bar{y} \in \{0,1\}^m$ whose elements are i.i.d. and equally likely to be 0 and 1, with high probability we have $$\lim_{m \to \infty} \frac{w(\Delta(\bar{y}))}{m} = \frac{1}{2}.$$

So $\lim_{m \to \infty}$ is even $$\frac{\log_2 |\bar{K}|}{m} = 1.$$

Let $K \subset \bar{K}$ be a set whose elements are uniformly randomly chosen from $\bar{K}$ such that $\lim_{m \to \infty}$ is even $$\frac{\log_2 |K|}{m} = 1 - H(p_e) - \epsilon.$$

It is not difficult to see that K is an error-correcting code of length m (with $m \to \infty$), rate $1-H(p_e)$ (we make $\epsilon \to 0$) that can correct binary symmetric errors with error probability $p_e$.

Let $$n \geq \frac{5}{2}m + 2,$$

and let $$n - \frac{m}{2}$$

be even. By Property ♣, for every vector $\bar{y} \in f$, there are $$\frac{n}{2} - \frac{m}{4} - 1 \atop m$$

configurations in $U_{m,1}$ (and in $U_{m,0}$) of signature $\bar{y}$. Define $x \triangleq \frac{m}{n}$, $D_1 \triangleq \{\bar{s} \in U_{m,1} | \exists \bar{y} \in K\}$ such that $sig(\bar{s})=\bar{y}\}$, and $D_0 \triangleq \{\bar{s} \in U_{m,0} | \exists \bar{y} \in K\}$ such that $sig(\bar{s})=\bar{y}\}$. Since $$\lim_{n,m \to \infty} \frac{\log_2 \binom{\frac{n}{2} - \frac{m}{4} - 1}{m}}{\frac{n}{2} - \frac{m}{4} - 1} = \lim_{n,m \to \infty} H(p_e) H\left(\frac{m}{\frac{n}{2} - \frac{m}{4} - 1}\right)$$

$$= H\left(\frac{4x}{2-x}\right),$$

we can encode $$1 + \lfloor nx(1 - H(p_e) - \epsilon) \rfloor + \left\lfloor n\left(\frac{1}{2} - \frac{x}{4} - \frac{1}{n}\right) H\left(\frac{4x}{2-x}\right) \right\rfloor$$

information bits into the configurations in $D_1 \cup D_0$ as follows:
1) If the 1st information bit is 1, the codeword will be a configuration in $U_{m,1}$; otherwise, it will be a configuration in $U_{m,0}$.

2) The next $\lfloor nx(1-H(p_e)-\epsilon) \rfloor$ information bits are mapped to one of the vectors in K, where the mapping is injective. Let $\bar{y}$ denote the corresponding vector in K.
3) The last $$\left\lfloor n\left(\frac{1}{2}-\frac{x}{4}-\frac{1}{n}\right)H\left(\frac{4x}{2-x}\right)\right\rfloor$$

information bits are mapping to one of the configurations in $U_{m,1}$ or $U_{m,0}$ (depending on if the 1st information bit is 1 or 0) whose signatures equal $\bar{y}$, where the mapping is injective.

We now show how to decode the codewords (i.e., configurations) in $D_1 \cup D_0$ to recover the information bits, where the codewords can contain overreach errors (with error probability $P_e$).

Let $\bar{s}=(s_1, s_2, \ldots, s_n) \in D_1 \cup D_0$ denote the codeword (configuration) that is stored, and let b denote the information bits encoded into codeword $\bar{s}$. After $\bar{s}$ is stored, overreach errors happen and change the connectivity pattern. Let $\bar{B}=(B_1, B_2, \ldots, B_n) \in \{0,1,2,3\}^n$ denote the connectivity pattern detected after overreach errors happen, defined as follows: "For $i=1, 2, \ldots, n$, if the ith vertex is not connected to any other vertex, then $B_i=0$; if $i>1$ and it is only connected to the $(i-1)$th vertex, then $B_i=1$; if $i<n$ and it is only connected to the $(i+1)$th vertex, then $=2$; if $1<i<n$ and it is connected to both the $(i-1)$th vertex and the $(i+1)$th vertex, then $B_i=3$." For example, if $\bar{s}=(1,1,0,0,1,1,1,0,0,1,1)$ and two overreach errors connect the 2nd vertex with the 3rd vertex and connect the 4th vertex with the 5th vertex, then $\bar{B}=(2,3,1,2,3,3,1,0,0,2,1)$. Based on $\bar{B}$, the decoding algorithm will recover both the codeword $\bar{s}$ and the information bits $\bar{b}$.

Since every 1-run or 0-run in $\bar{s}$ has length at least two, if $B_1=0$, then $\bar{s} \in U_{m,0}$ and the first information bit in $\bar{b}$ is 0; otherwise, $\bar{s} \in U_{m,1}$ the first information bit in $\bar{b}$ is 1. In the following, without loss of generality (w.l.o.g.), we assume that $B_1=1$ and present the corresponding decoding method.

Let $\bar{L}_1, \bar{L}_2, \ldots \bar{L}_{m+1}$ be our estimation of $\bar{L}_1, \bar{L}_2, \ldots \bar{L}_{m+1}$ (the lengths of 1-runs and 0-runs in $\bar{s}$), computed as follows. For $i=1, 2, \ldots,$ $$\frac{m}{2}+1,$$

let ... be the length of the ith segment in $\bar{B}$ of the form $(2, 3, \ldots, 3, 1)$, and let $a_{2i-1}, a'_{2i-i} \in \{1, 2, \ldots, n\}$ denote the first and last positions of that segment, respectively. That is, the segment begins with 2, ends with 1, and has zero or more 3's in between. For $i=1, 2, \ldots,$ $$\frac{m}{2},$$

let $L_{2i}=\alpha_{2i+1}-\alpha_{2i-1}-1$. Define the signature of $\bar{B}$ as $sig(B)=(n_1, n_2, \ldots, n_m) \triangleq L_1 \mod 2), \Sigma_{i=1}^2 \bar{L}_i \mod 2 \Sigma_{i=1}^3 \bar{L}_i \mod 2, \ldots \Sigma_{i=1}^m \bar{L}_i \mod 2)$. Let $sig(\bar{s})=(\mu_1, \mu_2, \ldots, \mu_m)$ be the signature of $\bar{s}$. It is not hard to see we have the following property:

For $i=1, 3, 5, \ldots, m-1$, if there is no overreach error between the last vertex of the ith run (which is a 1-run) and the first vertex of the $(i+1)$th run (which is a 0-run) in $\bar{s}$, then $\Sigma_{j=1}^i \bar{L}_j = \Sigma_{j=1}^i L_j$ and therefore $n_i = \mu_i$; otherwise, $\Sigma_{j=1}^i \bar{L}_j = \Sigma_{j=1}^i L_j - 1$ and therefore $n_i = \mu_i + 1 \mod 2$.

For $i=2, 4, 6, \ldots, m$, if there is no overreach error between the last vertex of the ith run (which is a 0-run) and the first vertex of the $(i+1)$th run (which is a 1-run) in $\bar{s}$, then $\Sigma_{j=1}^i \bar{L}_j = \Sigma_{j=1}^i L_j$ and therefore $n_i = \mu_i$; otherwise, $\Sigma_{j=1}^i \bar{L}_j = \Sigma_{j=1}^i L_j - 1$ and therefore $n_i = \mu_i + 1 \mod 2$.

So the overreach errors have a one-to-one mapping to the 1's in the vector $(\mu_1+n_1 \mod 2, \mu_2+n_2 \mod 2, \ldots, \mu_m+n_m \mod 2)$. Since $sig(\bar{s})$ is a codeword in K, and the code K can correct binary symmetric errors with error probability $p_e$, we can decode $sig(\bar{B})$ to recover the correct value of $sig(\bar{s})$ (with probability one as $m \to \infty$). Then based on $sig(\bar{s})$ and $\bar{L}_1, \ldots \bar{L}_m$, we can recover the values of $L_1, \ldots, L_m$ and therefore the codeword (configuration) $\bar{s} \in U_{m,1}$. Based on $sig(\bar{s}) \in K$, we can recover the $\lfloor nx(1-H(p_e)-\epsilon) \rfloor$ information bits that follow the first information bit. Then based on $\bar{s}$, we can recover the last $$\left\lfloor n\left(\frac{1}{2}-\frac{x}{4}-\frac{1}{n}\right)H\left(\frac{4x}{2-x}\right)\right\rfloor$$

information bits. That concludes the decoding algorithm.

We now analyze the rate R of the above code. When n, $m \to \infty$, we have $$R = x(1-H(p_e)) + \frac{2-x}{4}H\left(\frac{4x}{2-x}\right).$$

Since $$n \geq \frac{5}{2}m+2, x = \frac{m}{n} \in [0, 0.4].$$

That leads to the conclusion.

It is noticeable that the overreach error is a type of asymmetric error for graph connectivity. In the following, we present an error-detecting code that can detect all overreach errors. Its underlying idea is closely related to the well-known Berger code discussed in J. M. Berger, "A note on an error detection code for asymmetric channels," *Information and Control*, vol. 4, pp. 68-73, March 1961, for asymmetric errors.

The framework of the code construction is as follows. We use m information vertices and r redundant vertices, which form a one-dimensional array of $n=m+r$ vertices. The redundant vertices follow the information vertices in the array. Let the constants $\alpha_1, \alpha_2, \alpha_3, \mu_1, \mu_2, \mu_3$ be as specified in Theorem 3. The m information vertices store data from an alphabet of size $N(m)=\mu_1\alpha_1^m+\mu_2\alpha_2^m+\mu_3\alpha_3^m$. When m is large, the m information vertices store about $0.8114m$ information bits, and $r \approx \log_{1.7549} m$. (So the redundancy is logarithmic in the codeword length.) Let x denote the number of connected components in the subgraph induced by the information vertices, which overreach errors can only decrease. We use the redundant vertices to record the value of x, and the mapping is constructed such that the recorded value can only be increased by overreach errors. This way, the mismatch between information vertices and redundant vertices can be used to detect all overreach errors.

We now present details of the code. Let $v_1, v_2, \text{---}, v_m$ denote the m information vertices. A connected component among them is a maximal segment of vertices $(v_i, V_{i+1}, \ldots, v_j)$ such that their corresponding bottom electrodes are all electrically connected. Let x and x denote the number of connected components among the information vertices before and after overreach errors happen (if any), respectively. Clearly, $1 \leq x \leq X \leq m$. If there is one or more overreach errors among the m information vertices, then $X<x$: otherwise, $x=X$.

Let $u_1, u_2, \ldots, u_r$ denote the r redundant vertices, and let $U_r \subseteq \{0,1\}^r$ denote the set of valid configurations for them. For every $\bar{s}=(s_1, s_2, \ldots, s_r) \in U_r$, let $B(\bar{s}) \triangleq \Sigma_{i=1}^r s_i \cdot 2^{r-i}$. We have $|U_r|=N(r)=\mu_1\alpha_1^r+\mu_2\alpha_2^r+\mu_3\alpha_3^r$. We build a bijective function $F: U_r \to \{1, 2, \ldots, N(r)\}$ with the following property:

For any two valid configurations $\bar{s}, \bar{t} \in U_r$, $F(\bar{s}) < F(\bar{t})$ if and only if $B(\bar{s}) < B(\bar{t})$.

That is, the function F sorts the valid configurations of the redundant vertices based on their lexical order. Let $F^{-1}$ denote the inverse function of F. We will introduce the specific computations used by F and $T_{-1}$ at the end of the subsection.

We now introduce how to encode the value of x using the configuration of the r redundant vertices. We choose r to be the smallest positive integer such that $N(r) \geq m$. Let $\bar{\theta} \in U_r$ denote the programmed configuration of the r redundant vertices. Then as the encoding algorithm, we choose $\bar{\theta}$ such that $F(\bar{\theta})=X$.

We introduce details of the decoding (i.e., error detection) process. Let $\bar{x}=(x_1, x_2, \ldots, x_m) \in \{0,1\}^m$ denote our estimated configuration of the information vertices, defined as follows:

We measure the connectivity between the information vertices. For $i=1, 2, \ldots, m$, if vertex $v_i$ is connected to at least one other information vertex, then $x_i=1$; otherwise, $x_i=0$.

Similarly, let $\bar{y}(y_1, y_2, \ldots, y_r) \{0,1\}^r$ denote our estimated configuration of the redundant vertices, defined as follows:

We measure the connectivity between the redundant vertices. For $i=1, 2, \ldots, r$, if vertex $u_i$ is connected to at least one other redundant vertex, then $y_i=1$; otherwise, $v_i=0$.

The decoding (i.e., error detection) algorithm is as follows:
1) Let $\bar{x}$ be the number of connected components among the information vertices derived from (i.e., computed based on) the estimated configuration $\bar{x}$. If $F(\bar{y}) > \bar{x}$, then either one or more overreach errors exist.
2) If the two vertices $v_m$ and $u_1$ are connected but either "$x_m=1, y_1=0$" or "$x_m=0, y_1=1$", then there is an overreach error between $v_m$ and $u_1$.

Theorem 5.

The above code can detect all overreach errors.

Proof:

If overreach errors happen among the information vertices, we will have $\bar{X} < X$. Let overreach errors happen among the redundant vertices, some "off" redundant vertices will be incorrectly estimated to be "on", so we will have $F(\bar{y}) > F(\bar{\theta})$. Since $F(\bar{\theta})=X$ if overreach errors happen among information vertices or among redundant vertices (or both), we will have $F(\bar{y}) > \bar{X}$, and the errors will be detected.

The only remaining case is that no overreach error happens among the information vertices or among the redundant vertices, however there is an overreach error between the two segments (namely, between $v_m$ and $u_1$). In this case, $x_m$ and $y_1$ will be the true states of the two vertices, and the second step of the algorithm will detect the error. ∎

Theorem 6.

Let $m \geq 2$ be an integer. Let r be the smallest positive integer such that $\mu_1\alpha_1^r+\mu_2\alpha_2^r+\mu_3\alpha_3^r \geq m$. The constants $\alpha_1, \alpha_2, \alpha_3, \mu_1, \mu_2, \mu_3$ are specified in Theorem 3. Then, there is an error-detecting code of length $m+r$ and rate $$\frac{\log_2 \mu_1\alpha_1^m + \mu_2\alpha_2^m + \mu_3\alpha_3^m}{m+r}$$

bits per vertex that can detect all overreach errors. When $m \to \infty$, we have $r=\log_{\alpha_1} m \approx \log_{1.7549} m$, and the rate of the code is $cap_{1D}=\log_2 \alpha_1 \approx 0.8114$, which reaches the capacity of one-dimensional arrays.

We now introduce how the function $F: U_r \to \{1, 2, \ldots, N(r)\}$ maps configurations to integers, and how its inverse function $F^{-1}: \{1, 2, \ldots, N(r)\} \to U_r$ maps integers to configurations.

We first show that given any valid configuration $\bar{s}=(s_1, s_2, \ldots, s_r) \in U_r$, how to compute $F(\bar{s})$. If $\bar{s}=(0, 0, \ldots, 0)$, then $F(\bar{s})=1$. So in the following we assume $\bar{s} \neq (0, 0, \ldots, 0)$. Let $$i = \min\{k \in \{1, 2, \ldots, r\} | s_k = 1\}.$$

Let $j \in \{i+1, i+2, \ldots, r\}$ be defined as follows: if $s_i = s_{i+1} = \ldots = s_r = 1$, then $j = n$; otherwise, let j be the integer such that $s_i = s_{i+1} = \ldots = s_j = 1$ and $s_{j+1} = 0$. For any two configurations $\bar{t}_1, \bar{t}_2 \in U_r$, we say $\bar{t}_1$ is smaller than $\bar{t}_2$ if $F(\bar{t}_1) < F(\bar{t}_2)$. Namely, $\bar{t}_1$ is smaller than $\bar{t}_2$ if $\bar{t}_1$ is lexically smaller than $\bar{t}_2$. We have the following observation:

The smallest $N(r-i)$ configurations $(a_1, a_2, \ldots, a_r) \in U_r$ are those with $a_1 = a_2 = \ldots = a_i = 0$; the next $N(r-i-2)$ smallest configurations are those with $a_1 = \ldots = a_{i-1} = 0, a_i = a_{i+1} = 1$ and $a_{i+2} = 0$; the next $N(r-i-3)$ smallest configurations are those with $a_1 = \ldots = s_{i-1} = 0, a_i = a_{i+1} = a_{i+2} = 1$ and $a_{i+3} = 0$; and so on. Consequently, we obtain the following formula:

$$F(\bar{s}) = N(r-i) + \Sigma_{k=i+1}^{j-1} N(r-k-1) + F((0, \ldots, 0, s_{j+2}, s_{j+3}, \ldots, s_r)).$$

By default, let $N(0)=1$; and if $j \geq r-1$, let $F((0, \ldots, 0, s_{j+2}, s_{s+3}, \ldots, s_r))=1$. The above recursion can be easily used to compute $F(\bar{s})$.

Next, we show that given an integer $z \in \{1, 2, \ldots, N(r)\}$, how to compute $F^{-1}(z) = (s_1, s_2, \ldots, s_r) \in U_r$. If $z=1$, then $F^{-1}(z)=(0, \ldots, 0)$. In the following we assume $z > 1$. Let i be the greatest integer such that $N(r-i+1) \geq z$; then we have $$s_1 = s_2 = \ldots = s_{i-1} = 0 \text{ and } s_i = 1.$$

Let j be the smallest integer such that $$N(r-i) + \sum_{k=i+1}^{j} N(r-k-1) \geq z.$$

(By default, let $N(0)=N(-1)=1$.) Then we have $$s_i = s_{i+1} = \ldots = s_j = 1.$$

If $j=n-1$, we have $s_n=0$. If $j \leq n-2$, we have $s_{j+1}=0$ and $(0, \ldots, 0, s_{j+2}, s_{j+3}, \ldots, s_r) = F^{-1}(z-N(r-1)-\Sigma_{k=i+1}^{j-1} N(r-k-1))$.

With the above recursion, we can easily determine $F^{-1}(z)$.

B. Two-Dimensional Array

We now focus on the capacity of two-dimensional rectangular array when i.i.d. overreach errors happen with probability $p_e$ between neighboring on and off vertices. Let $G=(V, E)$ be an $m \times m$ two-dimensional rectangular array, where $m \to \infty$. Let $cap_2(p_e)$ denote its capacity.

Theorem 7. For any $q \in [0, 1/2]$, let $n(q, p_e) = (1-q^3)(p_e+(1-p_e)(1-(1-(1-q)P_e)^3))$. Then for two-dimensional rectangular array, $$cap_2(p_e) \geq \frac{4}{5} \max_{q \in [0, 0.5]} H(1-q+qn(q, p_e)) - qH(n(q, p_e)).$$

Proof:

The proof is constructive. First, consider a tile of five vertices as in FIG. 20 (a), where the five vertices are denoted by a, b, c, d, e, respectively. Let $$q \in \left[0, \frac{1}{2}\right]$$

be a parameter we will optimize. Let the on/off states of the four vertices a, b, c, d be i.i.d., where a (or b, c, d) is on with probability 1−q and off with probability q. We set the state of vertex e—the vertex in the middle—this way: "If a, b, c, d are all off, then e is off; otherwise, e is on." Clearly, the above approach guarantees that every on vertex has at least one neighboring vertex that is also on. Let $S(a)$, $S(b)$, $S(c)$, $S(d) \in \{0,1\}$ denote the states of the vertices a, b, c, d, respectively. We let each of the four vertices a, b, c, d store a bit, which equals $S(a)$, $S(b)$, $S(c)$, $S(d)$, respectively.

Figure 20A:
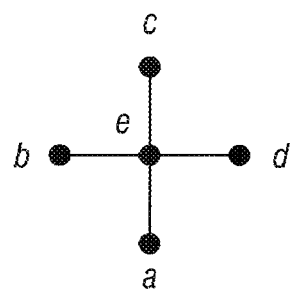
FIGS. 20($a$)-($c$) relate to tiling and coding in rectangular arrays.
Figure 20B:
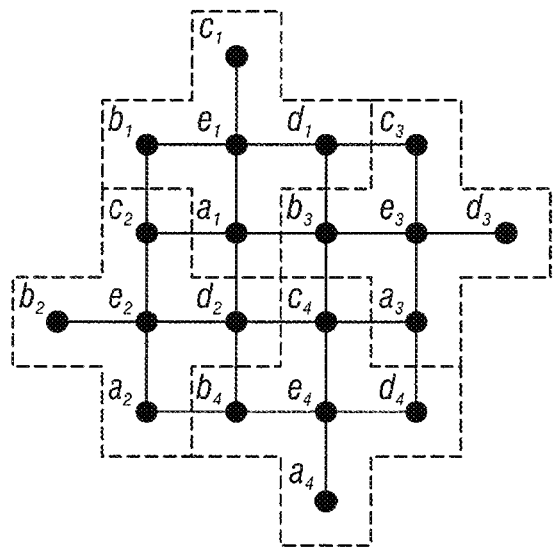
Figure 20C:
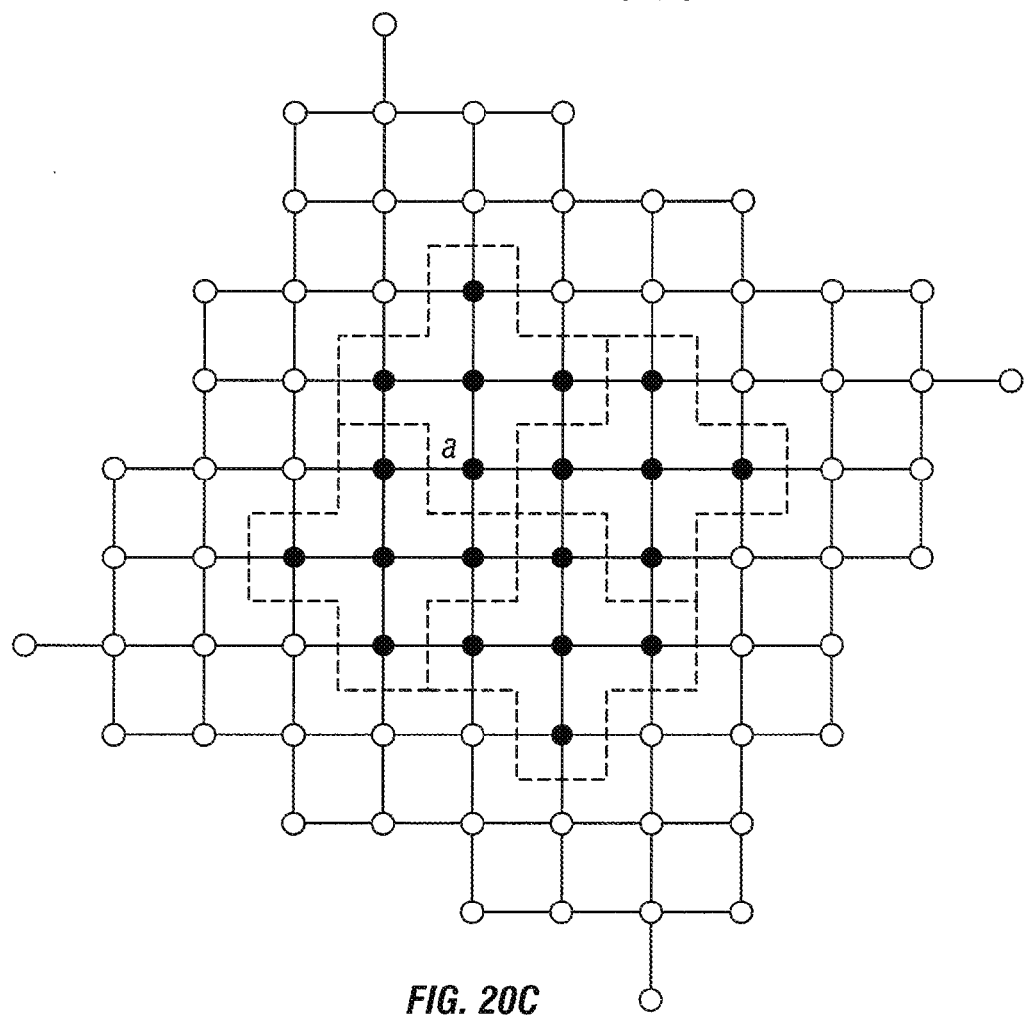

It is well known that the small tiles can be packed perfectly to fill the two-dimensional space. It is illustrated in FIG. 20 (b). To differentiate the vertices in different small tiles, for i=1, 2, 3 . . . , the five vertices in the ith are are denoted by $a_i$, $b_i$, $c_i$, $d_i$, $e_i$, respectively.

Let us focus on the stored bit $S(a_1)$. (The analysis applies to the other stored bits in the same way.) After overreach errors happen, let $S'(a_1)$ denote our estimation of the bit $S(a_1)$. We determine $S'(a_1)$ this way:

If vertex $a_1$ is connected to $e_l$ (the central vertex in its small tile), then $S'(a_1)=1$; otherwise, $S'(a_1)=0$.

We can see that if $S(a_1)=1$, there will be no decoding error for this bit because we will have $S'(a_1)=1$. If $S(a_1)=0$, with a certain probability P (which we will analyze later) the overreach errors will make $S'(a_1)$ be 1. So the channel for the stored bits is asymmetric, similar to the Z-channel but not memoryless. We first show the following property:

Property ♣ :

$$P \leq (1-q^3)(p_e+(1-p_e)(1-(1-q)p_e)^3)).$$

To prove Property ♣, assume $S(a_1)=0$. If $S'(a_1)=1$, then $S(e_1)=1$, and there must be an overreach error that connects $a_l$ to a neighbor that is on. We have $\Pr\{S(e_1)=1|S(a_1)=0\}=\Pr\{S(b_1)=1, \text{ or } S(c_1)=1, \text{ or } S(d_1)=1\}=1-q^3$. Given $S(e_1)=1$, the probability that an overreach error connects $a_1$ to either $e_1$ or one of the on vertices among $\{b_3, c_2, d_2\}$—see FIG. 20 (b)—equals $p_e+(1-p_e)(1-(1-q)p_e)^3)$. So Property ♣ is true.

We now use N small tiles to form a large tile, and use infinitely many such large tiles to fill the two-dimensional space with the following special arrangement: These large tiles are separated by buffer vertices that are always set as off, and for any two vertices in two different large tiles, there are at least two consecutive buffer vertices separating them on any path between them. We illustrate it in FIG. 8 (c), where one large tile and the buffer vertices surrounding it are shown. Note that for easy illustration, in the figure a large tile consists of only N=4 small tiles. However, for our proof on capacity, we will make N sufficiently large such that the buffer vertices have a negligible impact on the capacity. Clearly, due to the existence buffer vertices and the fact that overreach errors cannot affect two vertices separated by two consecutive off vertices, the decoding errors for two different large tiles are independent.

Build a sub-channel as follows: Take one vertex from each large tile (which is either an $a_i$, $b_i$, $c_i$, or $d_i$ vertex, but not an $e_i$ vertex), and let each vertex store one bit as described before (i.e., the vertex stores bit 0 with probability q and bit 1 with probability 1−q). For example, we can take the vertex a shown in FIG. 8 (c) in each large tile. Overall, the large tiles contain 4N such sub-channels. Consider one sub-channel, whose capacity is clearly a lower bound of the capacity of the aggregation of the 4N sub-channels. The errors for the different vertices in the sub-channel are independent and asymmetric (like a Z-channel); and due to the existence of the buffer vertices, the probability that its stored bit 0 is correctly decoded as 1 (i.e., the cross-over probability in the Z-channel) is at most P. Let $X, Y \in \{0,1\}$ denote the input and output bit of the channel, respectively. Then we get $$\begin{aligned} I(X:Y) &= H(Y) - H(Y|X) \\ &= H(Y) - \sum_{x \in \{0,1\}} \Pr\{X=x\}H(Y|X=x) \\ &\geq H(1-q+qP) - qH(P) \\ &\geq H(1-q+qn(q, p_e)) - qH(n(q, P_e)) \end{aligned}$$

Since in every small tile, four out of the five vertices are used to store bits, we get the conclusion.

It can be seen that when $p_e \to 0$, the low bound in the above theorem approaches 4/5.

IV. Conclusion

In this paper, a new cell structure named patterned cell is introduced for phase-change memories. It has a new data representation scheme based on graph connectivity. The storage capacity of the scheme is analyzed, and its error correction and detection performance is studied.

F. Supplemental Considerations

This section has three parts. In the first part, we consider the VLC scheme, and discuss how to differentiate the different discrete levels. In the second part, we consider the case where VLC is used for rewriting data, and clarify some details. In the third part, we describe the common features of VLC and patterned cells.

I. Part One

In this part, we consider the VLC scheme, and discuss how to differentiate the different discrete levels.

In the VLC scheme, there are various ways to different levels, namely, to tell which cell belongs to which level. We introduce two such methods, which are based on clustering and reference voltages, respectively.

A. Clustering-Based Method

Figure 21:
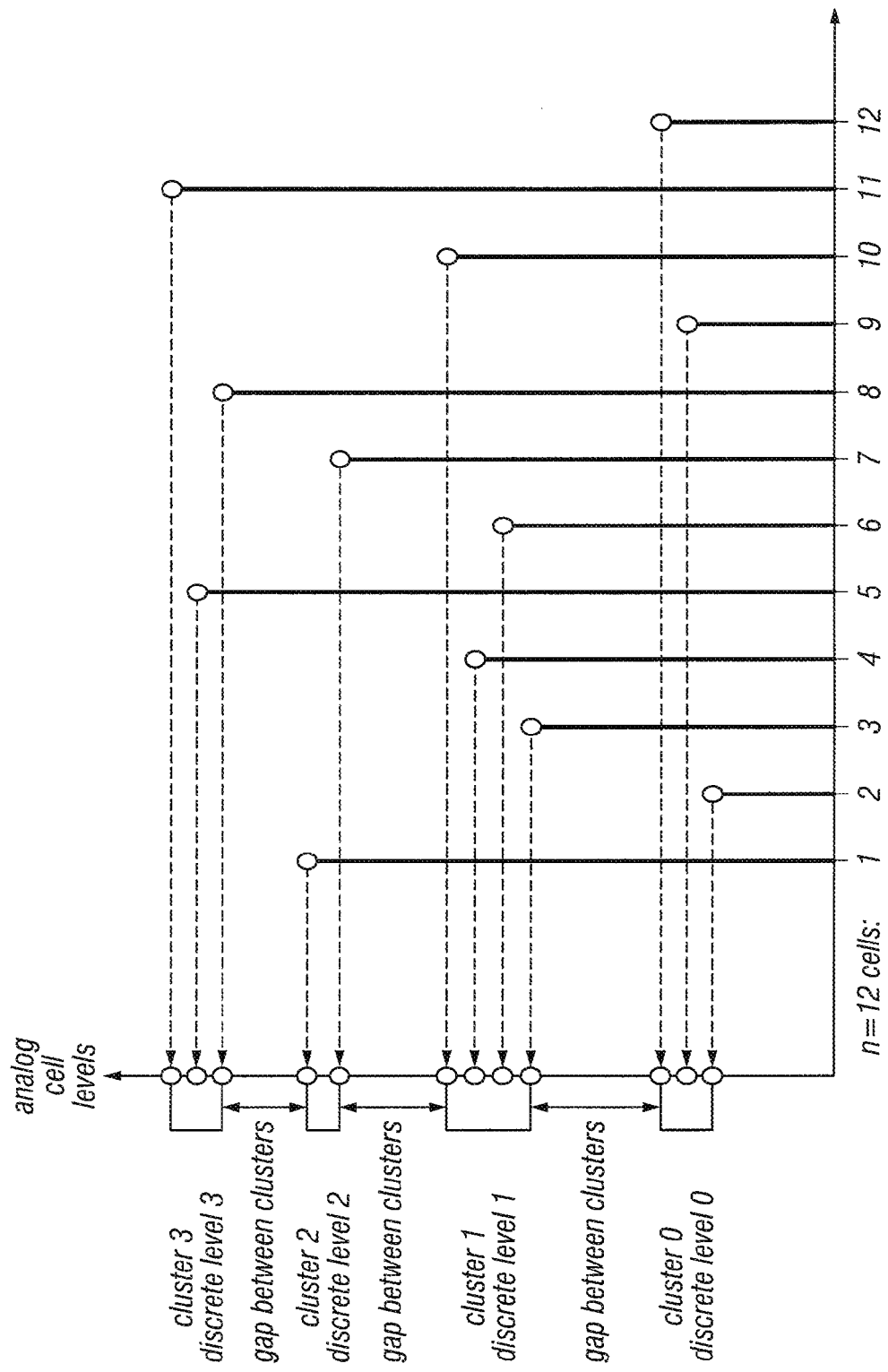
FIG. 21 is an illustration of determining cell levels using the clustering method where n=12 cells.

In the clustering-based method, we see the range of analog levels as a one-dimensional space (i.e., a line), where the analog level of a cell is a point in the line. The basic idea is that nearby points are considered to form a cluster—which are considered to be in the same discrete level—while faraway points are considered to be in different clusters and therefore are in different discrete levels. See FIG. 21 for an illustration. Here the twelve cells' analog levels form four clusters, and therefore they belong to four discrete levels. FIG. 21 shows there are n=12 cells, whose analog levels are denoted by the height of the twelve vertical bars, respectively. They form four clusters (discrete levels).

There are many ways to define clusters. One of the simplest approaches is to define a parameter $\Delta > 0$, and require the gap between two adjacent clusters to be at least $\Delta$; at the same time, we require that for analog levels in the same cluster, the gap between two adjacent analog levels be smaller than $\Delta$. It is simple to determine which cell belongs to which cluster by measuring the analog levels.

B. Reference-Voltage Based Method

Figure 22:
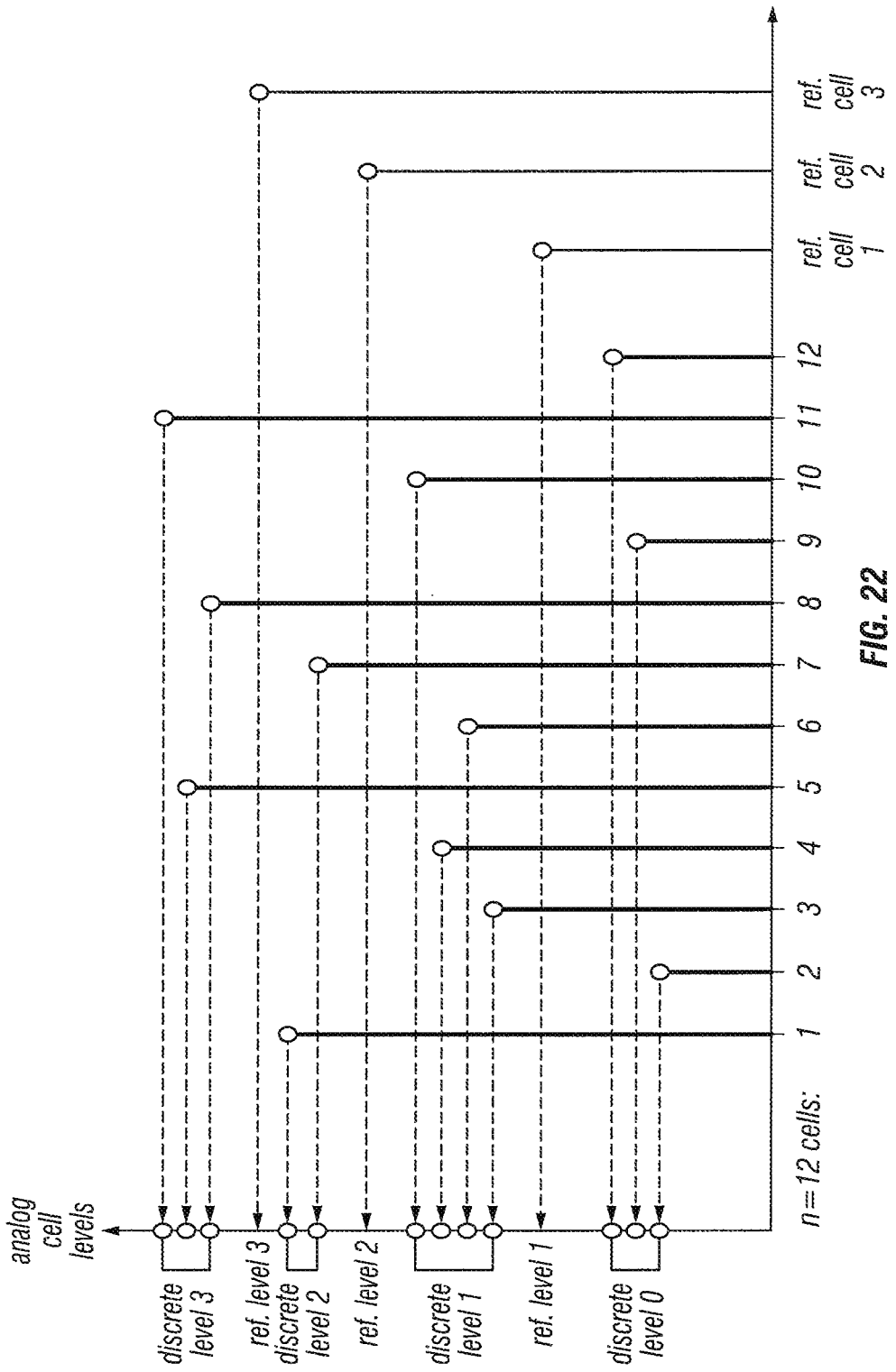
FIG. 22 is an illustration of determining cell levels using the clustering method with reference levels, where n=12 cells.

In the reference-voltage based method, between every two adjacent discrete levels, a reference level is used to separate them. More specifically, consider level i and level i+1 to be two adjacent discrete levels, where level i is lower than level i+1. After level i is programmed, a reference cell can be programmed such that its analog level is above level i. Then level i+1 can be programmed to be higher than the reference level. With the reference level (i.e., the level of the reference cell), the memory can differentiate level i and level i+1 by comparing them to the reference level. See FIG. 22 for an illustration. FIG. 22 shows there are n=12 cells, whose analog levels are denoted by the height of the 12 vertical bars, respectively. They form 4 clusters (discrete levels). The reference levels of three reference cells are used to separate the 4 discrete levels.

C. How to Program Levels from Low to High

Figure 23A:
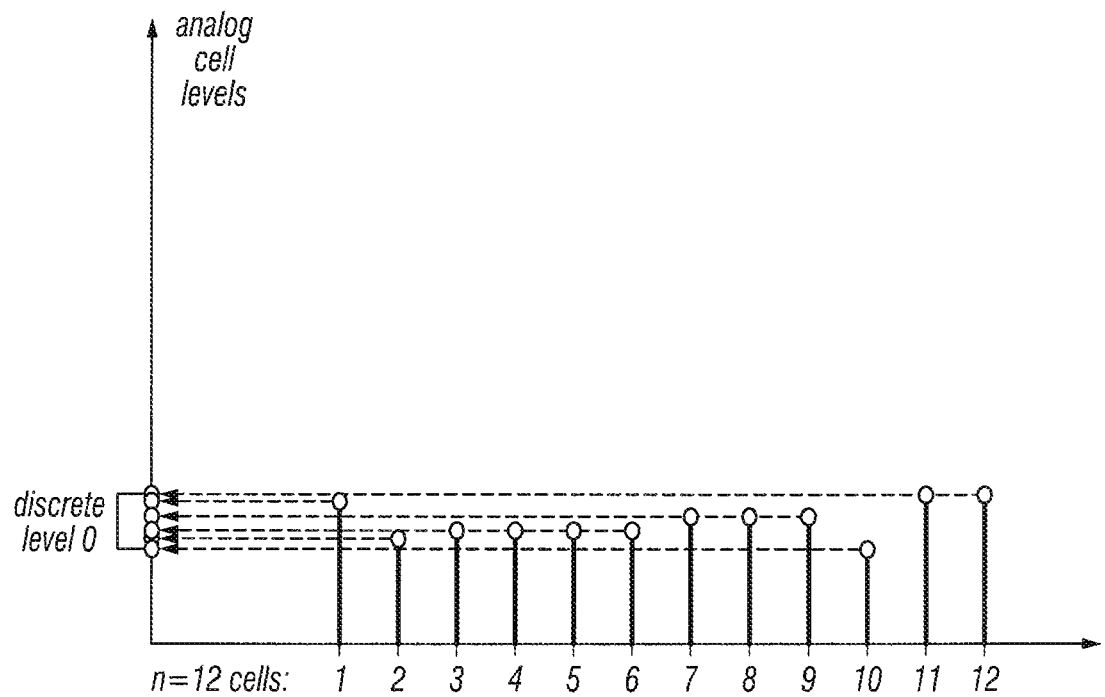
FIGS. 23($a$)-($d$) relate to programming the cell levels in a VLC, where FIG. 23($a$) shows all cells at level 0 before programming, FIG. 23($b$) shows program level 1, FIG. 23($c$) shows program level 2, and FIG. 23($d$) shows program level 3.
Figure 23B:
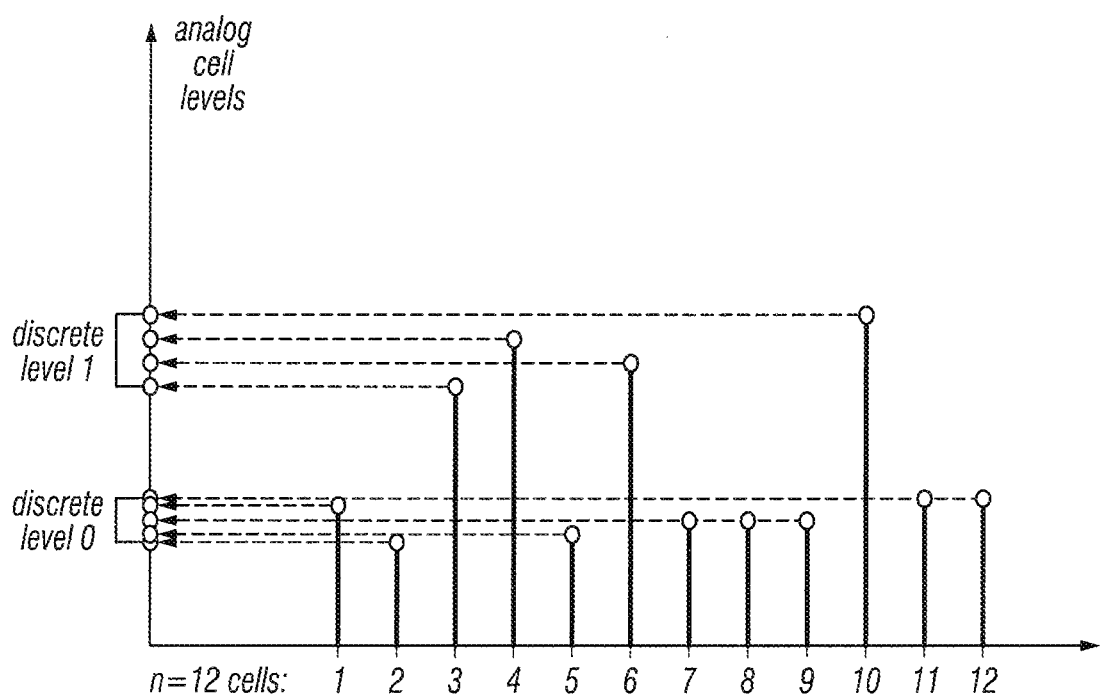
Figure 23C:
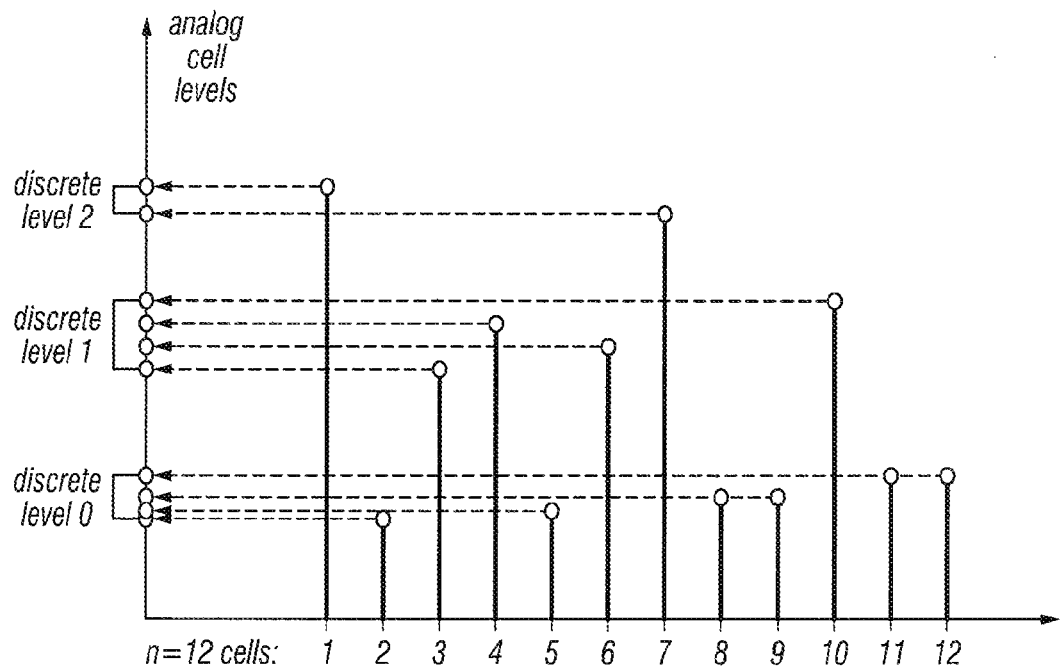
Figure 23D:
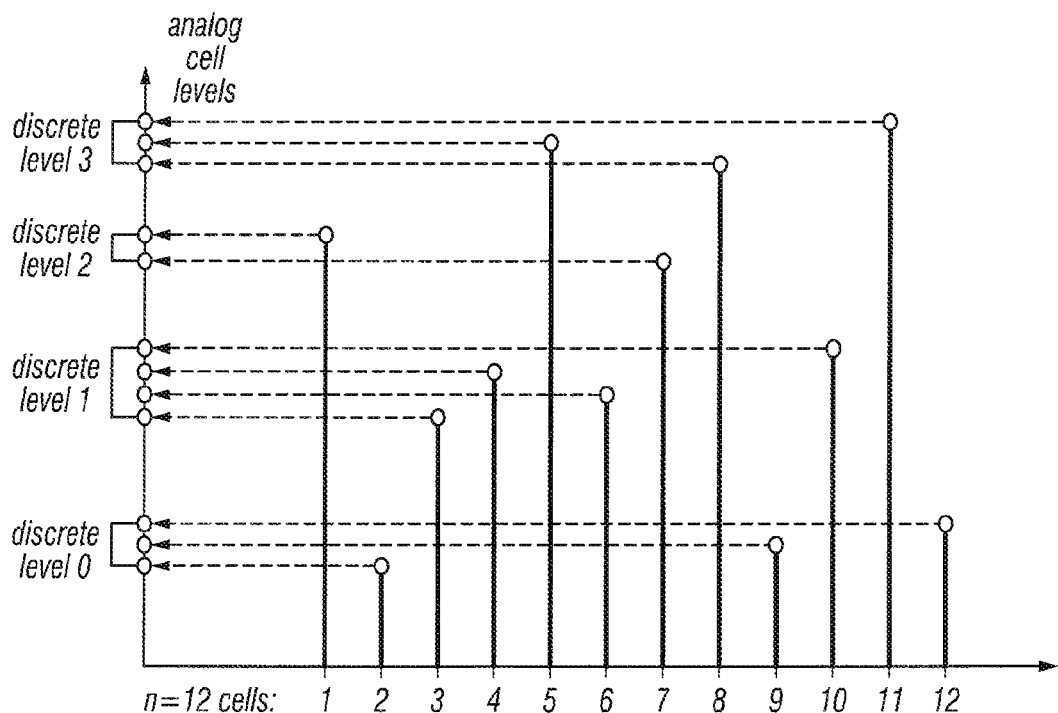

Finally, we describe a method for programming VLCs. (It will be shown later that patterned cells can be programmed in a similar way.) When we program levels, we can program them from low to high, so that there is no risk of overshooting. See FIG. 23 for an illustration, where we program four levels. FIGS. 23(a)-(d) relate to programming the levels of VLC from low to high. FIG. 23(a) shows all the cells are in level 0 before programming. FIG. 23(b) shows program level 1. FIG. 23(c) shows program level 2. FIG. 23(d) shows program level 3. Note that initially (that is, before programming starts), all the cells are in the lowest level.

Note that the levels in VLC are very flexible, because they need not have fixed positions. So if we need to adjust the positions of some existing level (such as for rewriting data or for removing noise from levels), we can adjust the other levels accordingly easily.

II. Part Two

In this part, we consider the case where VLC is used for rewriting data, and clarify some details. Note that by rewriting data, we mean to change the stored data by only increasing the cell levels (without decreasing cell levels). This way, no block erasure is need. Also note that when rewriting data, new (that is, higher) cell levels can be created. The cell levels created at different times are all considered to be levels of the VLC scheme.

A. How to Store One Bit Per Cell, and Rewrite Data

We first introduce the following concept: How to store one bit per cell in the VLC scheme, and how to rewrite the stored data. The result here can be extended to storing multiple bits per cell, or storing one or more bits in a cell group that contains multiple cells. We also note that the data stored in the cells can be any type of data, including error—correcting codes.

Consider n VLC cells with levels 0, 1, 2, 3 .... For i∈{1, 2, ..., n}, let L ∈ {0, 1, 2, 3 ...} denote the discrete level of the ith cell. We let the bit stored in the ith cell be $L_i$, mod 2. Alternatively, we can also let the bit stored in the ith cell be ($L_i$+1) mod 2, which is very similar.

Given a binary word $(x_1, x_2, \ldots, x_n) \in \{0,1\}^n$, we can store it in the n cells this way: For i=1, 2, ..., n, if $x_i$=0, then we let $L_i$=0; if $x_i$=1, then we let $L_i$=1.

After that, we can rewrite data (that is, modify data) by only increasing cell levels (thus avoiding the expensive block erasure operation). Suppose that the word currently stored in the cells is $(y_1, y_2, \ldots, y_n) \in \{0,1\}^n$, and we want to change it to $(z_1, z_2, \ldots, z_n) \in \{0,1\}^n$.

We can rewrite data this way: For i=1, 2, ..., n, if $z_i$=$y_i$, we do not change $L_i$; if $z_i \neq y_i$, we increase $L_i$ by 1.

Figure 24A:
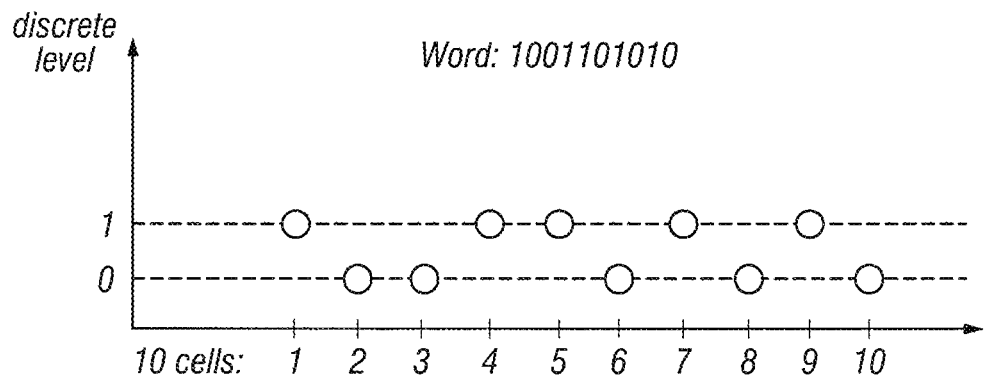
FIGS. 24($a$)-($c$) relate to changing a stored word in a VLC scheme by increasing cell levels.
Figure 24B:
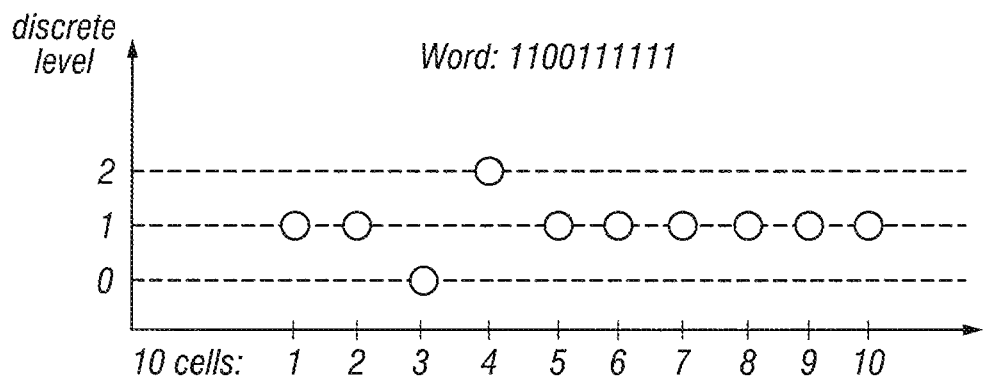
Figure 24C:
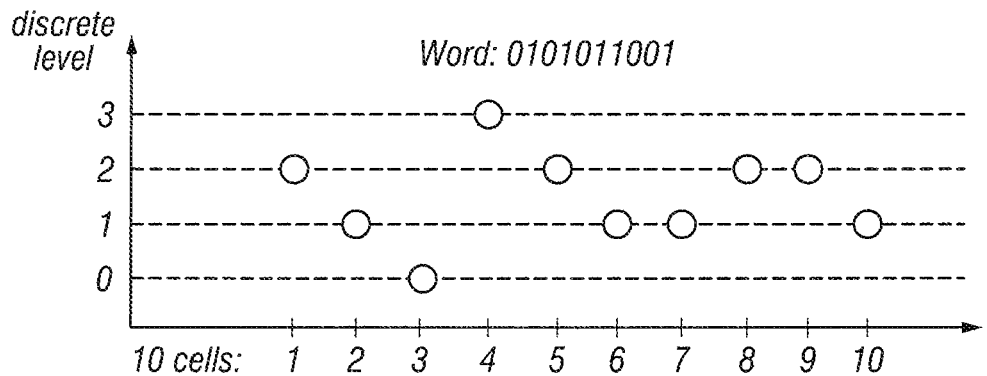

We illustrate the rewriting process in FIG. 24(a)-(c). FIG. 24(a)-(c) shows how to change the stored word from (1001101010) to (1100111111), then to (0101011001), by increasing cell levels and creating new levels in the VLC scheme.

We can see that with more and more rewrites, the cells occupy more and more levels.

B. Physically Correcting Errors

In this subsection, we introduce the following concept:
How to physically correct (negative and positive) errors using levels. By physically correct errors, we mean to change the cell level so that the data represented by the cell level returns to the correct value.

The VLC scheme provides the ability to physically correct errors. For example, consider the above 1-bit-per-cell scheme. Suppose that the stored word is an error-correcting code. Say that noise changes a cell level $L_i$ from an odd integer to an even integer. For the error-correcting code, the corresponding bit is change from 1 to 0. After detecting this error using the error-correcting capability of the error-correcting code, we can physically correct the error by increasing the cell level $L_i$ by one (thus making it an odd integer again). This approach becomes infeasible only if the cell has already reached the highest level.

C. How to Fully Use Cell Levels

In the VLC scheme, we try to program as many levels as possible. Eventually, the highest level will reach the physical limit, and no more level can be created. When we rewrite data (as introduced above), some cells will reach the highest level sooner than other cells. But this does not mean that we cannot keep rewriting data. In the following, we introduce a method that allows us to keep rewriting data even though some cells have reached the highest level.

Let the highest level be seen as an "erased state"; more specifically, we see cells in the highest level as non-existent. We use the remaining cells to store data as before. With more and more rewrites, the number of cells we can use becomes smaller and smaller, so we need to store fewer and fewer bits.

D. Storing Multiple Bits per Cell

In this subsection, we introduce the following concept:
How to store more bits (larger symbols) per cell.

The extension from storing one bit per cell to more than one bit per cell is straightforward. For example, if we store two bits per cell, then we say that the symbol stored by a cell has alphabet size 4, because it has four values: $s_0$=0, $s_1$=1, $s_2$=2, $s_3$=3. If we let every cell store a symbol of 3 values—$s_0$=0, $s_1$=1, $s_2$=2,—then we say the stored symbol has alphabet size 3.

For i=1, 2, ..., n, let $L_i$ denote the discrete level of the ith cell. If the symbol stored by a cell has alphabet size m, then we can let the symbol represented by the cell level $L_i$ be $L_i \mod m$.

To rewrite data, we can increase cell levels similarly as before.

Storing One or More Bits Per Cell Group

In this subsection, we introduce the following concept:
How to store one or more bits per cell group.

We can generalize the method introduced previously—where every cell stores one or more bits—in the following way. Partition the n cells into groups—say every group has m cells—and let every cell group store one or more bits. All that we need is a mapping from the states of the m cells in a group to the symbol they store. We show an example.

Example 1

Let m be 3, and let the discrete levels of the three cells in a group be denoted by $L_1, L_2, L_3 \in \{0, 1, 2, 3, \ldots\}$. Suppose that we store two bits in the cell group, and use the following mapping:

If $\max\{L_1, L_2, L_3\} - \min\{L_1, L_2, L_3\} \leq 1$, then define $(L'_1, L'_2, L'_3)$ as $(L'_1, L'_2, L'_3) = (L_1 - \min\{L_1, L_2, L_3\}, L_2 - \min\{L_1, L_2, L_3\}, L_3 - \min\{L_1, L_2, L_3\})$, and:

If $(L'_1, L'_2, L'_3) = (0, 0, 0)$ or $(1, 1, 1)$, the two stored bits are 00.

If $(L'_1, L'_2, L'_3) = (1, 0, 0)$ or $(0, 1, 1)$, the two stored bits are 10.

If $(L'_1, L'_2, L'_3) = (0, 1, 0)$ or $(1, 0, 1)$, the two stored bits are 11.

If $(L'_1, L'_2, L'_3) = (0, 0, 1)$ or $(1, 1, 0)$, the two stored bits are 01.

For example, if the two stored bits change as $10 \to 01 \to 11 \to 00 \to 01 \to \ldots$, then the cell levels of the cell group can change as $(1, 0, 0) \to (1, 1, 0) \to (1, 2, 1) \to (2, 2, 2) \to (2, 2, 3) \ldots$.

III. Part Three

In this part, we describe the common features of VLC and patterned cells.

A. Unified Asymmetric Model for VLC and Patterned Cell

Figures 25A, 25B, 25C:
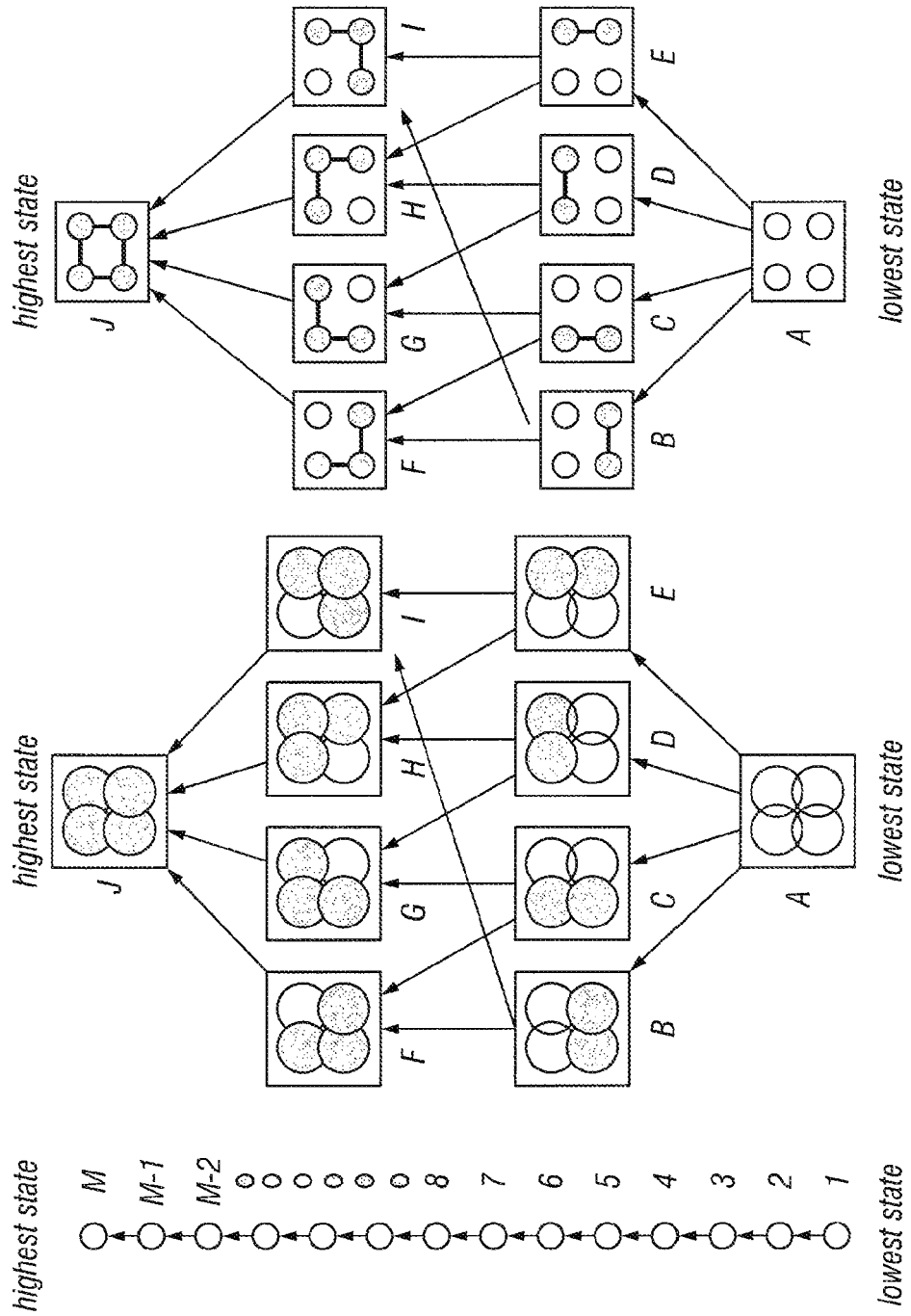
FIGS. 25($a$)-($c$) relate to the VLC scheme and the patterned cell scheme, where FIG. 25($a$) shows the VLC model where states of a cell for an acyclic graph, FIG. 25($b$) shows a model for a patterned cell with crystalline domains, and FIG. 25($c$) shows a state diagram from FIG. 25($b$) where edges represent the connectivity between two domains.

A flash memory cell has this special property: When it is programmed, its level can only be increased, unless the cell block is erased. For a conventional PCM cell, there is a similar property: When it is programmed, its level can only be increased, unless it is reset. So in a program/erase (or program/reset) cycle, we can see the states of a cell as an acyclic directed graph, where the cell can only be changed from a lower state to a higher state, but not from a higher state to a lower state. It is illustrated in FIG. 25(*a*). FIG. 25(*a*) shows the model for VLC, where the states of a cell form a directed acyclic graph. The cell can only be changed (that is, programmed) from a lower state to a higher state. Note that this graph is a discrete representation of the cell states. When M approaches infinity, the discrete representation approaches the continuous case. FIG. 25(*b*) shows the model for patterned cell with crystalline domains, where the states of a cell form a directed acyclic graph. Here in a cell, the domains form a 2×2 array. The white domains are amorphous, while the colored domains are crystalline. For patterned cells of all sizes, the states always form an directed acyclic graph because without resetting, the domains can only be changed from amorphous to crystalline. FIG. 25(*c*) shows the same state diagram as FIG. 25(*b*). Here we use edges to represent the connectivity between two domains.

A patterned PCM cell has this special property: When it is programmed, the domains can only change from amorphous to crystalline, unless the cell is reset. Therefore, we can see the states of a cell as an acyclic directed graph, where the cells can only be changed from a lower state to a higher state, but not from a higher state to a lower state. It is illustrated in FIG. 25(*b*) and FIG. 25(*c*).

B. Unified Variable-Level Programming Model

In VLC, the discrete levels we want to program for cells are labeled by level 0, level 1, level 2, . . . . We program a lower level before programming a higher level. In other words, level i+1 is programmed after level i. And the relation is as follows:

We first program level i. Say that for the cells of level i, after programming, their analog charge levels are in the range $[L_{i,low}, L_{i,high}]$. Then we program level i+1 in the following way. We want to make level i+1 have no overlap with level i, and be sufficiently separated from level i. So we can choose a parameter $\Delta$, and require that for all cells of level i+1, their analog levels should all be $L_{i,high} + \Delta$ or more.

In other words, when programming cells, overshooting errors can happen. So our method is to program a lower level before programming a higher level, and we make sure that the higher level does not overlap with the lower level in terms of their included cell states.

In patterned cells, we can also denote the discrete levels by level 0, level 1, level 2, . . . . Note that during programming, overreach error—which connects a crystalline domain to the electrode of a neighboring amorphous domain—can happen. So to program levels robustly, we can use a method that is similar to that of VLC. Namely, we program levels from low to high; and every time we program a level, we makes sure that it does not overlap with the lower levels in terms of their included cell states. We illustrate it with an example, which refers to FIG. 25(*a*)-(*c*) and FIG. 26, which shows a linear order of the states in FIG. 25(*b*) and FIG. 25(*c*).

We first note two things:
1) For nodes in an undirected acyclic graph, we can always give them a linear order, so that all the edges are from lower nodes to higher nodes. For example, for the state diagram in FIG. 25(*b*) and (*c*), we can linearly order the ten states—state A, B, . . . , J—as in FIG. 26. When we program patterned cells, we will use the states from low to high, similar to the way we program VLC.
2) When an overreach error happens, it will only change a cell from a lower state to a higher state, not from a higher state to a lower state. Note: We say that a cell state x is higher than a cell state y if we can change a cell from y to x by changing amorphous domains into crystalline domains; or in other words, by electrically connecting the electrodes in adjacent domains.

We now illustrate the robust programming of patterned cells with the following example.

Example 2

There is a set of n patterned cells, which are initially all in the state where all domains are amorphous. We need to program them to level 0, level 1, level 2, . . . . Our goal is to program as many levels as possible, and for any $1 \leq i < j$, we will program level i before we program level j (same as in VLC).

Figure 26:
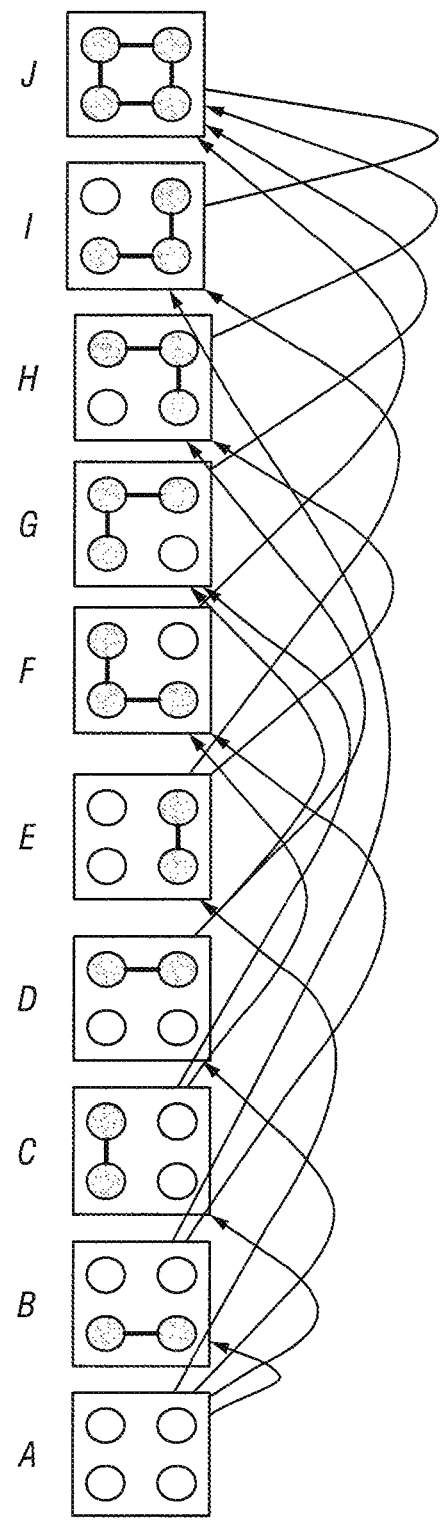
FIG. 26 shows a linear order of the states illustrated in FIGS. 25($b$) and 25($c$).

For illustration, we will consider the patterned cells to have 2×2 domain arrays, which is illustrated in FIG. 25(*b*), (*c*) and FIG. 26(*a*). We let the state A represent level 0. So initially, all cells are in level 0.

We now program level 1. To those cells that need to be in level 1, we program them to change them from state A to state B. Note that we assign level 1 to a state that is as low as possible, without overlapping with the state of level 0. If all those cells are successfully programmed to state B, then level 1 will consists of only state B; and in the next step, to program level 2, we can program cells to change them from state A (i.e., level 0) to state C, which is again the lowest state we can choose; and so on (to program level 3, 4, . . . ).

However, suppose that when we program level 1, due to overreach errors, some of the cells that should have state B actually become state F or I (which are both higher than B). In this case, we will let level 1 consists of three states: states B, F, and I. This is similar to VLC, where we let a level be the actually set of states that the cells of this level reach. Then to program level 2, we can choose state D as a state that belongs to level 2, because if we program cells to state D, even if overreach errors happen, the cells will not have those states already assigned to level 0 or level 1, namely states {A, B, F, I}. For those cells that should belong to level 2, we program them to change them from state A to state D. For illustration, again consider two possible outcomes:
- In the first possible outcome, all those cells are programmed correctly as state D, without any overreach error. We will let level 2 have a single state: state D. In the next step, we can assign state G to level 3, and start programming level 3 by changing cells from state A to state G.
- In the second possible outcome, due to overreach errors, some of those cells that should be in state D become in state G or H. In this case, we let level 2 have three states: states {D, G, H}. In the next step, we assign state J to level 3, and program level 3 by changing cells from state A to state J.

So we can see that the number of levels we program is determined adaptively based on the actual programming performance. If no error happens during programming, then every single state can be a distinct level. However, if errors happen during programming, we adaptively assign states to levels, and the number of levels that can be programmed will be less than the number of states.

The above programming method for patterned cells has two important properties:
1) The number of programmed levels is not predetermined. It is determined by the actual programming process.
2) The "positions" of the programmed levels—namely, the states that each level consists of—is not predetermined. They are determined by the actual programming process.

It can be seen that they are also the two important properties of VLC.

The above programming method can be summarized as follows:
1) Sort the cell states in the directed acyclic graph (i.e., the state diagram for cell states) as a linear array, such that every cell state can only change to higher cell states, not lower cell states.
2) Let level 0 consist of the initial state of the cells.
3) Program level 1, level 2, level 3, . . . sequentially. When programming level i, do the following:
    a) Choose a cell state s, and let S denote the set of states that cells may become when we program them to state s. Note that s is an element in the set S. Since there may be errors during programming, S may also contain elements different from s. s such that the set S does not contain any state that has been assigned to level 0, level 1, . . . , level i-1.
    b) Program cells to change them from the initial state to state s. Let P denote the actual set of states that the cells become. Clearly, P is a subset of S.
    c) Assign the set of states P to level i. That is, level i consists of the states in P.

It can be seen that the above programming method is very similar to that of VLC.

C. Unified Rewriting Model

The rewriting method for VLC can be applied in a similar way to patterned cells. For simplicity, we skip the details.

G. Physical Implementation

Figure 27:
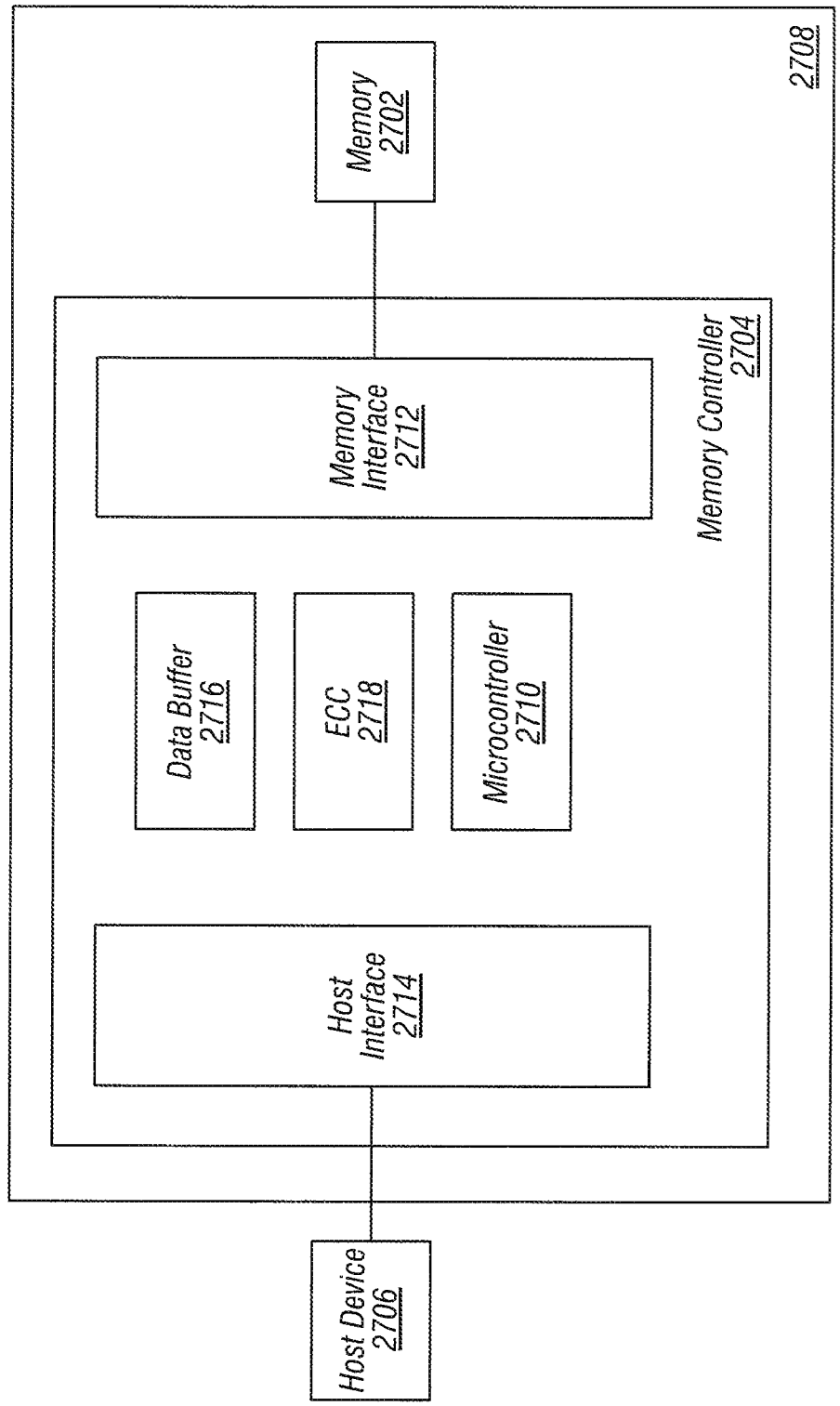
FIG. 27 is an illustration of a memory device constructed in accordance with the present invention.

FIG. 27 is an illustration of a memory device, also referred to as a data storage device, constructed in accordance with the present invention. FIG. 27 shows a memory 2702 that is accessed by a memory controller 2704 that communicates with a host device 2706. The memory 2702 is used for storing data and comprises cells that are programmed in accordance with an adaptive programming scheme as described herein. The memory may be implemented, for example, as a Flash memory having multilevel cells. The memory 2702 and memory controller 2704 together comprise a data storage device 2708 that may be external to the host device or may be integrated with the host device into a single component or system. For example, the data storage device 2708 may comprise a Flash memory device (often referred to as a "thumb drive") that communicates with a host computer 2706 via a USB connection, or the data storage device may comprise a solid state drive (SSD) that stores data for a host computer system. Alternatively, the data storage device may be integrated with a suitable host device to comprise a single system or component with adaptive programming memory, such as a smart phone, network router, MP3 player, or the like. It should be understood that, during the programming of levels described herein, the adaptive programming system (FIG. 6) takes the place of the host device 2706.

The memory controller 2704 operates under control of a microcontroller 2710, which manages communications with the memory 2702 via a memory interface 2712 and manages communications with the host device via a host interface 2714. Thus, the memory controller supervises data transfers from the host 2706 to the memory 2702 and from the memory 2702 to the host 2706. The memory controller 2704 also includes a data buffer 2716 in which data values may be temporarily stored for transmission over the data channel controller 2717 between the memory 2702 and the host 2706. The memory controller also includes an ECC block 2718 in which data for the ECC is maintained. For example, the ECC block 2718 may comprise data and program code to perform error correction operations. Such error correction operations are described, for example, in the U.S. patent application Ser. No. 12/275,190 entitled "Error Correcting Codes for Rank Modulation" by Anxiao Jiang et al. filed Nov. 20, 2008. The ECC block 2718 may contain parameters for the error correction code to be used for the memory 2702, such as programmed operations for translating between received symbols and error-corrected symbols, or the ECC block may contain lookup tables for codewords or other data, or the like. The memory controller 2704 performs the operations described above for decoding data and for encoding data.

The operations described above for programming the levels in a memory device and generating and storing a configuration data set, and for programming a data storage device, can be carried out by the operations depicted in FIGS. 7 and 8, which can be performed by the adaptive programmer system 602 (FIG. 6) and carried out by the microcontroller 2710 and associated components of the data storage device 2708. For example, in an implementation of the adaptive programming scheme in a USB thumb drive, all the components of the data storage device 2708 depicted in FIG. 27 are contained within the USB thumb drive.

Figure 28:
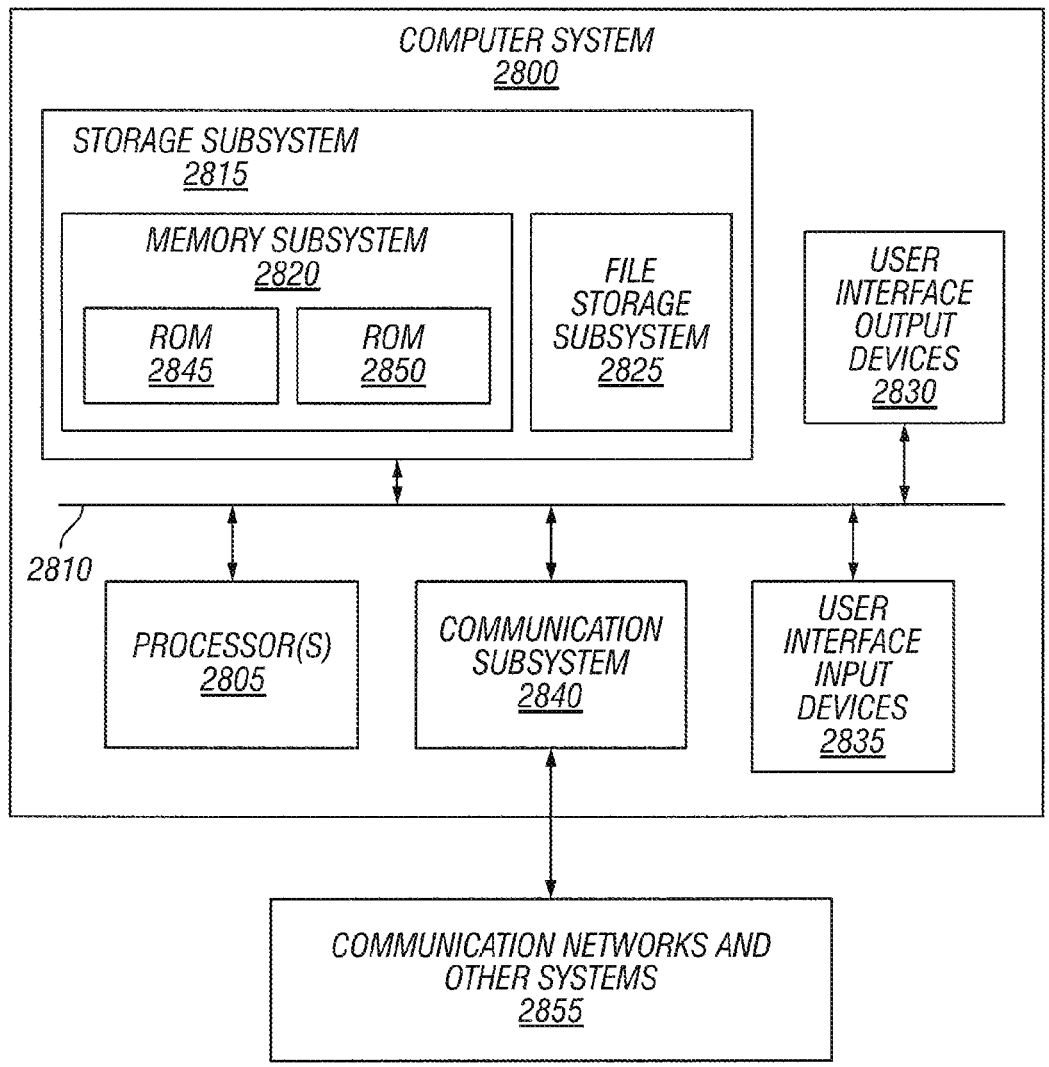
FIG. 28 is a block diagram of a computer apparatus to perform the operations of FIGS. 7 and 8, and for communicating with a memory device such as depicted in FIG. 6 and described herein.

The host device 2706 may comprise a conventional computer apparatus and, as noted above, comprises the adaptive programmer system 602 when the levels are being determined and programmed. The conventional computer apparatus also may carry out the operations of FIGS. 7 and 8 for programming. FIG. 28 is a block diagram of a computer apparatus 2800 sufficient to perform as a host device and sufficient to perform the operations of FIGS. 7 and 8.

FIG. 28 is a block diagram of a computer system 2800 that may incorporate embodiments of the present invention and perform the operations described herein. The computer system 2800 typically includes one or more processors 2805, a system bus 2810, storage subsystem 2815 that includes a memory subsystem 2820 and a file storage subsystem 2825, user interface output devices 2830, user interface input devices 2835, a communications subsystem 2840, and the like.

In various embodiments, the computer system 2800 typically includes conventional computer components such as the one or more processors 2805. The file storage subsystem 2825 can include a variety of memory storage devices, such as a read only memory (ROM) 2845 and random access memory (RAM) 2850 in the memory subsystem 2820, and direct access storage devices such as disk drives. As noted, the direct access storage device may comprise a adaptive programming data storage device that operates as described herein.

The user interface output devices 2830 can comprise a variety of devices including flat panel displays, touchscreens, indicator lights, audio devices, force feedback devices, and the like. The user interface input devices 2835 can comprise a variety of devices including a computer mouse, trackball, trackpad, joystick, wireless remote, drawing tablet, voice command system, eye tracking system, and the like. The user interface input devices 2835 typically allow a user to select objects, icons, text and the like that appear on the user interface output devices 2830 via a command such as a click of a button or the like.

Embodiments of the communication subsystem 2840 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 2840 may be coupled to communications networks and other external systems 2855 (e.g., a network such as a LAN or the Internet), to a FireWire bus, or the like. In other embodiments, the communications subsystem 2840 may be physically integrated on the motherboard of the computer system 2800, may be a software program, such as soft DSL, or the like.

The RAM 2850 and the file storage subsystem 2825 are examples of tangible media conFig.d to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 2825 includes reader subsystems that can transfer data from the program product media to the storage subsystem 2815 for operation and execution by the processors 2805.

The computer system 2800 may also include software that enables communications over a network (e.g., the communications network 2855) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 2800 may be a desktop, portable, rack-mounted, or tablet configuration. Additionally, the computer system 2800 may be a series of networked computers. Further, a variety of microprocessors are contemplated and are suitable for the one or more processors 2805, such as CORE 2 DUO™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS 7®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The adaptive programming scheme described herein can be implemented in a variety of systems for encoding and decoding data for transmission and storage. That is, codewords are received from a source over an information channel according to a adaptive programming scheme and are decoded into their corresponding data values and provided to a destination, such as a memory or a processor, and data values for storage or transmission are received from a source over an information channel and are encoded into a adaptive programming scheme.

Figure 29:
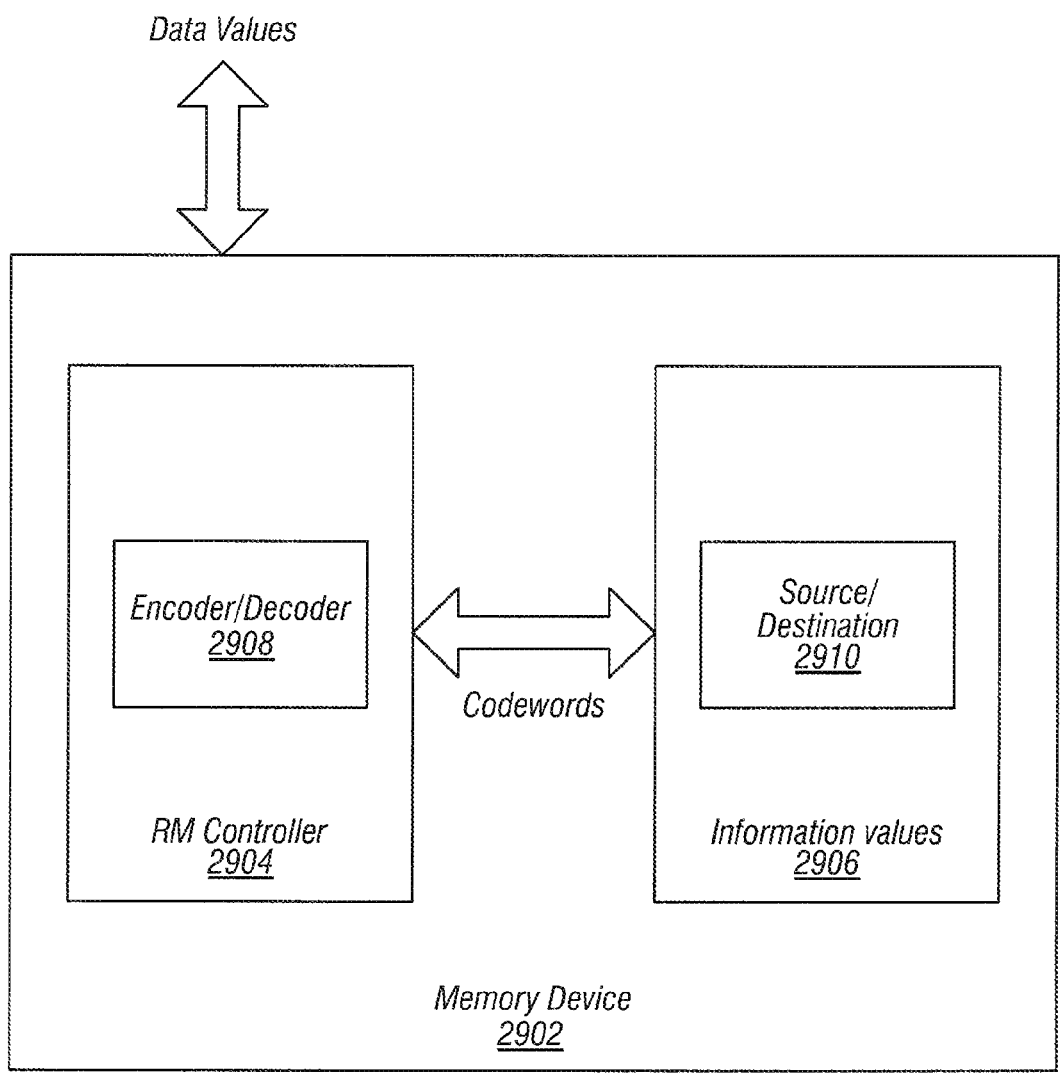
FIG. 29 is a block diagram that shows data flow in a memory device that operates according to the adaptive programming and coding scheme described herein.

The operations of encoding and decoding data according to the adaptive programming scheme can be illustrated as in FIG. 29, which shows data flow in a memory device 2902 that operates according to the adaptive programming scheme described herein. In FIG. 29, the memory device includes a controller 2904 that stores and retrieves information values 2906. The controller 2904 includes an encoder and decoder 2908 for encoding data values into codewords and decoding codewords into data values. The controller encodes data values and provides codewords to the source/destination block 2910, and decodes codewords from the source/destination and provides corresponding data values. The two-way nature of the data flow is indicated by the double-ended arrows labeled "data values" and "codewords". The controller includes interfaces through which the controller receives and provides the data values and the information values (codewords). The details of such interfaces will be known to those skilled in the art.

The information values 2906 comprise the means for physically representing the data values and codewords. For example, the information values 2906 may represent charge levels of memory cells, such that multiple cells are configured to operate as a virtual cell in which charge levels of the cells determine a permutation of the adaptive programming code. Data values are received and encoded to permutations of a adaptive programming code and charge levels of cells are adjusted accordingly, and adaptive programming codewords are determined according to cell charge levels, from which a corresponding data value is determined. Alternatively, the information values 2906 may represent features of a transmitted signal, such as signal frequency, magnitude, or duration, such that the cells or bins are defined by the signal features and determine a permutation of the adaptive programming code. For example, rank ordering of detected cell frequency changes over time can determine a permutation, wherein the highest signal frequency denotes the highest cell level. Other schemes for physical representation of the cells will occur to those skilled in the art, in view of the description herein.

For information values 2906 in the case of cell charge levels, the source/destination 2910 comprises memory cells in which n memory cells provide n cell values whose charge levels define a adaptive programming permutation. For storing a codeword, the memory cells receive an encoded codeword and comprise a destination, and for reading a codeword, the memory cells provide a codeword for decoding and comprise a source. In the case of data transmission, the source/destination 2910 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the adaptive programming code. When the source/destination 2910 receives a codeword from the controller 2904, the source/destination comprises a transmitter of the device 2902 for sending an encoded signal. When the source/destination provides a codeword to the controller 2904 from a received signal, the source/destination comprises a receiver of the device for receiving an encoded signal. Those skilled in the art will understand how to suitably modulate signal components of the transmitted signal to define adaptive programming code permutations, in view of the description herein.

The embodiments discussed herein are illustrative of one or more examples of embodiments of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

What is claimed is:

1. A method of configuring a memory device having a plurality of cells, each of which stores a value, where the values of the cells are mapped to discrete levels and the discrete levels represent data, the method comprising:
    determining a maximum number of cell levels in the memory device;
    determining the set of values that are associated with each of the cell levels;
    wherein the maximum number of cell levels for the memory device is determined by an adaptive programmer system connected to the memory device, based on a plurality of cell values attained by at least one cell of the memory device, in response to voltage applied by the adaptive programmer system to the cells of the memory device, such that the adaptive programmer system associates, for each of the cell levels, a different set of cell values of the plurality of cell values attained by the cells to which voltage is applied.

2. The method as in claim 1, wherein the memory device includes a set of cells with programmable voltage values, where the value of a cell refers to the voltage value of the cell, and a level refers to a range of values, wherein the ranges of values corresponding to different levels do not overlap.

3. The method as in claim 2, wherein determining a maximum number of cell levels and determining the set of values belonging to a level in the memory device by the adaptive programmer system comprises:
    setting the maximum cell value for an initial level to be the maximum cell value of all or a group of cells in the memory device, and setting the set of cell values that belong to the initial level to be all values that are less than or equal to the above mentioned maximum cell value;
    setting the minimum cell value for a next cell level to be the maximum cell value of the current cell level plus a safety gap increment that provides a spacing between cell levels that is beyond an expected noise level in the memory device circuitry;
    applying a predetermined voltage for a predetermined time to at least one cell of the memory device;
    detecting the value of a cell of the memory device, and comparing it to the minimum cell value of the next cell level;
    repeating the applying, detecting, and comparing for a predetermined group of the cells in the memory device, until the values of all the cells in the predetermined group are greater than or equal to the minimum value of the next cell level;
    setting the maximum cell value for the next level to be the maximum value of the cells in the predetermined group; and setting the set of cell values that belong to the next level to be all the values between the minimum cell value and the maximum cell value for the next level;
    setting the next cell level as a new current cell level, and setting the minimum cell value for the next cell level to be the maximum cell value of the current cell level plus a safety gap increment that provides a spacing between cell levels that is beyond an expected noise level in the memory device circuitry;
    repeating the applying, detecting, and comparing for a predetermined group of the cells in the memory device, until the values of all the cells in the predetermined group are greater than or equal to the minimum value of the next cell level;
    setting the maximum cell value for the next level to be the maximum value of the cells in the predetermined group; and setting the set of cell values that belong to the next level to be all the values between the minimum cell value and the maximum cell value for the next level;
    repeating the applying, detecting, comparing, and setting to program next levels, until one of the cells reaches a maximum possible value to which a cell can be set.

4. The method as in claim 3, wherein the cells in the same level x, where $x>=0$, satisfy the following additional constraint: let Y be a real number that is smaller than the safety gap increment between level x and level x+1; sort the values of the cells in level x as $v1<=v2<=v3<=\ldots<=vk$, where k is the number of cells in level x; then the cell values need to satisfy the constraint that $v2-v1<=Y$, $v3-v2<=Y$, $v4-v3<=Y, \ldots, vk-v(k-1)<=Y$.

5. The method as in claim 3, wherein for two adjacent levels, level x and level x+1, where $x>=0$, an additional cell called a Reference Cell is programmed such that its value is greater than the maximum cell value of level x and is smaller than the minimum cell value of level x+1.

6. The method as in claim 1, wherein the memory device includes a set of cells with programmable electrical resistance values, where the value of a cell refers to the resistance of the cell or the logarithm of the resistance of the cell, and a level refers to a range of values, wherein the ranges of values corresponding to different levels do not overlap.

7. The method as in claim 6, wherein determining a maximum number of cell levels and determining the set of values belonging to a level in the memory device by the adaptive programmer system comprises:

setting the maximum cell value for an initial level to be the maximum cell value of all or a group of cells in the memory device, and setting the set of cell values that belong to the initial level to be all values that are less than or equal to the maximum cell value;

setting the minimum cell value for a next cell level to be the maximum cell value of the current cell level plus a safety gap increment that provides a spacing between cell levels that is beyond an expected noise level in the memory device circuitry;

applying a predetermined voltage for a predetermined time to at least one cell of the memory device;

detecting the value of a cell of the memory device, and comparing it to the minimum cell value of the next cell level;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

setting the next level as a new current cell level, and setting the minimum cell value for a next cell level to be the maximum cell value of the current cell level plus a safety gap increment that provides a spacing between cell levels that is beyond an expected noise level in the memory device circuitry;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

repeating the applying, detecting, comparing, and setting to program next levels, until one of the cells reaches a maximum possible value to which a cell can be set.

8. The method as in claim 7, wherein the cells in the same level x, where x>=0, satisfy the following additional constraint: let Y be a real number that is smaller than the safety gap increment between level x and level x+1; sort the values of the cells in level x as $v1<=v2<=v3<=\ldots<=vk$, where k is the number of cells in level x; then the cell values need to satisfy the constraint that $v2-v1<=Y$, $v3-v2<=Y$, $v4-v3<=Y, \ldots, vk-v(k-1)<=Y$.

9. The method as in claim 7, wherein for two adjacent levels, level x and level x+1, where x>=0, an additional cell called a Reference Cell is programmed such that its value is greater than the maximum cell value of level x and is smaller than the minimum cell value of level x+1.

10. The method as in claim 1, wherein the memory device includes a set of patterned cells, where each cell realizes a graph that contains at least two vertices, where every vertex has two programmable states denoted by "ON" and "OFF" and two vertices are called "connected" if and only if there is a path in the graph with the two vertices as endpoints that consists of only "ON" vertices, and wherein the value of a cell refers to the state of connectivity between the vertices of the graph realized in the cell, and a level refers to a set of values, and wherein the sets of values corresponding to different levels do not overlap.

11. The method as in claim 10, wherein determining a maximum number of cell levels and determining the set of values belonging to a level in the memory device by the adaptive programmer system comprises:

setting the set of cell values that belong to the initial level to be the unique state of connectivity where all vertices are OFF and no two vertices are connected in the graph;

setting the minimum cell value for a next cell level to be a state of connectivity where a first and a second adjacent vertices are ON and the other vertices are OFF in the graph;

applying a predetermined voltage for a predetermined time to at least one cell of the memory device;

detecting the connectivity between the first and the second vertices in the graph of a cell of the memory device;

repeating the applying and detecting for a predetermined group of the cells in the memory device, until for every cell in the predetermined group, the set of ON vertices in the graph include the first and the second vertices;

setting the set of cell values that belong to the next level to be all the values attained by the cells in the above predetermined group;

setting the next level as a new current cell level, and setting the minimum cell value for the next cell level to be a cell value that does not belong to the previously programmed cell levels;

repeating the applying and detecting for a predetermined group of the cells in the memory device, until for every cell in the predetermined group, its value does not belong to any of the previously programmed cell levels and its ON vertices in the graph include all those vertices that need to be ON in the minimum cell value of the next cell level;

setting the set of cell values that belong to the next level to be all the values attained by the cells in the predetermined group;

repeating the applying, detecting, and setting to program next levels, until one of the cells reaches the state where all the vertices in the graph are ON;

generating a configuration data set with the determined maximum number of cell levels and the set of cell values for each cell level for the memory device.

12. The method as in claim 11, wherein a cell is a PCM cell and a vertex in a cell is a domain whose state is controlled by a bottom electrode, where a domain has an crystalline state that represents the ON state and an amorphous state that represents the OFF state.

13. The method as in claim 10, wherein a patterned cell includes a phase-change memory (PCM) cell with at least two bottom electrodes and one top electrode, wherein every bottom electrode controls the ON state, corresponding to the crystalline state, and OFF state, corresponding to the amorphous state of a domain in the cell, wherein a domain represents a vertex in the corresponding graph, and two vertices have an edge between them in the graph if the electrodes of the two corresponding domains have a physical distance less than a predetermined parameter.

14. The method as in claim 1, wherein the value of a cell is determined by the adaptive programmer system in response to operations comprising:

applying a voltage by the adaptive programmer system to at least one cell of the memory device and determining a cell value attained by the cell in response to the voltage;

repeating the applying the voltage and determining the cell value until the cell value is at least equal to a target value;

wherein the adaptive programmer system establishes a cell level upon completing the applying and repeating for a subgroup of the cells in the memory device.

15. The method as in claim 1, further comprising generating a configuration data set for the memory device that defines a coding scheme that maps codewords to data comprising a sequence of binary bits, wherein the codewords of the coding scheme are defined by the set of cell levels determined for the memory device.

16. The method as in claim 15, wherein the codewords include codewords that have only level 0 and level 1, comprising 2-level codewords, or include codewords that have only level 0, level 1, and level 2 codewords, comprising 3-level codewords, and generally for a q-level codeword, include codewords that have only level 0, level 1, . . . , up to level q−1, wherein q is an integral parameter that upper bounds the maximum number of levels that cells can possibly have.

17. The method as in claim 16, wherein for an x-level codeword and a y-level codeword with $x<y$, if for every cell in the cell group, its level in the x-level codeword is less than or equal to its level in the y-level codeword, then the data encoded by the x-level codeword is a subset of the data encoded by the y-level codeword.

18. The method as in claim 17, wherein the data encoded by the x-level codeword is a prefix of the data encoded by the y-level codeword.

19. The method as in claim 17, wherein the q-level codewords are constant-weight codewords, namely, for $x=0, 1, \ldots, q-1$, all the q-level codewords have the same number of cells in level x.

20. The method as in claim 16, wherein n cells in the memory device store n bits of data, with each cell storing one bit of data conform to the following: Let $(L1, L2, \ldots, Ln)$ denote the levels of an x-level codeword, where $2<=x<=q$ and each level Li (for $1<=i<=n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1<=i<=n$, $Bi=Li \bmod 2$.

21. The method as in claim 16, wherein n cells in the memory device store n bits of data, with each cell storing one bit of data conforming to the following: Let $(L1, L2, \ldots, Ln)$ denote the levels of an x-level codeword, where $2<=x<=q$ and each level Li (for $1<=i<=n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1<=i<=n$, $Bi=(Li+1) \bmod 2$.

22. The method as in claim 16, wherein n cells in the memory device store nk bits of data, with each cell storing k bits of data conforming to the following: Let $(L1, L2, \ldots, Ln)$ denote the levels of an x-level codeword, where $2<=x<=q$ and each level Li (for $1<=i<=n$) is in the set $\{0, 1, \ldots, x-1\}$; given $1<=i<=n$, let $(B1, B2, \ldots, Bk)$ denote the k bits encoded by the ith cell of level Li, then the mapping from Li to $(B1, B2, \ldots, Bk)$ satisfies the following constraints:

for any $0<=y<z<=(2^k)-1$, the value of $(B1, B2, \ldots, Bk)$ for Li=y is different from the value of $(B1, B2, \ldots, Bk)$ for Li=z; and for any $0<=z<=q-1$, the value of $(B1, B2, \ldots, Bk)$ for Li=z is the same as the value of $(B1, B2, \ldots, Bk)$ for Li=z mod $2^k$.

23. The method as in claim 16, wherein for n cells in the memory device, each of them stores a data symbol from the set $\{0, 1, \ldots, Y-1\}$ for some integer Y, with a method of mapping that comprises: For $1<=i<=n$, let Li denote the level of the ith cell, and let Si denote the data symbol stored by the ith cell, then the mapping from Li to Si satisfies the following constraints:

for any $0<=y<z<=Y-1$, the value of Si for Li=y is different from the value of Si for Li=z;

for any $0<=z<=q-1$, the value of Si for Li=z is the same as the value of Si for Li=z mod Y.

24. The method as in claim 16, wherein for n cells in the memory device, they cells store a data symbol from the set $\{0, 1, \ldots, (Y^n)-1\}$ for some integer $Y>=2$, with a method of mapping that comprises: Let $(L1, L2, \ldots, Ln)$ denote the levels of the n cells, and let S denote the data symbol stored by the n cells, then the mapping from the codeword $(L1, L2, \ldots, Ln)$ to S satisfies the following constraints:

for any two different codewords, where the first codeword is an x-level codeword with $x<=Y$ and the second codeword is a y-level codeword with $y<=Y$, the value of S for the first codeword is different from the value of S for the second codeword;

the value of S for a codeword $(L1, L2, \ldots, Ln)$ is the same as the value of S for the codeword $(L1 \bmod Y, L2 \bmod Y, \ldots, Ln \bmod Y)$.

25. The method as in claim 15, further comprising:

storing the configuration data set from the adaptive programming system into the memory device.

26. An adaptive programmer system comprising:

a memory; and a processor controller that executes program instructions stored in the memory to perform a process comprising determining a maximum number of cell levels in a memory device having a plurality of cells, each of which stores a value, where the values of the cells are mapped to discrete levels and the discrete levels represent data, and determining the set of values that are associated with each of the cell levels;

wherein the maximum number of cell levels for the memory device is determined by the adaptive programmer system when connected to the memory device, based on a plurality of cell values attained by at least one cell of the memory device, in response to voltage applied by the adaptive programmer system to the cells of the memory device, such that the adaptive programmer system associates, for each of the cell levels, a different set of cell values of the plurality of cell values attained by the cells to which voltage is applied.

27. The system as in claim 26, wherein the memory device includes a set of cells with programmable voltage values, where the value of a cell refers to the voltage value of the cell, and a level refers to a range of values, wherein the ranges of values corresponding to different levels do not overlap.

28. The system as in claim 27, wherein the adaptive programmer system determines a maximum number of cell levels and determining the set of values belonging to a level in the memory device by:

setting the maximum cell value for an initial level to be the maximum cell value of all or a group of cells in the memory device, and setting the set of cell values that belong to the initial level to be all values that are less than or equal to the above mentioned maximum cell value;

setting the minimum cell value for a next cell level to be the maximum cell value of the current cell level plus a safety gap increment that provides a spacing between cell levels that is beyond an expected noise level in the memory device circuitry;

applying a predetermined voltage for a predetermined time to at least one cell of the memory device;

detecting the value of a cell of the memory device, and comparing it to the minimum cell value of the next cell level;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

setting the next cell level as a new current cell level, and setting the minimum cell value for the next cell level to be the maximum cell value of the current cell level plus a safety gap increment that provides a spacing between cell levels that is beyond an expected noise level in the memory device circuitry;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

repeating the applying, detecting, comparing, and setting to program next levels, until one of the cells reaches a maximum possible value to which a cell can be set.

29. The system as in claim 28, wherein the cells in the same level x, where x>=0, satisfy the following additional constraint: let Y be a real number that is smaller than the safety gap increment between level x and level x+1; sort the values of the cells in level x as $v1 \leq v2 \leq v3 \leq \ldots \leq vk$, where k is the number of cells in level x; then the cell values need to satisfy the constraint that $v2-v1 \leq Y$, $v3-v2 \leq Y$, $v4-v3 \leq Y, \ldots, vk-v(k-1) \leq Y$.

30. The system as in claim 28, wherein for two adjacent levels, level x and level x+1, where x>=0, an additional cell called a Reference Cell is programmed such that its value is greater than the maximum cell value of level x and is smaller than the minimum cell value of level x+1.

31. The system as in claim 26, wherein the memory device includes a set of cells with programmable electrical resistance values, where the value of a cell refers to the resistance of the cell or the logarithm of the resistance of the cell, and a level refers to a range of values, wherein the ranges of values corresponding to different levels do not overlap.

32. The system as in claim 31, wherein the adaptive programmer system determines a maximum number of cell levels and determining the set of values belonging to a level in the memory device by:

setting the maximum cell value for an initial level to be the maximum cell value of all or a group of cells in the memory device, and setting the set of cell values that belong to the initial level to be all values that are less than or equal to the maximum cell value;

setting the minimum cell value for a next cell level to be the maximum cell value of the current cell level plus a safety gap increment that provides a spacing between cell levels that is beyond an expected noise level in the memory device circuitry;

applying a predetermined voltage for a predetermined time to at least one cell of the memory device;

detecting the value of a cell of the memory device, and comparing it to the minimum cell value of the next cell level;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

setting the next level as a new current cell level, and setting the minimum cell value for a next cell level to be the maximum cell value of the current cell level plus a safety gap increment that provides a spacing between cell levels that is beyond an expected noise level in the memory device circuitry;

repeating the applying, detecting, and comparing for a predetermined group of the cells in the memory device, until the values of all the cells in the predetermined group are greater than or equal to the minimum value of the next cell level;

setting the maximum cell value for the next level to be the maximum value of the cells in the predetermined group; and setting the set of cell values that belong to the next level to be all the values between the minimum cell value and the maximum cell value for the next level;

repeating the applying, detecting, comparing, and setting to program next levels, until one of the cells reaches a maximum possible value to which a cell can be set.

33. The system as in claim 32, wherein the cells in the same level x, where x>=0, satisfy the following additional constraint: let Y be a real number that is smaller than the safety gap increment between level x and level x+1; sort the values of the cells in level x as $v1 \leq v2 \leq v3 \leq \ldots \leq vk$, where k is the number of cells in level x; then the cell values need to satisfy the constraint that $v2-v1 \leq Y$, $v3-v2 \leq Y$, $v4-v3 \leq Y, \ldots, vk-v(k-1) \leq Y$.

34. The system as in claim 32, wherein for two adjacent levels, level x and level x+1, where x>=0, an additional cell called a Reference Cell is programmed such that its value is greater than the maximum cell value of level x and is smaller than the minimum cell value of level x+1.

35. The system as in claim 26, wherein the memory device includes a set of patterned cells, where each cell realizes a graph that contains at least two vertices, where every vertex has two programmable states denoted by "ON" and "OFF" and two vertices are called "connected" if and only if there is a path in the graph with the two vertices as endpoints that consists of only "ON" vertices, and wherein the value of a cell refers to the state of connectivity between the vertices of the graph realized in the cell, and a level refers to a set of values, and wherein the sets of values corresponding to different levels do not overlap.

36. The system as in claim 35, wherein the adaptive programmer system determines a maximum number of cell levels and determining the set of values belonging to a level in the memory device by:

setting the set of cell values that belong to the initial level to be the unique state of connectivity where all vertices are OFF and no two vertices are connected in the graph;

setting the minimum cell value for a next cell level to be a state of connectivity where a first and a second adjacent vertices are ON and the other vertices are OFF in the graph;

applying a predetermined voltage for a predetermined time to at least one cell of the memory device;
detecting the connectivity between the first and the second vertices in the graph of a cell of the memory device;
repeating the applying and detecting for a predetermined group of the cells in the memory device, until for every cell in the predetermined group, the set of ON vertices in the graph include the first and the second vertices;
setting the set of cell values that belong to the next level to be all the values attained by the cells in the above predetermined group;
setting the next level as a new current cell level, and setting the minimum cell value for the next cell level to be a cell value that does not belong to the previously programmed cell levels;
repeating the applying and detecting for a predetermined group of the cells in the memory device, until for every cell in the predetermined group, its value does not belong to any of the previously programmed cell levels and its ON vertices in the graph include all those vertices that need to be ON in the minimum cell value of the next cell level;
setting the set of cell values that belong to the next level to be all the values attained by the cells in the predetermined group;
repeating the applying, detecting, and setting to program next levels, until one of the cells reaches the state where all the vertices in the graph are ON;
generating a configuration data set with the determined maximum number of cell levels and the set of cell values for each cell level for the memory device.

37. The system as in claim 36, wherein a cell is a PCM cell and a vertex in a cell is a domain whose state is controlled by a bottom electrode, where a domain has an crystalline state that represents the ON state and an amorphous state that represents the OFF state.

38. The system as in claim 35, wherein a patterned cell includes a phase-change memory (PCM) cell with at least two bottom electrodes and one top electrode, wherein every bottom electrode controls the ON state, corresponding to the crystalline state, and OFF state, corresponding to the amorphous state of a domain in the cell, wherein a domain represents a vertex in the corresponding graph, and two vertices have an edge between them in the graph if the electrodes of the two corresponding domains have a physical distance less than a predetermined parameter.

39. The system as in claim 26, wherein the value of a cell is determined by the adaptive programmer system in response to operations comprising:
applying a voltage by the adaptive programmer system to at least one cell of the memory device and determining a cell value attained by the cell in response to the voltage;
repeating the applying the voltage and determining the cell value until the cell value is at least equal to a target value;
wherein the adaptive programmer system establishes a cell level upon completing the applying and repeating for a subgroup of the cells in the memory device.

40. The system as in claim 26, wherein the adaptive programmer system further generates a configuration data set for the memory device that defines a coding scheme that maps codewords to data comprising a sequence of binary bits, wherein the codewords of the coding scheme are defined by the set of cell levels determined for the memory device.

41. The system as in claim 40, wherein the codewords include codewords that have only level 0 and level 1, comprising 2-level codewords, or include codewords that have only level 0, level 1, and level 2 codewords, comprising 3-level codewords, and generally for a q-level codeword, include codewords that have only level 0, level 1, . . . , up to level q−1, wherein q is an integral parameter that upper bounds the maximum number of levels that cells can possibly have.

42. The system as in claim 41, wherein for an x-level codeword and a y-level codeword with x<y, if for every cell in the cell group, its level in the x-level codeword is less than or equal to its level in the y-level codeword, then the data encoded by the x-level codeword is a subset of the data encoded by the y-level codeword.

43. The system as in claim 42, wherein the data encoded by the x-level codeword is a prefix of the data encoded by the y-level codeword.

44. The system as in claim 42, wherein the q-level codewords are constant-weight codewords, namely, for x=0, 1, . . . , q−1, all the q-level codewords have the same number of cells in level x.

45. The system as in claim 41, wherein n cells in the memory device store n bits of data, with each cell storing one bit of data conform to the following: Let $(L1, L2, \ldots, Ln)$ denote the levels of an x-level codeword, where $2 \leq x \leq q$ and each level Li (for $1 \leq i \leq n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1 \leq i \leq n$, $Bi = Li \bmod 2$.

46. The system as in claim 41, wherein n cells in the memory device store n bits of data, with each cell storing one bit of data conforming to the following: Let $(L1, L2, \ldots, Ln)$ denote the levels of an x-level codeword, where $2 \leq x \leq q$ and each level Li (for $1 \leq i \leq n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1 \leq i \leq n$, $Bi = (Li+1) \bmod 2$.

47. The system as in claim 41, wherein n cells in the memory device store nk bits of data, with each cell storing k bits of data conforming to the following: Let $(L1, L2, \ldots, Ln)$ denote the levels of an x-level codeword, where $2 \leq x \leq q$ and each level Li (for $1 \leq i \leq n$) is in the set $\{0, 1, \ldots, x-1\}$; given $1 \leq i \leq n$, let $(B1, B2, \ldots, Bk)$ denote the k bits encoded by the ith cell of level Li, then the mapping from Li to $(B1, B2, \ldots, Bk)$ satisfies the following constraints:
for any $0 \leq y < z \leq (2^k)-1$, the value of $(B1, B2, \ldots, Bk)$ for $Li=y$ is different from the value of $(B1, B2, \ldots, Bk)$ for $Li=z$; and
for any $0 \leq z \leq q-1$, the value of $(B1, B2, \ldots, Bk)$ for $Li=z$ is the same as the value of $(B1, B2, \ldots, Bk)$ for $Li = z \bmod 2^k$.

48. The system as in claim 41, wherein for n cells in the memory device, each of them stores a data symbol from the set $\{0, 1, \ldots, Y-1\}$ for some integer Y, with a method of mapping that comprises: For $1 \leq i \leq n$, let Li denote the level of the ith cell, and let Si denote the data symbol stored by the ith cell, then the mapping from Li to Si satisfies the following constraints:
for any $0 \leq y < z \leq Y-1$, the value of Si for $Li=y$ is different from the value of Si for $Li=z$;
for any $0 \leq z \leq q-1$, the value of Si for $Li=z$ is the same as the value of Si for $Li = z \bmod Y$.

49. The system as in claim 41, wherein for n cells in the memory device, the cells store a data symbol from the set $\{0, 1, \ldots, (Y^n)-1\}$ for some integer $Y \geq 2$, with a method of mapping that comprises: Let $(L1, L2, \ldots, Ln)$ denote the levels of the n cells, and let S denote the data symbol stored by the n cells, then the mapping from the codeword $(L1, L2, \ldots, Ln)$ to S satisfies the following constraints:

for any two different codewords, where the first codeword is an x-level codeword with x<=Y and the second codeword is a y-level codeword with y<=Y, the value of S for the first codeword is different from the value of S for the second codeword;

the value of S for a codeword $(L1, L2, \ldots, Ln)$ is the same as the value of S for the codeword $(L1 \bmod Y, L2 \bmod Y, \ldots, Ln \bmod Y)$.

50. The system as in claim 40, further comprising:
storing the configuration data set from the adaptive programming system into the memory device.

51. A memory device having:
a plurality of memory cells, each of which stores a value, where the values of the cells are mapped to discrete levels and the discrete levels represent data;
a controller that implements a coding scheme that maps codewords to data comprising a sequence of binary bits, wherein the codewords of the coding scheme are defined by a set of cell levels determined for the memory device, wherein the maximum number of cell levels for the memory device is determined based on a plurality of cell values attained by at least one cell of the memory device, in response to voltage applied by an adaptive programmer system to the cells of the memory device, such that each of the cell levels is associated with a different set of cell values of the plurality of cell values attained by the cells to which voltage is applied.

52. The memory device as in claim 51, wherein the codewords include codewords that have only level 0 and level 1, comprising 2-level codewords, or include codewords that have only level 0, level 1, and level 2 codewords, comprising 3-level codewords, and generally for a q-level codeword, include codewords that have only level 0, level 1, ..., up to level q−1, wherein q is an integral parameter that upper bounds the maximum number of levels that cells can possibly have.

53. The memory device as in claim 52, wherein for an x-level codeword and a y-level codeword with x<y, if for every cell in the cell group, its level in the x-level codeword is less than or equal to its level in the y-level codeword, then the data encoded by the x-level codeword is a subset of the data encoded by the y-level codeword.

54. The memory device as in claim 53, wherein the data encoded by the x-level codeword is a prefix of the data encoded by the y-level codeword.

55. The memory device as in claim 53, wherein the q-level codewords are constant-weight codewords, namely, for x=0, 1, ..., q−1, all the q-level codewords have the same number of cells in level x.

56. The memory device as in claim 52, wherein n cells in the memory device store n bits of data, with each cell storing one bit of data conform to the following: Let $(L1, L2, \ldots, Ln)$ denote the levels of an x-level codeword, where $2<=x<=q$ and each level Li (for $1<=i<=n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1<=i<=n$, $Bi=Li \bmod 2$.

57. The memory device as in claim 52, wherein n cells in the memory device store n bits of data, with each cell storing one bit of data conforming to the following: Let $(L1, L2, \ldots Ln)$ denote the levels of an x-level codeword, where $2<=x<=q$ and each level Li (for $1<=i<=n$) is in the set $\{0, 1, \ldots, x-1\}$; let $(B1, B2, \ldots, Bn)$ denote the n bits encoded by the codeword $(L1, L2, \ldots, Ln)$, then the mapping is that for $1<=i<=n$, $Bi=(Li+1) \bmod 2$.

58. The memory device as in claim 52, wherein n cells in the memory device store nk bits of data, with each cell storing k bits of data conforming to the following: Let $(L1, L2, \ldots, Ln)$ denote the levels of an x-level codeword, where $2<=x<=q$ and each level Li (for $1<=i<=n$) is in the set $\{0, 1, \ldots, x-1\}$; given $1<=i<=n$, let $(B1, B2, \ldots, Bk)$ denote the k bits encoded by the ith cell of level Li, then the mapping from Li to $(B1, B2, \ldots, Bk)$ satisfies the following constraints:

for any $0<=y<z<=(2^k)-1$, the value of $(B1, B2, \ldots, Bk)$ for Li=y is different from the value of $(B1, B2, \ldots, Bk)$ for Li=z; and for any $0<=z<=q-1$, the value of $(B1, B2, \ldots, Bk)$ for Li=z is the same as the value of $(B1, B2, \ldots, Bk)$ for Li=z mod $2^k$.

59. The memory device as in claim 52, wherein for n cells in the memory device, each of them stores a data symbol from the set $\{0, 1, \ldots, Y-1\}$ for some integer Y, with a method of mapping that comprises: For $1<=i<=n$, let Li denote the level of the ith cell, and let Si denote the data symbol stored by the ith cell, then the mapping from Li to Si satisfies the following constraints:

for any $0<=y<z<=Y-1$, the value of Si for Li=y is different from the value of Si for Li=z;

for any $0<=z<=q-1$, the value of Si for Li=z is the same as the value of Si for Li=z mod Y.

60. The memory device as in claim 52, wherein for n cells in the memory device, the cells store a data symbol from the set $\{0, 1, \ldots, (Y^n)-1\}$ for some integer $Y>=2$, with a method of mapping that comprises: Let $(L1, L2, \ldots, Ln)$ denote the levels of the n cells, and let S denote the data symbol stored by the n cells, then the mapping from the codeword $(L1, L2, \ldots, Ln)$ to S satisfies the following constraints:

for any two different codewords, where the first codeword is an x-level codeword with x<=Y and the second codeword is a y-level codeword with y<=Y, the value of S for the first codeword is different from the value of S for the second codeword;

the value of S for a codeword $(L1, L2, \ldots, Ln)$ is the same as the value of S for the codeword $(L1 \bmod Y, L2 \bmod Y, \ldots, Ln \bmod Y)$.

* * * * *